(12) United States Patent
Wu et al.

(10) Patent No.: US 12,137,573 B2
(45) Date of Patent: Nov. 5, 2024

(54) SELF-ALIGNED MULTILAYER SPACER MATRIX FOR HIGH-DENSITY TRANSISTOR ARRAYS AND METHODS FOR FORMING THE SAME

(71) Applicant: Taiwan Semiconductor Manufacturing Company Limited, Hsinchu (TW)

(72) Inventors: Gao-Ming Wu, Taipei (TW); Katherine H. Chiang, New Taipei (TW); Chien-Hao Huang, Hsinchu (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 420 days.

(21) Appl. No.: 17/697,101

(22) Filed: Mar. 17, 2022

(65) Prior Publication Data

US 2023/0189533 A1  Jun. 15, 2023

Related U.S. Application Data

(60) Provisional application No. 63/287,741, filed on Dec. 9, 2021.

(51) Int. Cl.
*H10B 53/30* (2023.01)
*H10B 61/00* (2023.01)
*H10B 63/00* (2023.01)

(52) U.S. Cl.
CPC ............. *H10B 53/30* (2023.02); *H10B 61/22* (2023.02); *H10B 63/30* (2023.02)

(58) Field of Classification Search
None
See application file for complete search history.

(56) References Cited

U.S. PATENT DOCUMENTS

| 10,446,473 B1 | 10/2019 | Li et al. |
| 2017/0323983 A1 | 11/2017 | Amo |

(Continued)

FOREIGN PATENT DOCUMENTS

| CN | 218004873 U | * | 12/2022 | ......... H01L 29/0847 |
| CN | 115841990 A | * | 3/2023 | ......... H01L 27/1225 |

(Continued)

OTHER PUBLICATIONS

Korean Patent and Trademark Office, Application No. 10 2022 0058504, Notice of Final Rejection, mailed Feb. 27, 2024, 6 pages.

(Continued)

*Primary Examiner* — Michael Lebentritt
(74) *Attorney, Agent, or Firm* — The Marbury Law Group, PLLC

(57) ABSTRACT

A two-dimensional array of discrete dielectric template structures is formed over a substrate. A first dielectric spacer matrix may be formed in lower portions of the trenches between the discrete dielectric template structures. A second dielectric spacer matrix layer may be formed in upper portions of the trenches. A pair of a source cavity and a drain cavity may be formed within a volume of each of the discrete dielectric template structures. A source electrode and a drain electrode may be formed in each source cavity and each drain cavity, respectively. The gate electrodes may be formed prior to, or after, formation of the two-dimensional array of discrete dielectric template structures to provide a two-dimensional array of field effect transistors that may be connected to, or may contain, memory elements.

20 Claims, 65 Drawing Sheets

(56) References Cited

U.S. PATENT DOCUMENTS

| | | | | |
|---|---|---|---|---|
| 2018/0197988 A1* | 7/2018 | Ratnam | | H01L 29/66666 |
| 2021/0126013 A1* | 4/2021 | Lai | | H01L 29/6684 |
| 2021/0376164 A1 | 12/2021 | Wu et al. | | |
| 2022/0271166 A1* | 8/2022 | Tsai | | H01L 29/24 |
| 2022/0344510 A1* | 10/2022 | Tsai | | H01L 29/66969 |
| 2023/0008902 A1* | 1/2023 | Chuang | | H01L 29/66545 |

FOREIGN PATENT DOCUMENTS

| | | | | |
|---|---|---|---|---|
| CN | 116133358 A | * | 5/2023 | ........ H01L 27/11507 |
| DE | 10 2020 128 421 A1 | | 11/2021 | |
| KR | 20210148931 A | | 12/2021 | |
| TW | 201735260 A | | 10/2017 | |

OTHER PUBLICATIONS

Korean Patent Office; patent application No. 1020220058504; Office Action dated Mar. 31, 2023; 6 pages.
Korean Patent and Trademark Office, Application No. 10 2022 0058504 Notice of Final Rejection, mailed Oct. 23, 2023, 4 pages.
Taiwan Patent Office; Jianq Chyun Intellectual Property Office; TW patent application No. 111134023; Office Action dated Aug. 9, 2023; 4 pages.
1st Examination Report received from the German Patent Office in related patent application No. 102022107056.5 dated Dec. 7, 2022; 7 pages.
Korean Patent and Trademark Office, Application No. 10-2024-0065674, Office Action mailed Jun. 20, 2024, 16 pages.

* cited by examiner

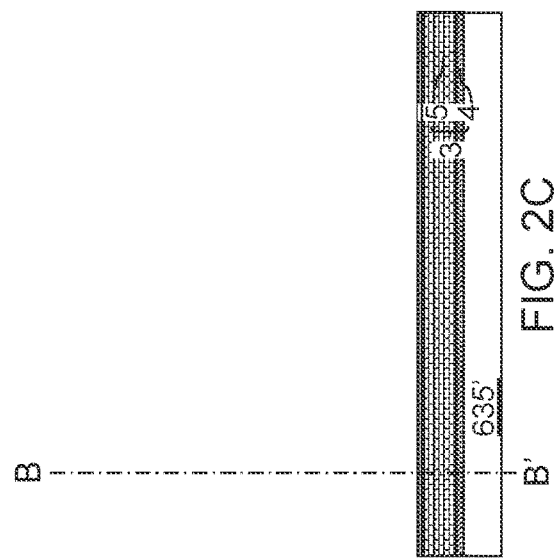
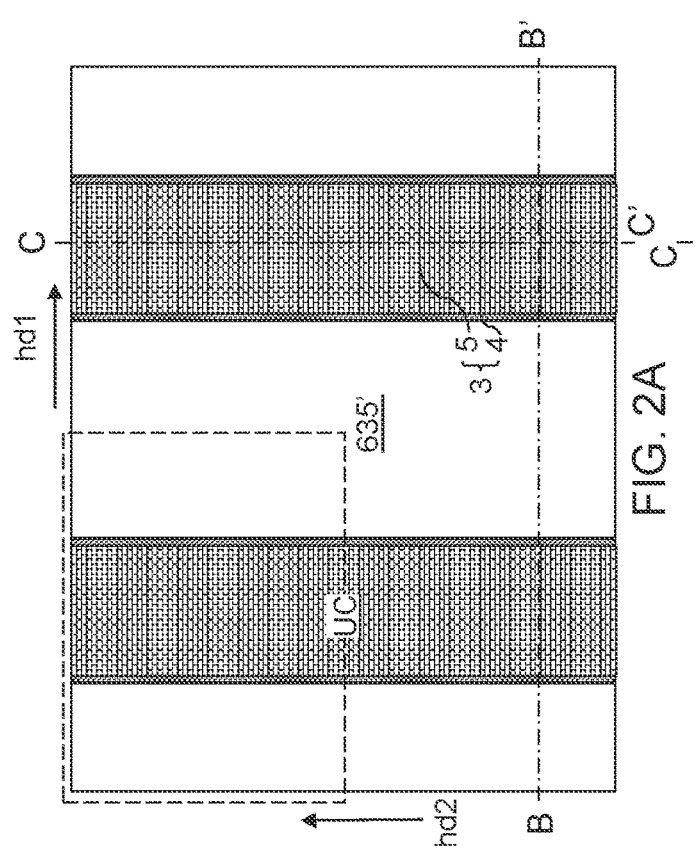

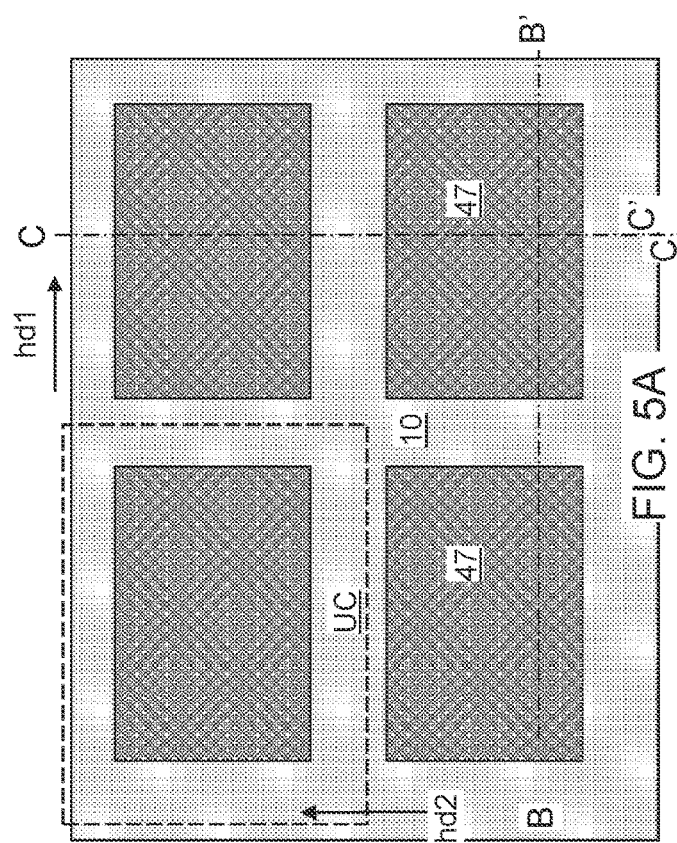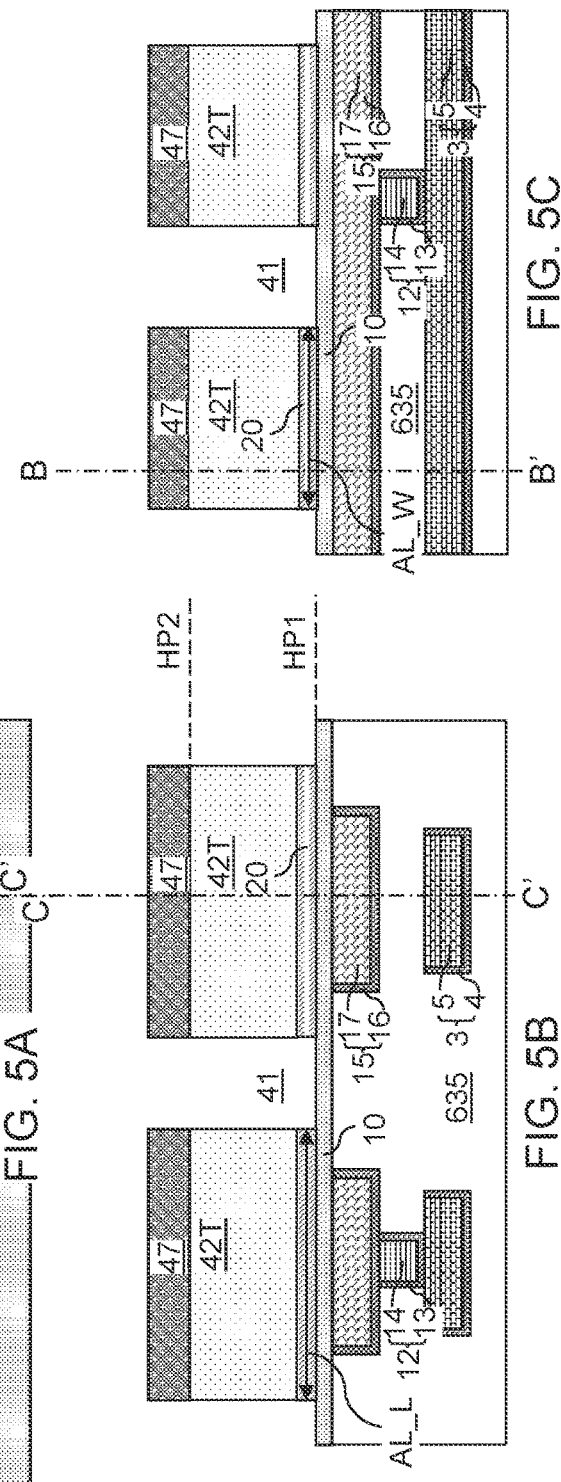

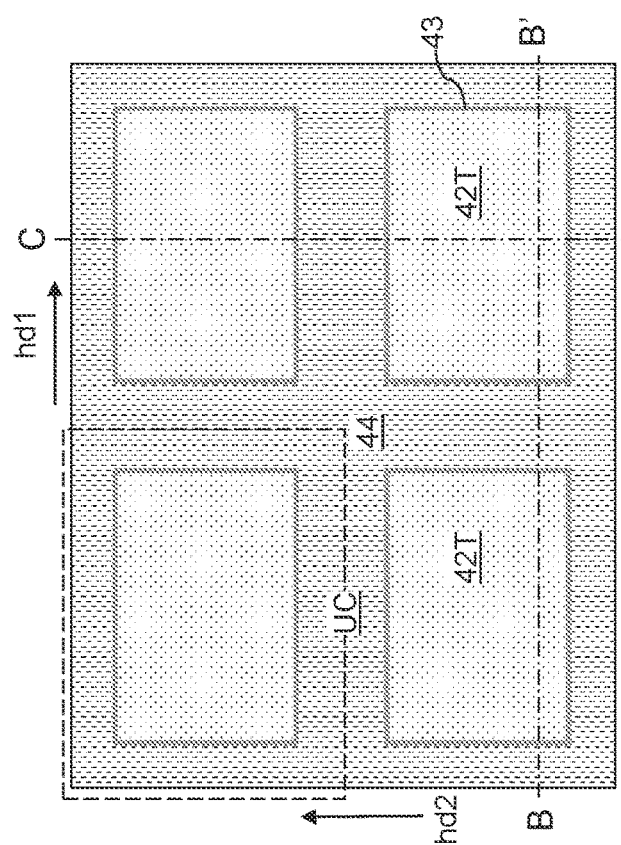
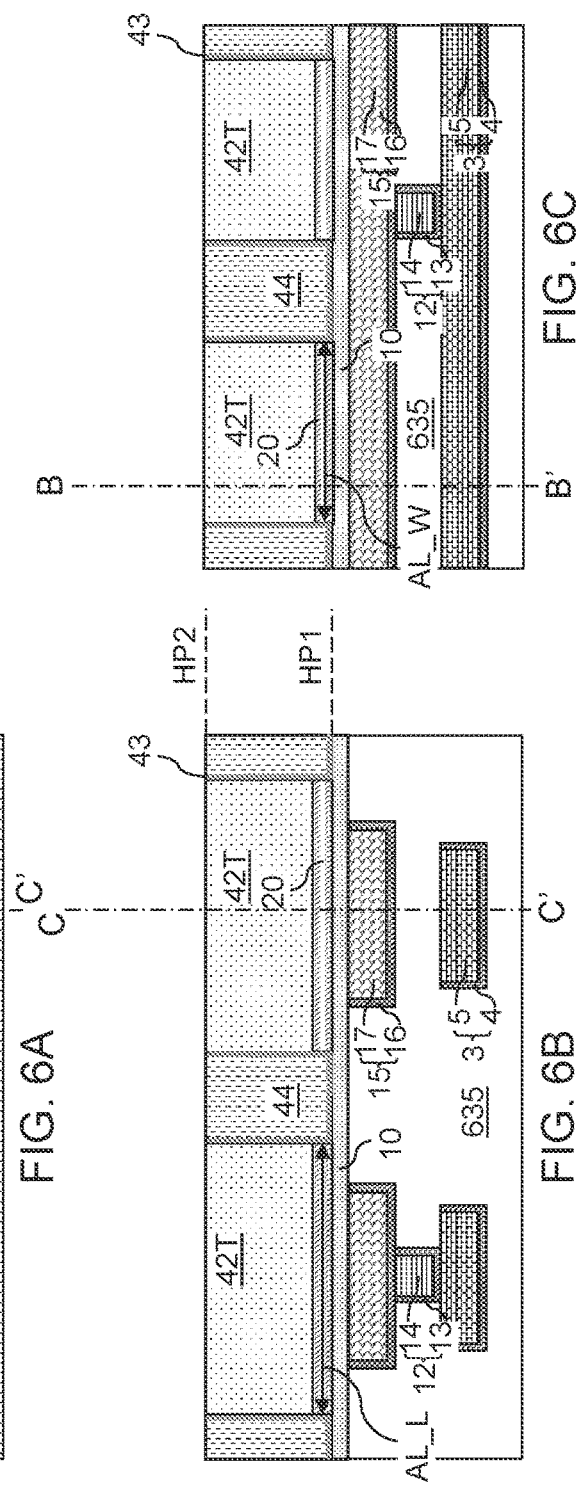
FIG. 6A
FIG. 6B
FIG. 6C

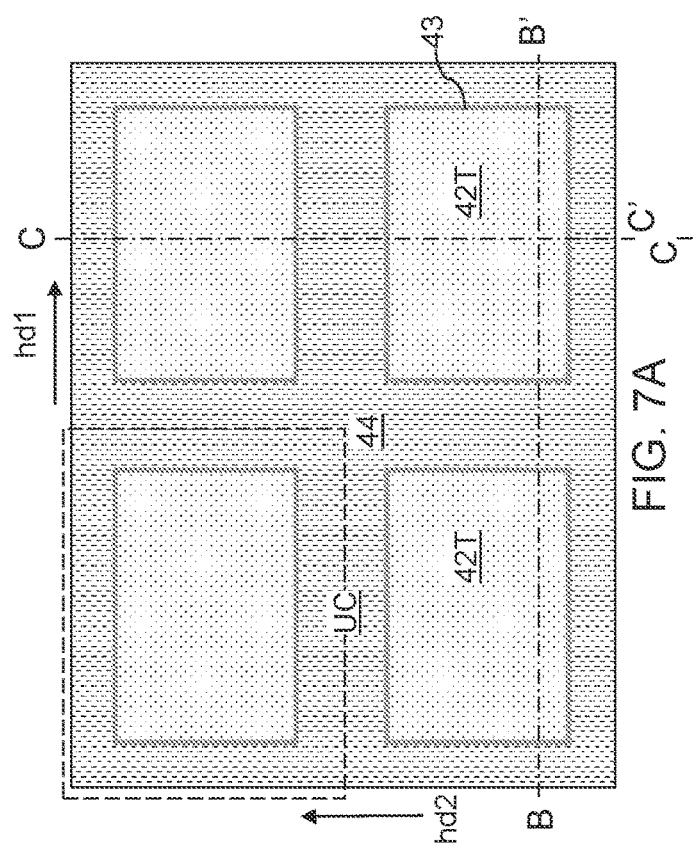
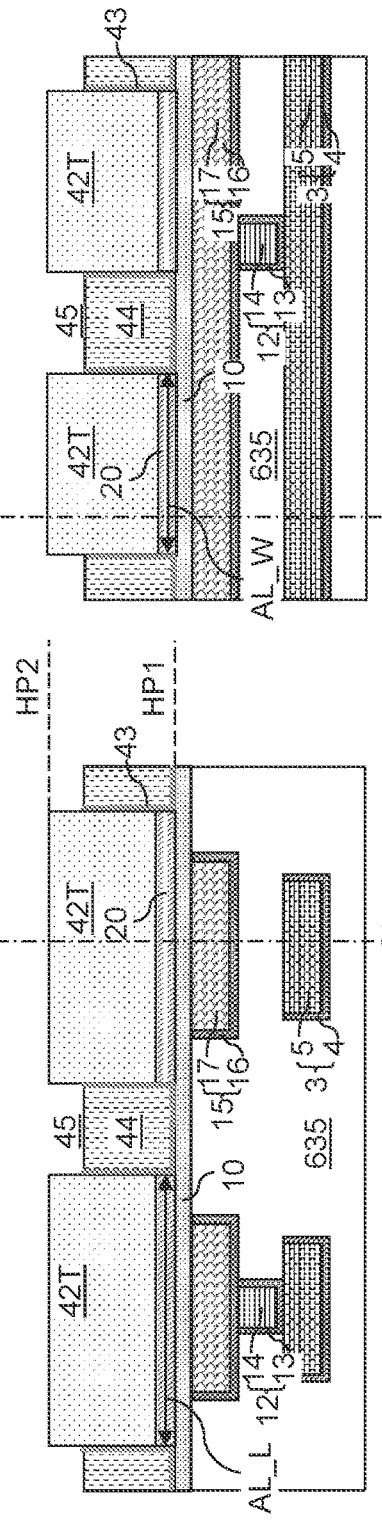
FIG. 7A
FIG. 7B
FIG. 7C

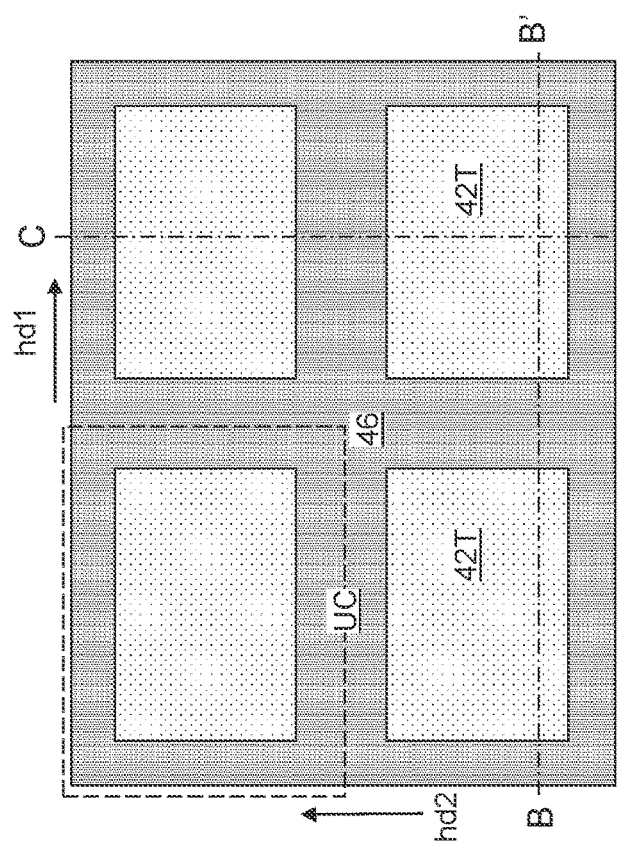
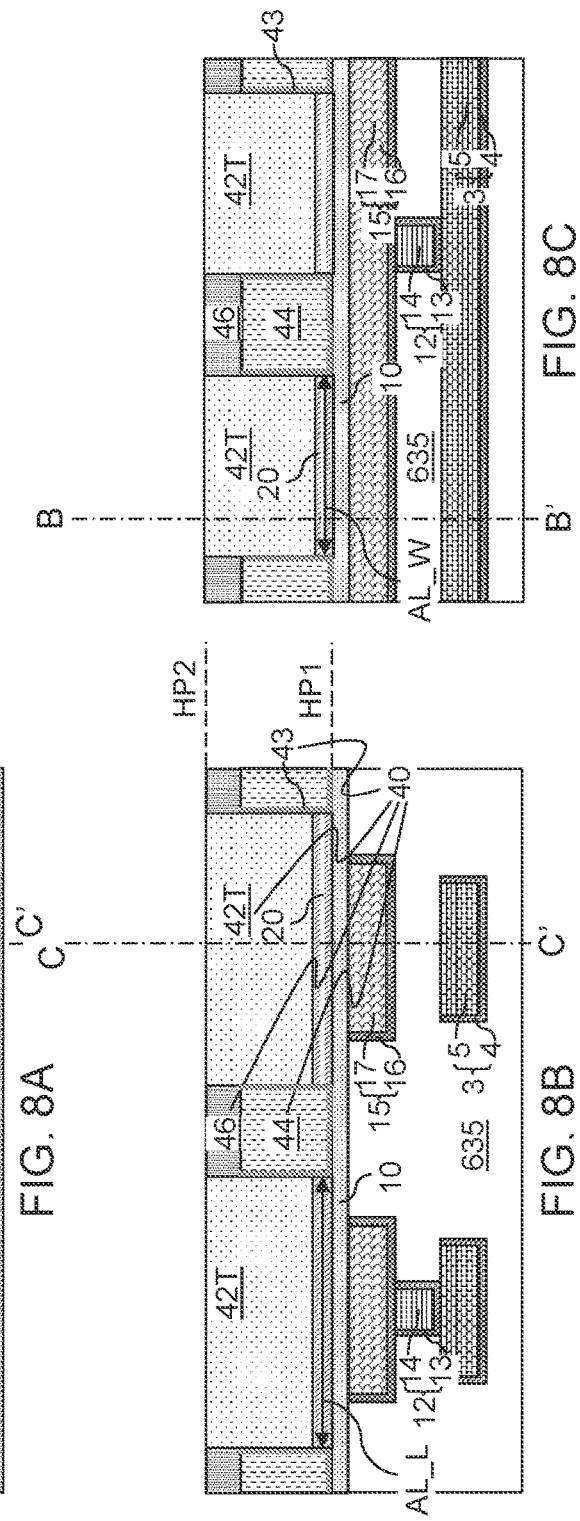
FIG. 8A
FIG. 8B
FIG. 8C

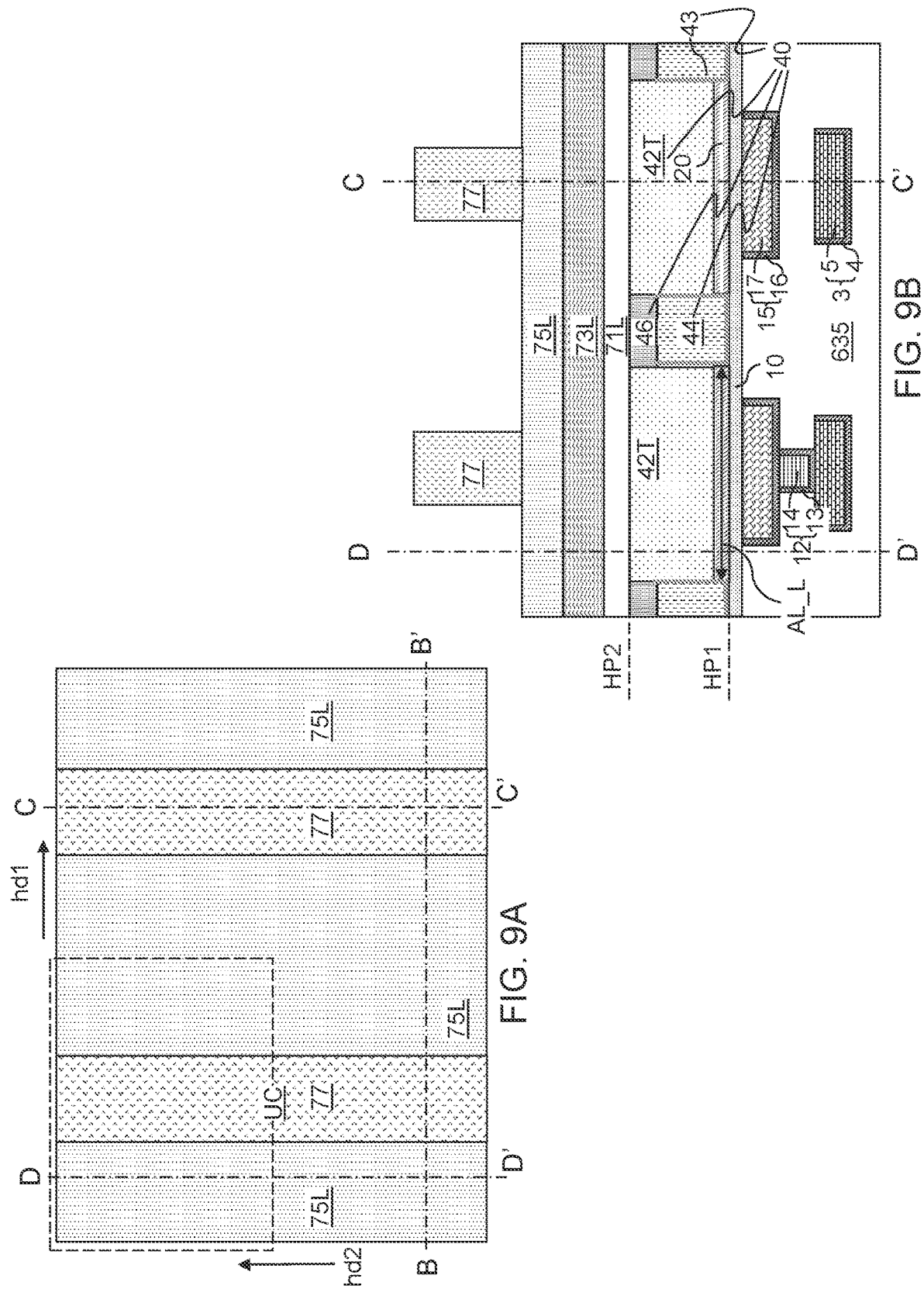

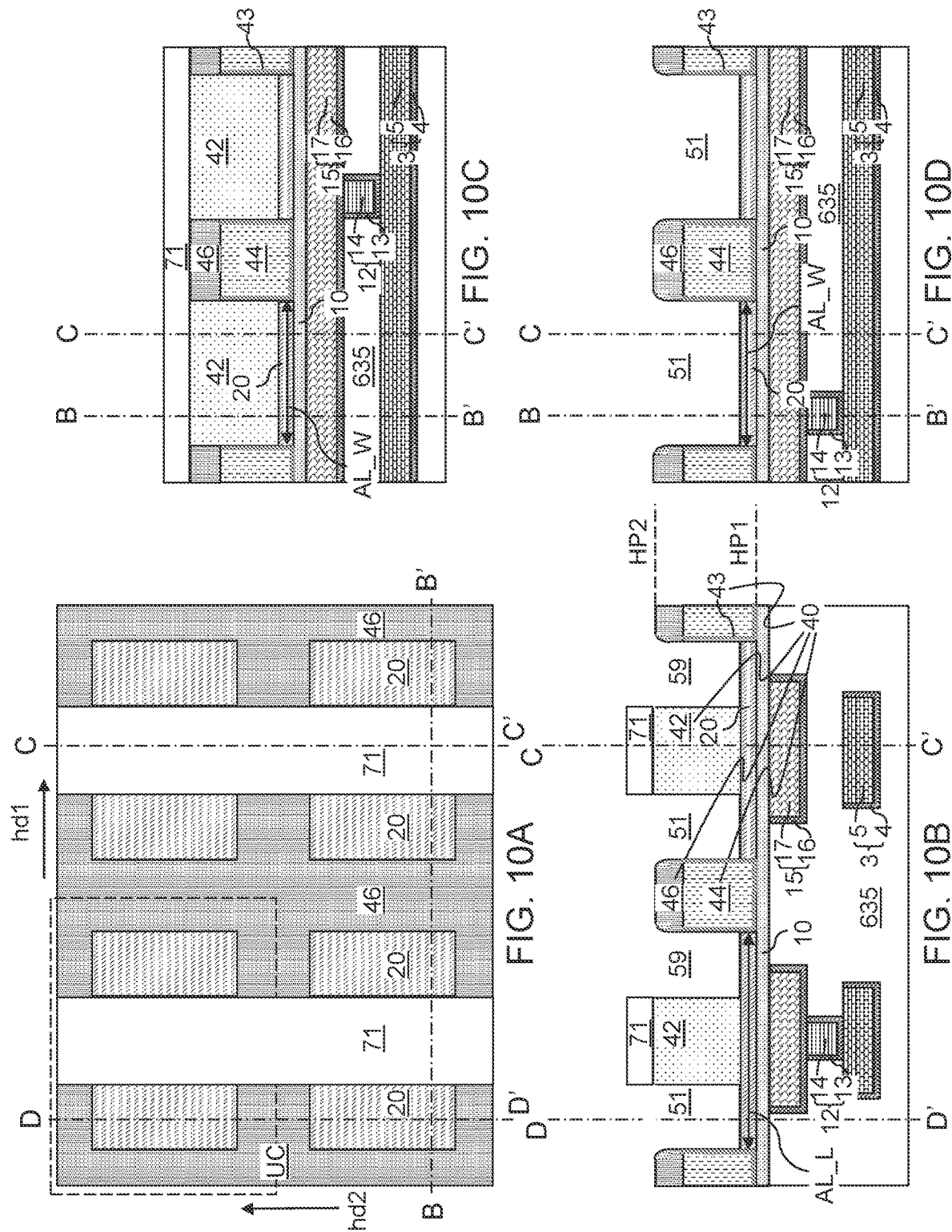

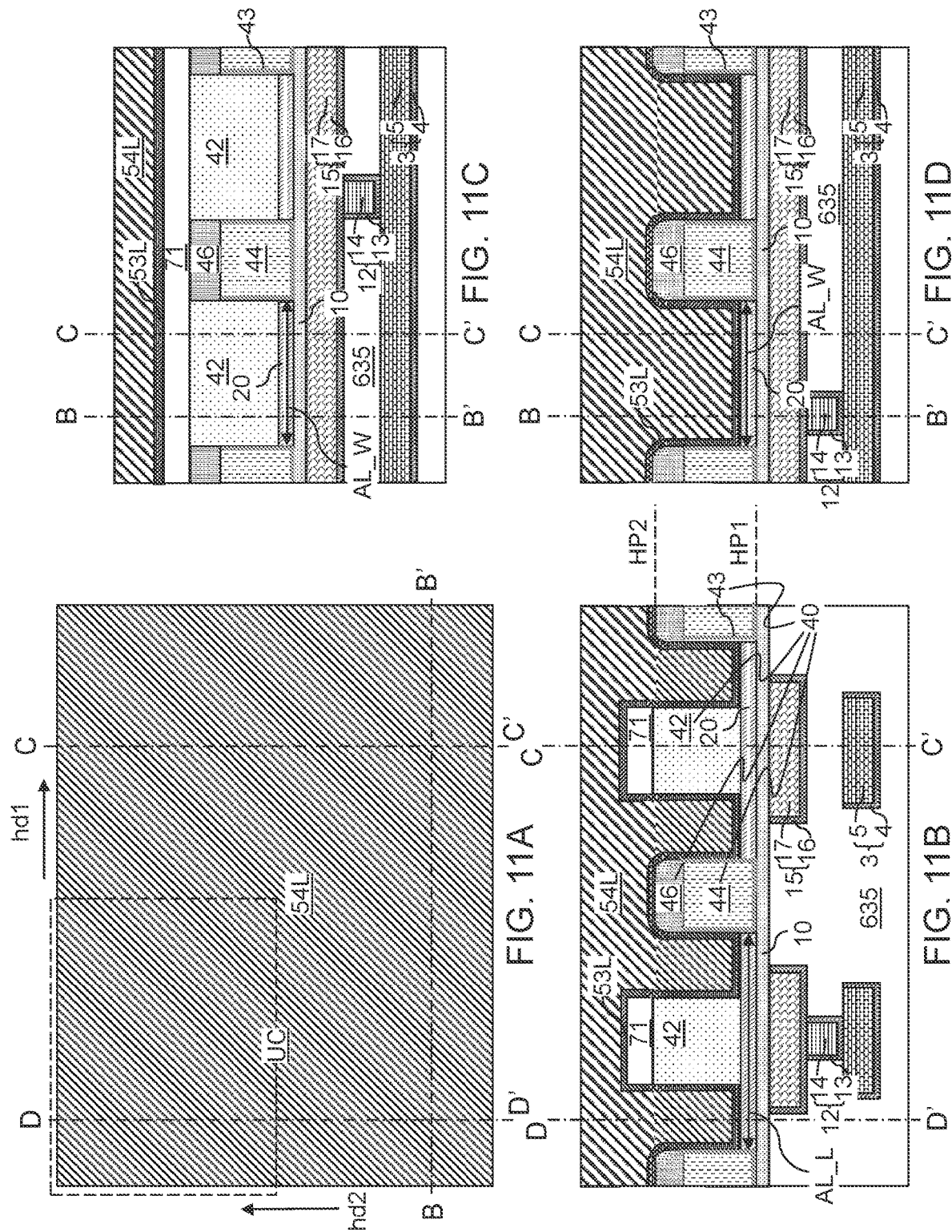

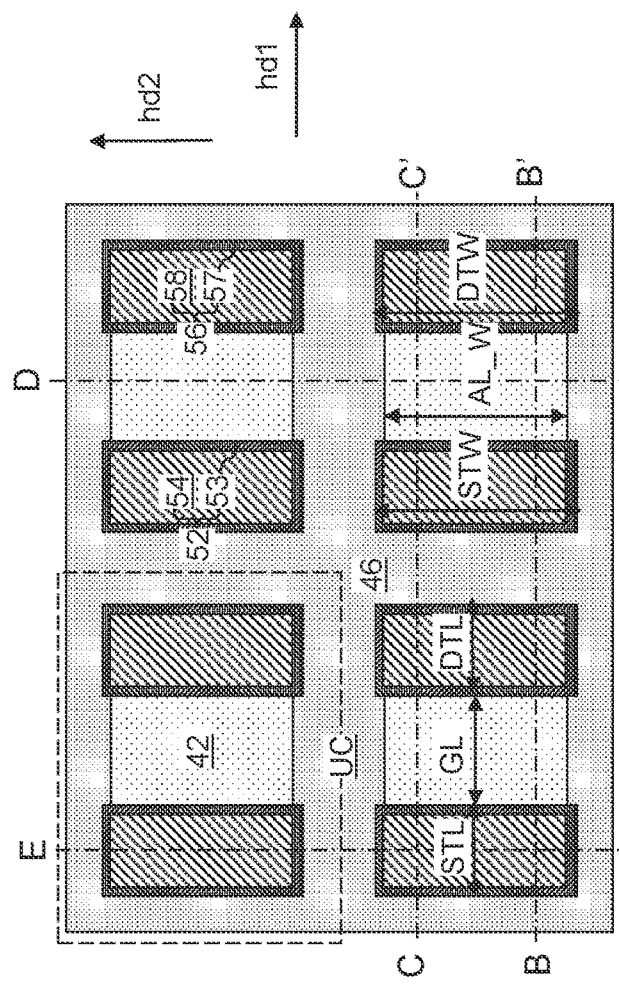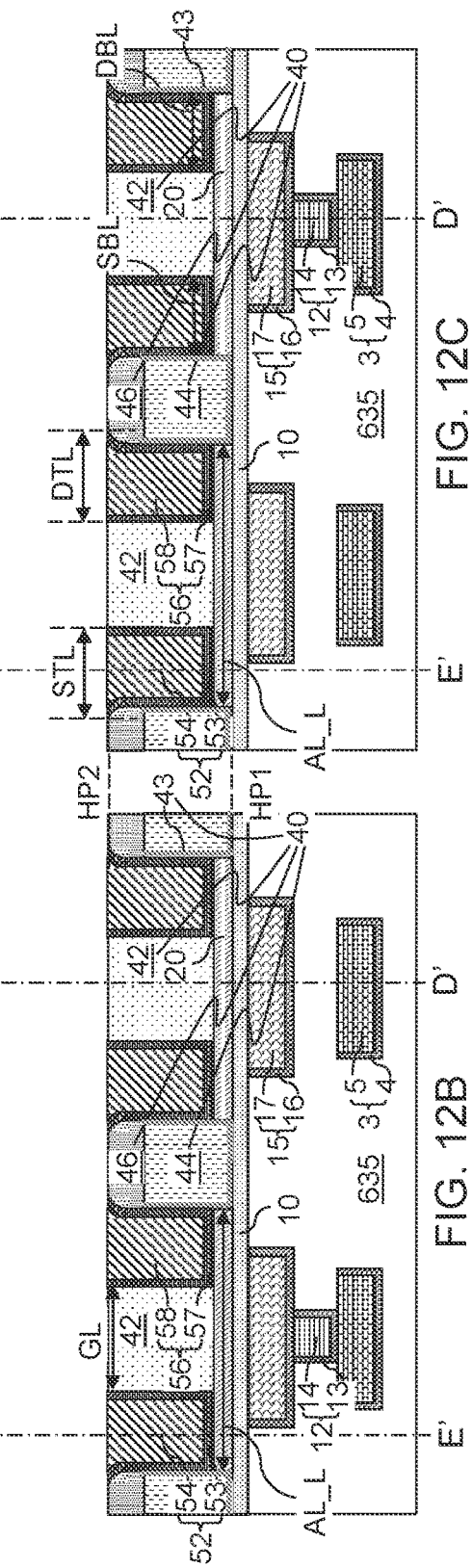
FIG. 12A
FIG. 12B
FIG. 12C

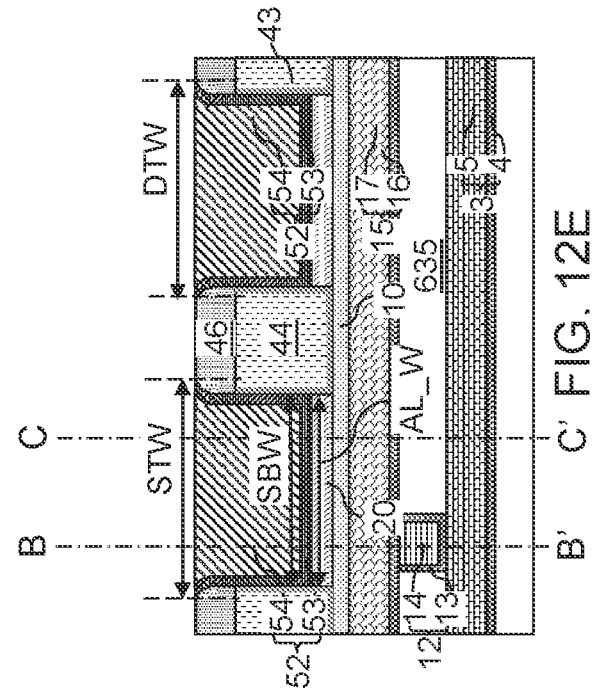
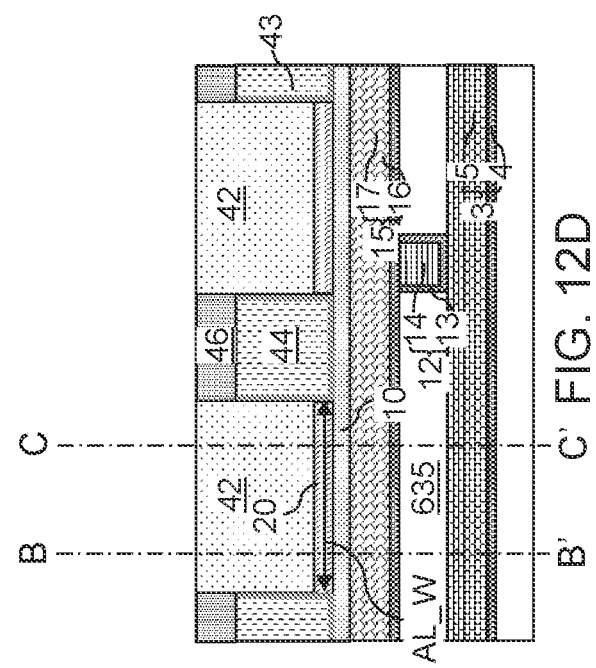

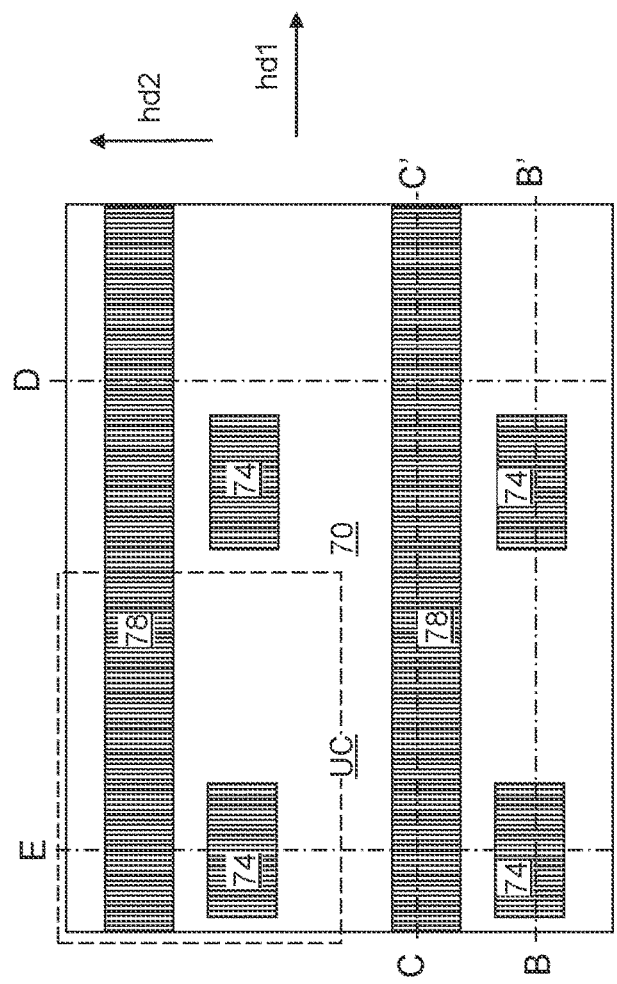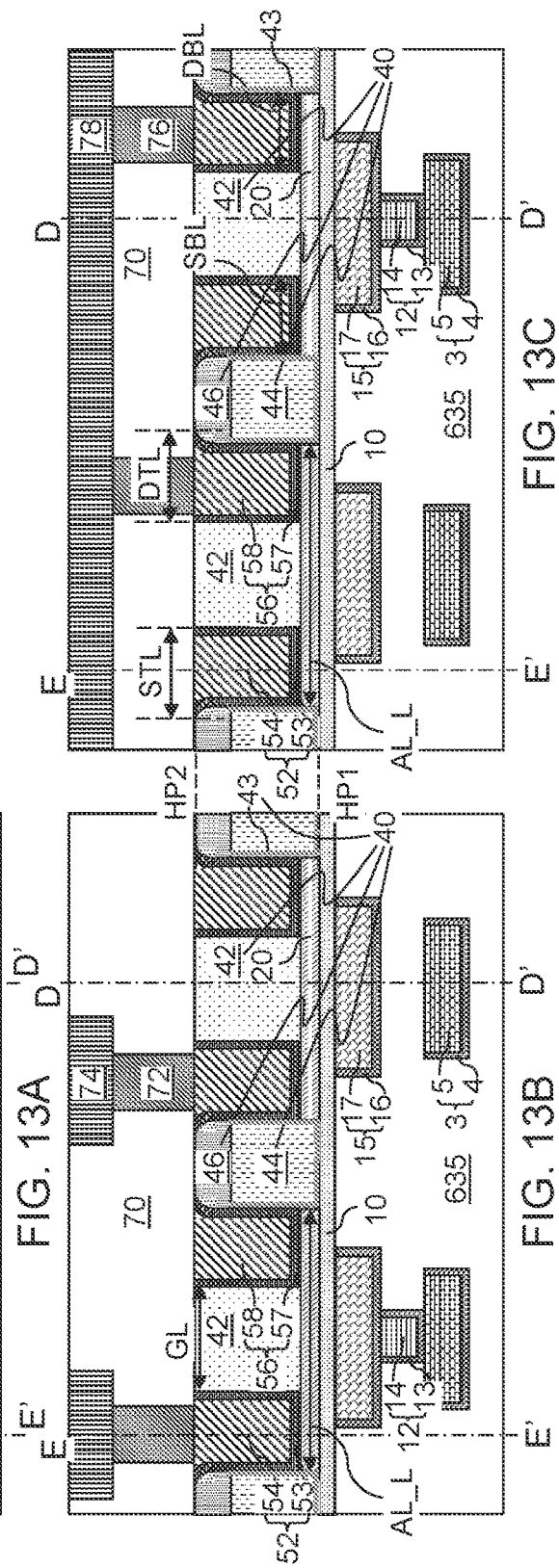

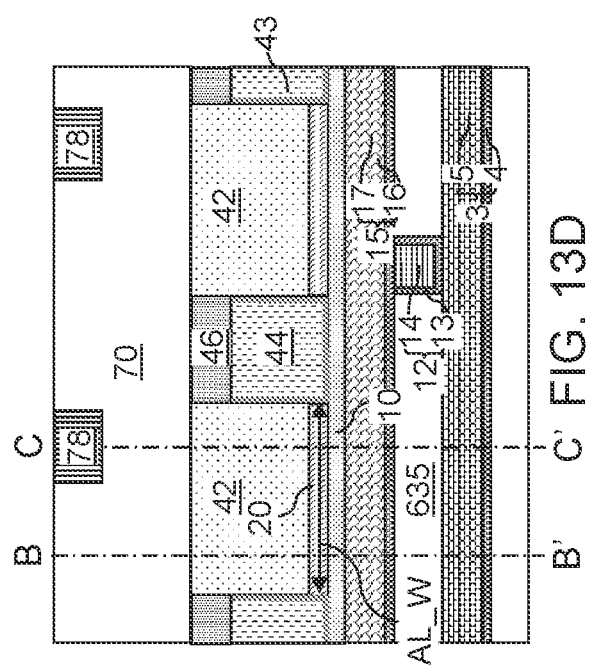
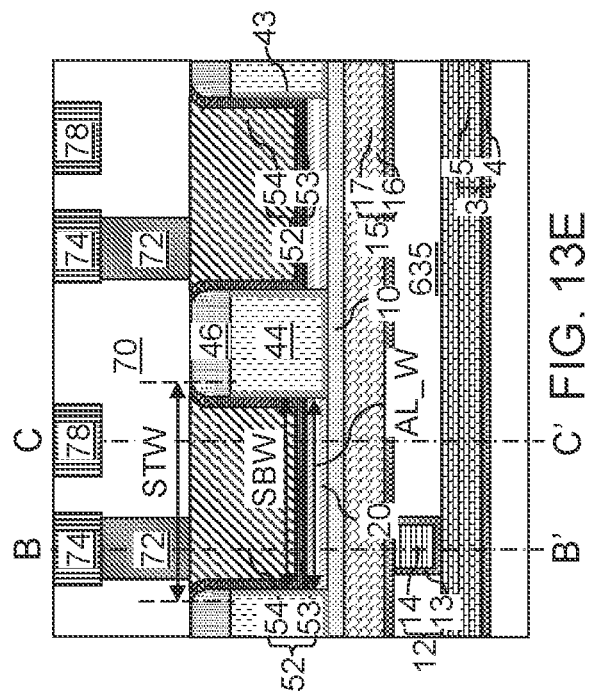

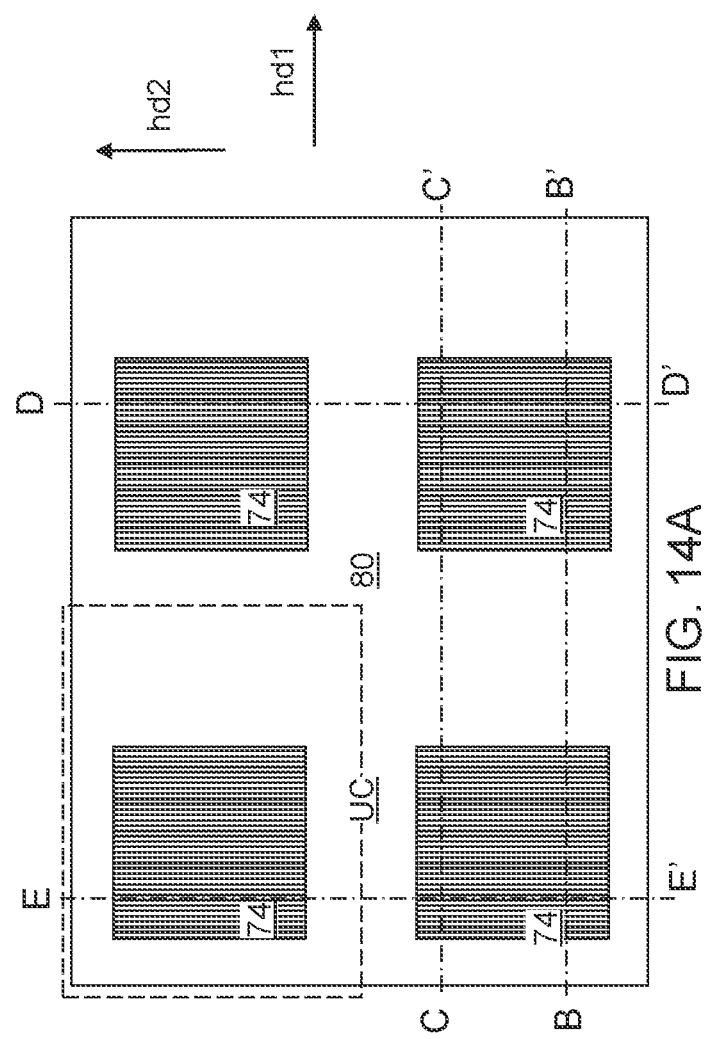

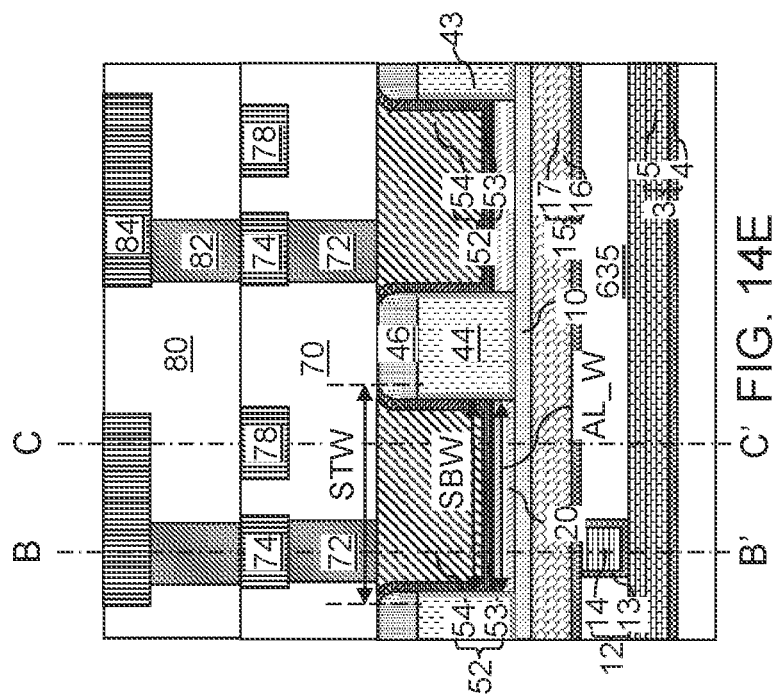
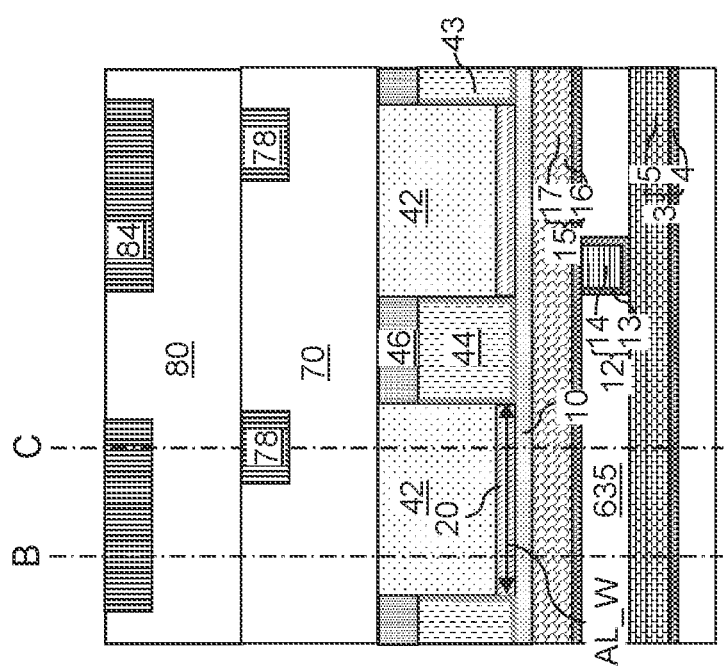

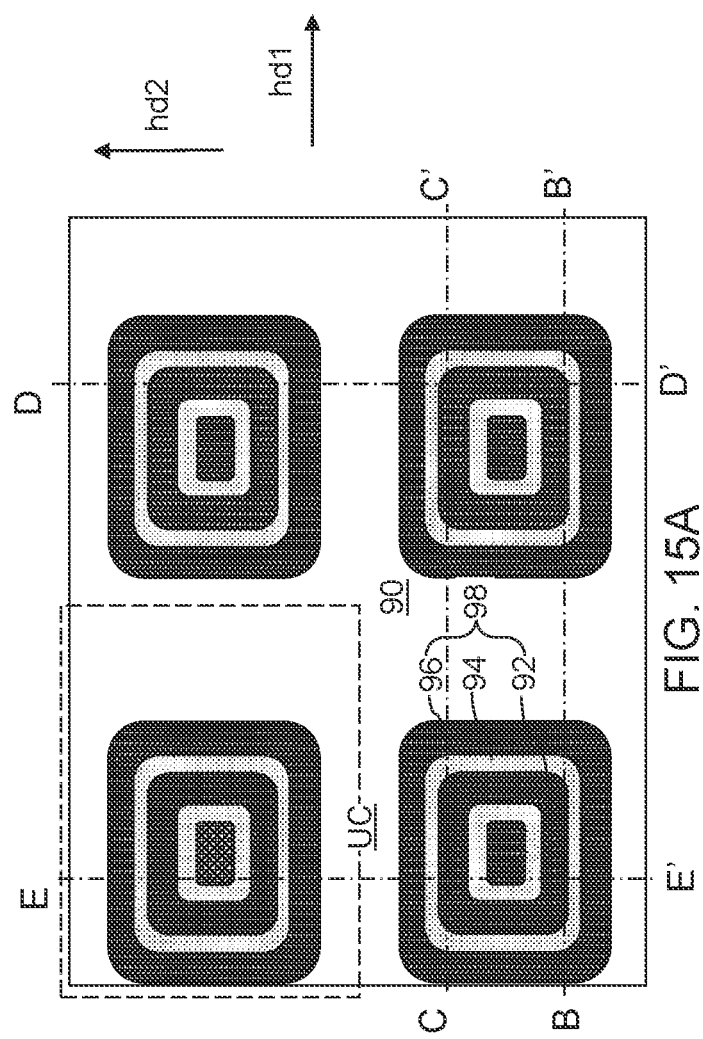

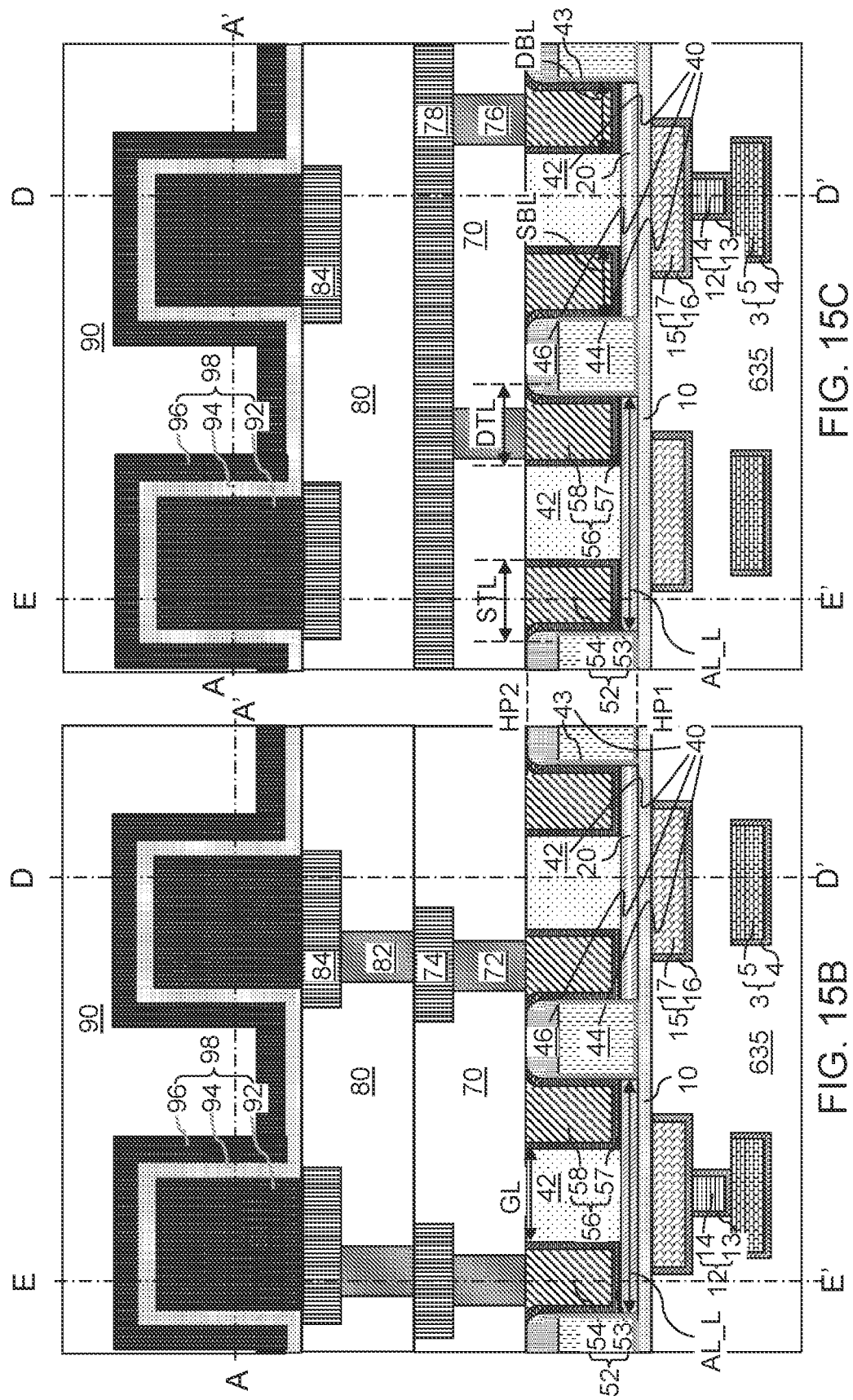

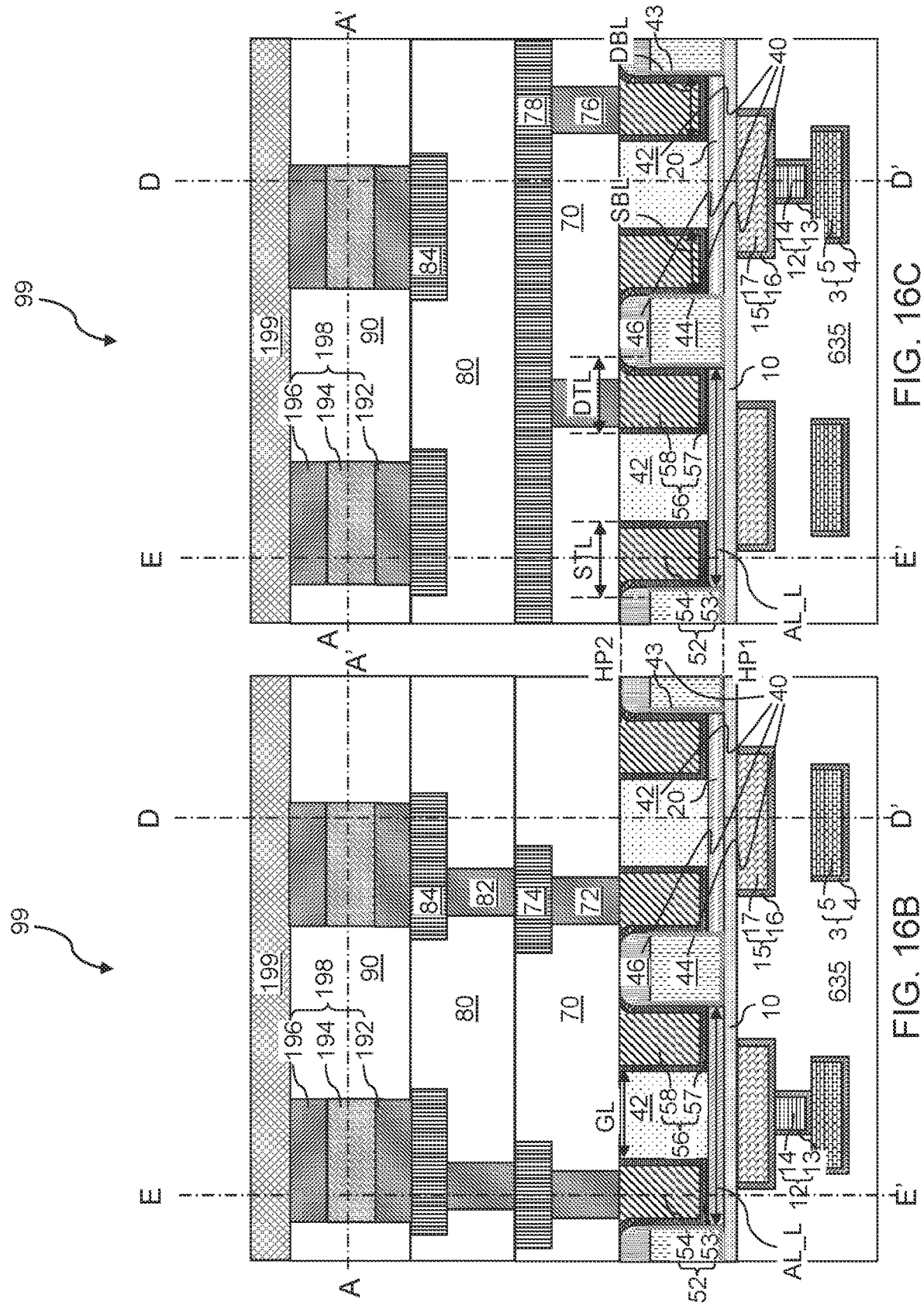

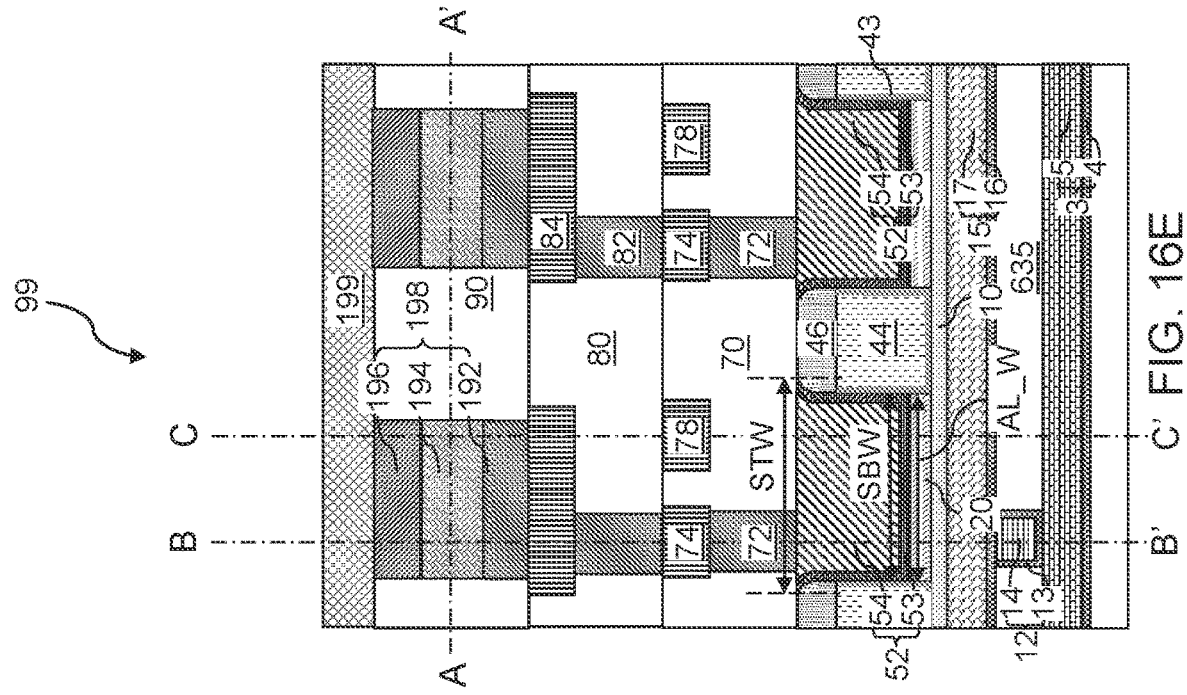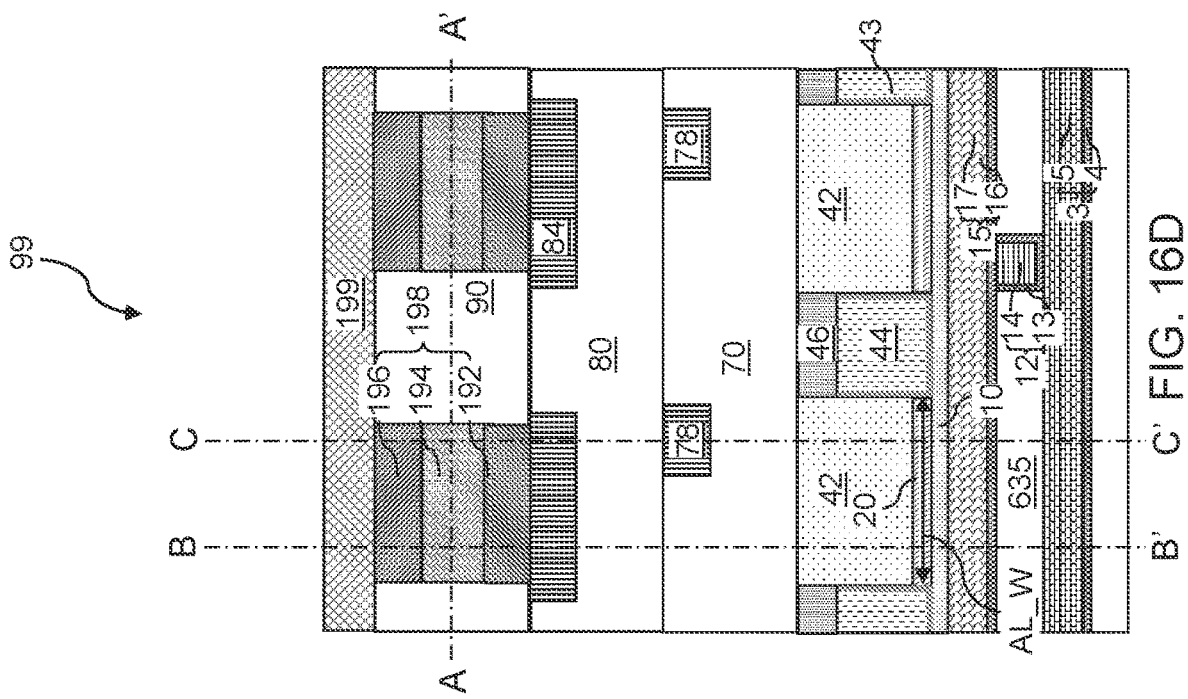

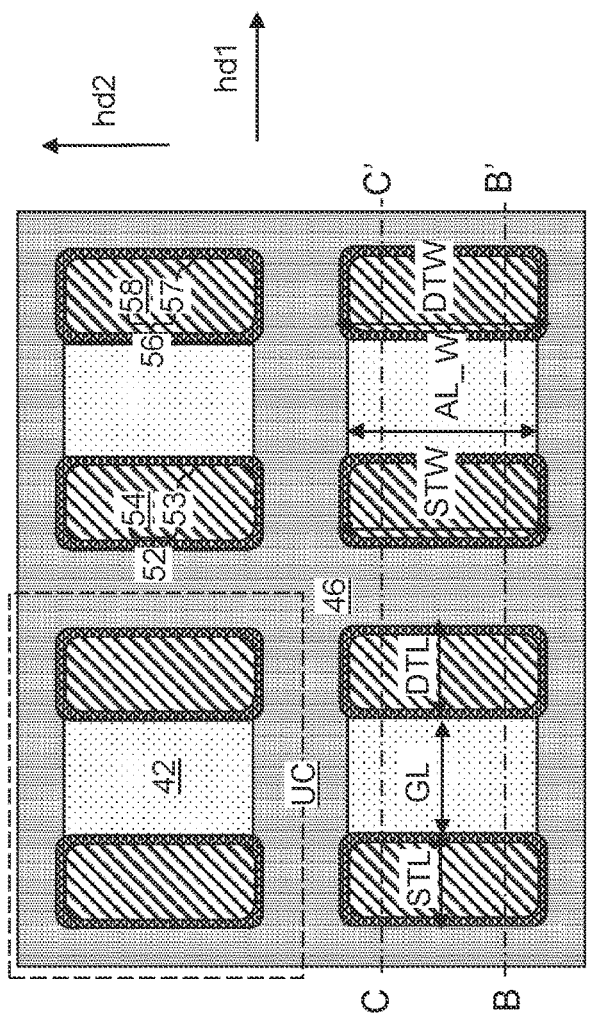
FIG. 18A
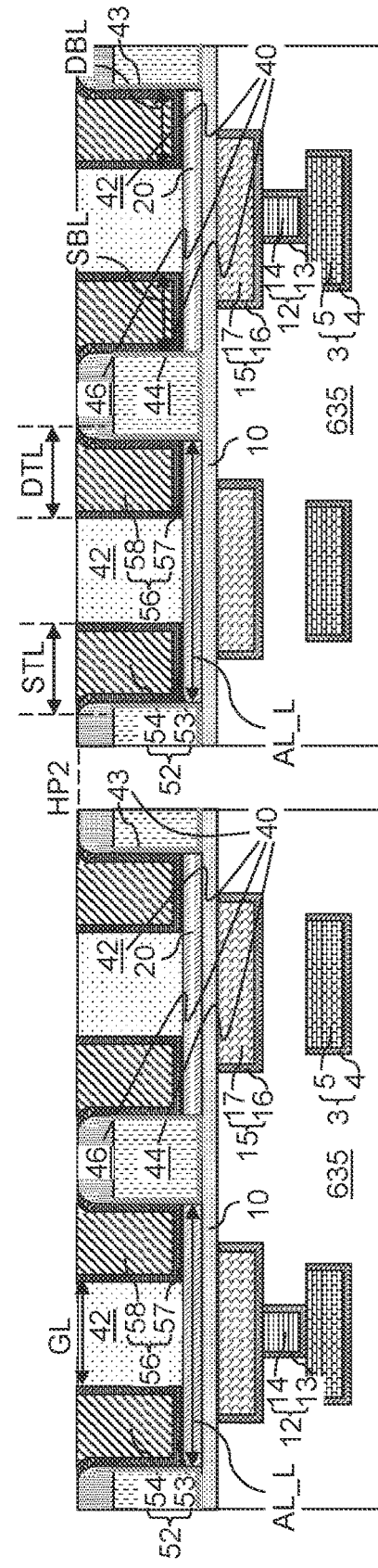
FIG. 18B
FIG. 18C

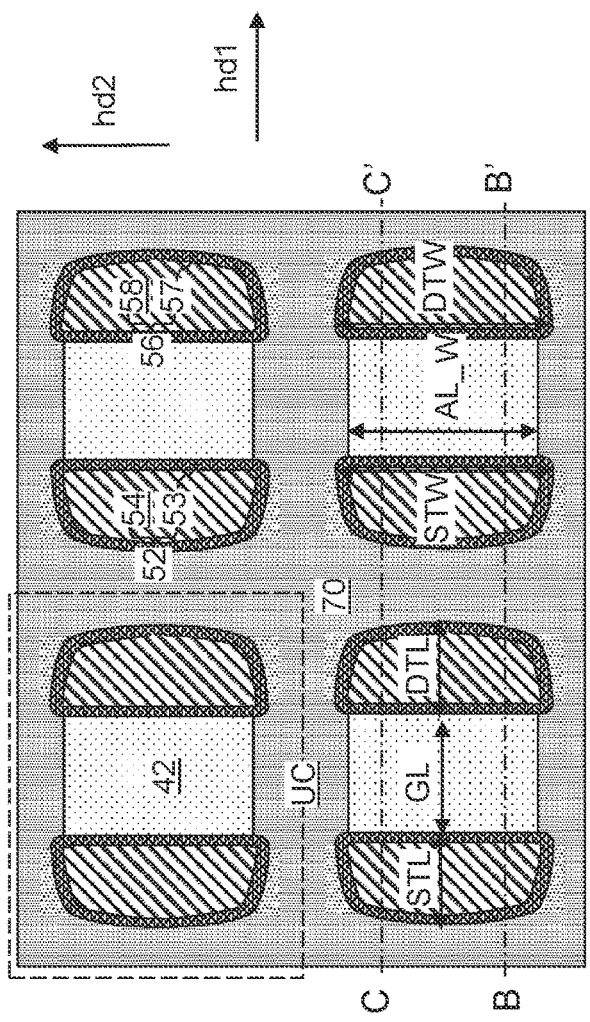
FIG. 19A
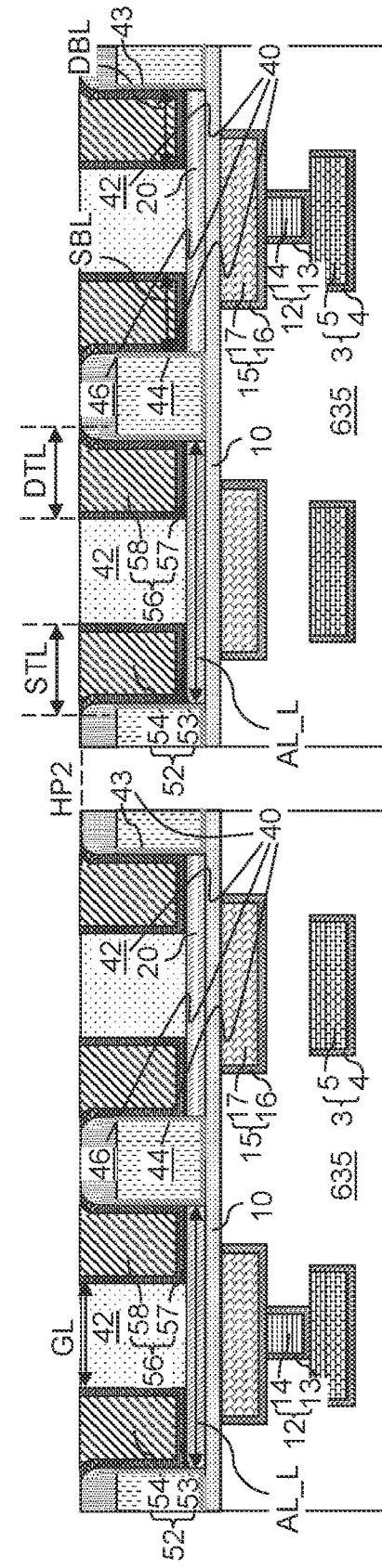
FIG. 19B
FIG. 19C

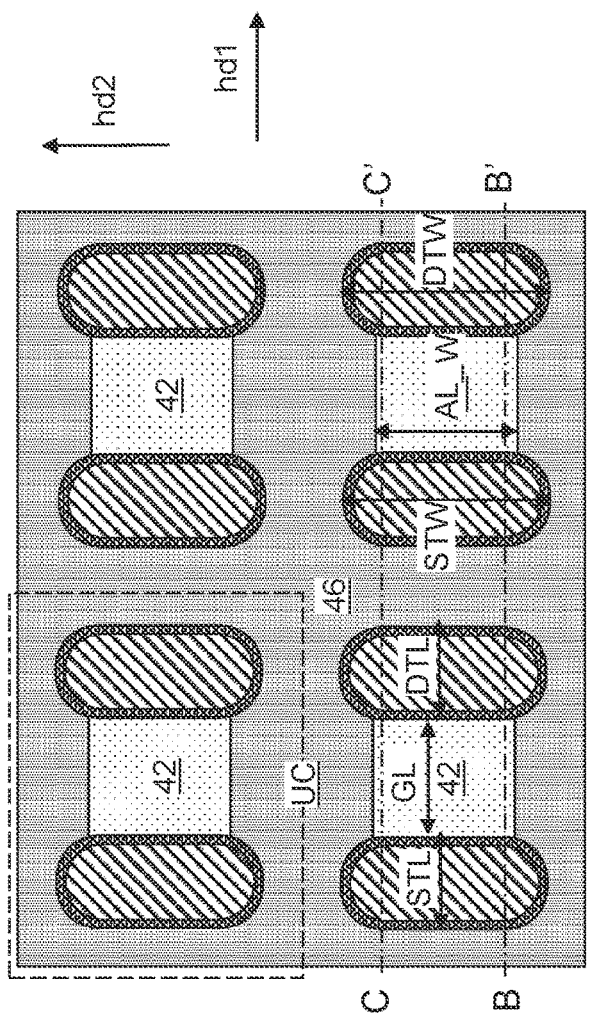
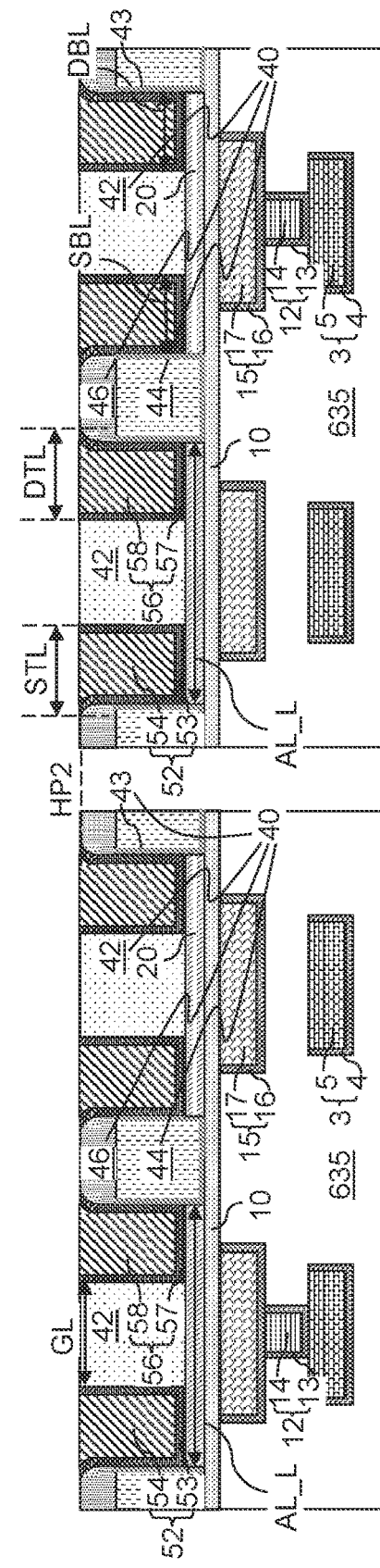
FIG. 20A
FIG. 20B
FIG. 20C

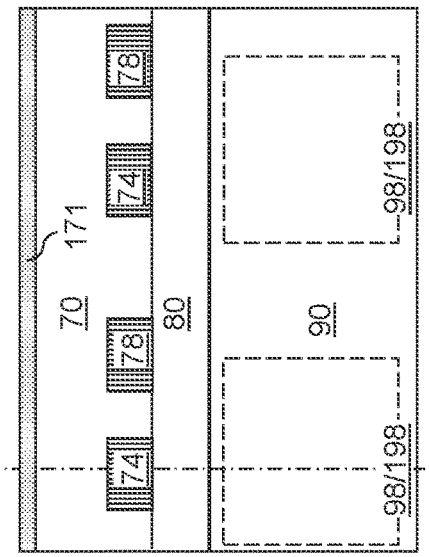
FIG. 21C
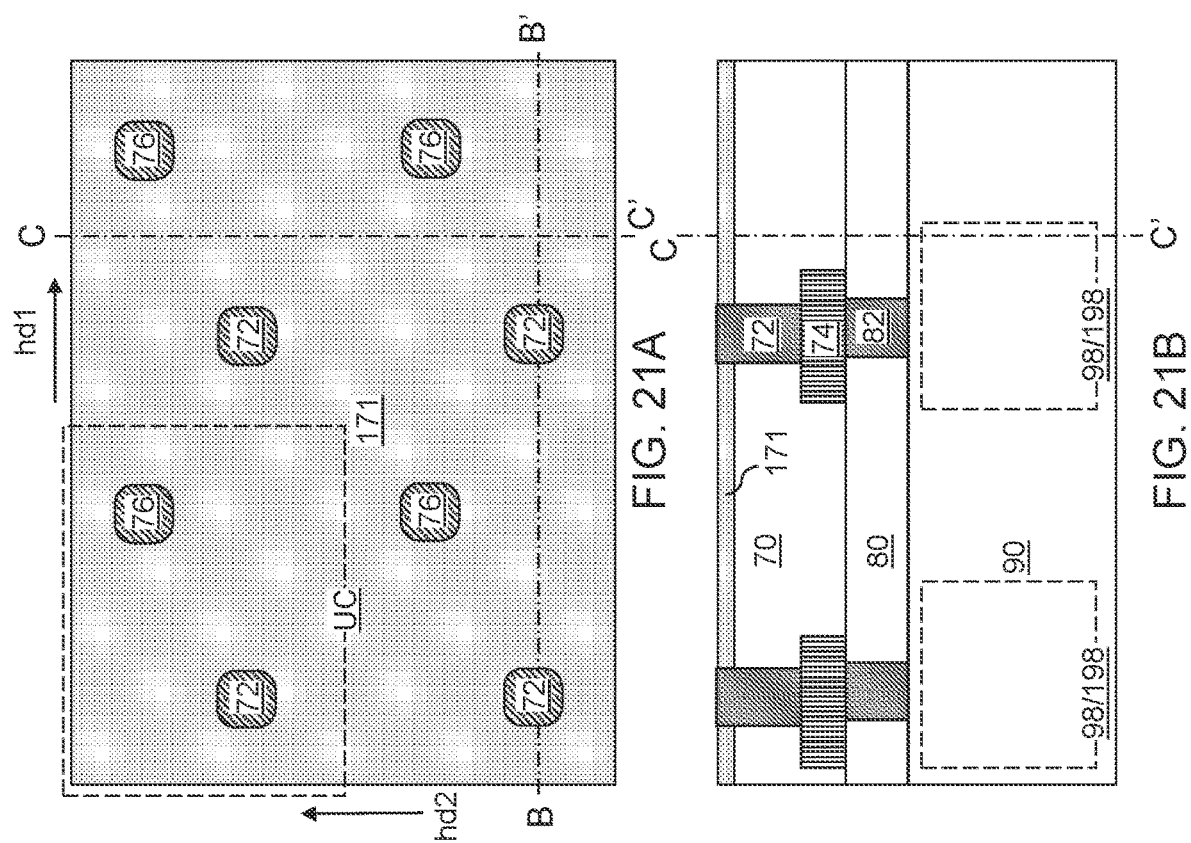
FIG. 21A
FIG. 21B

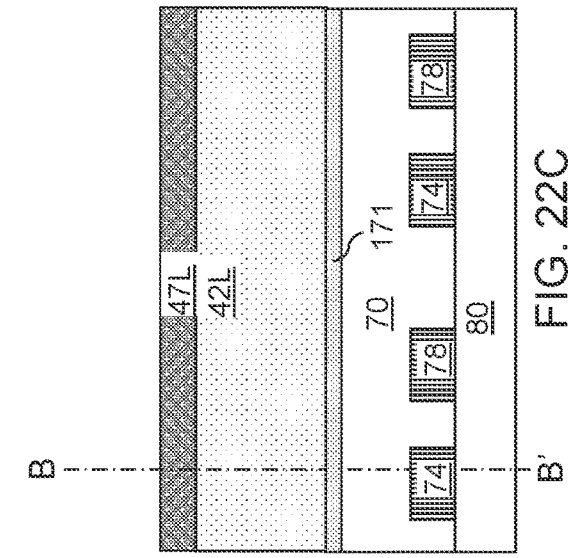
FIG. 22C
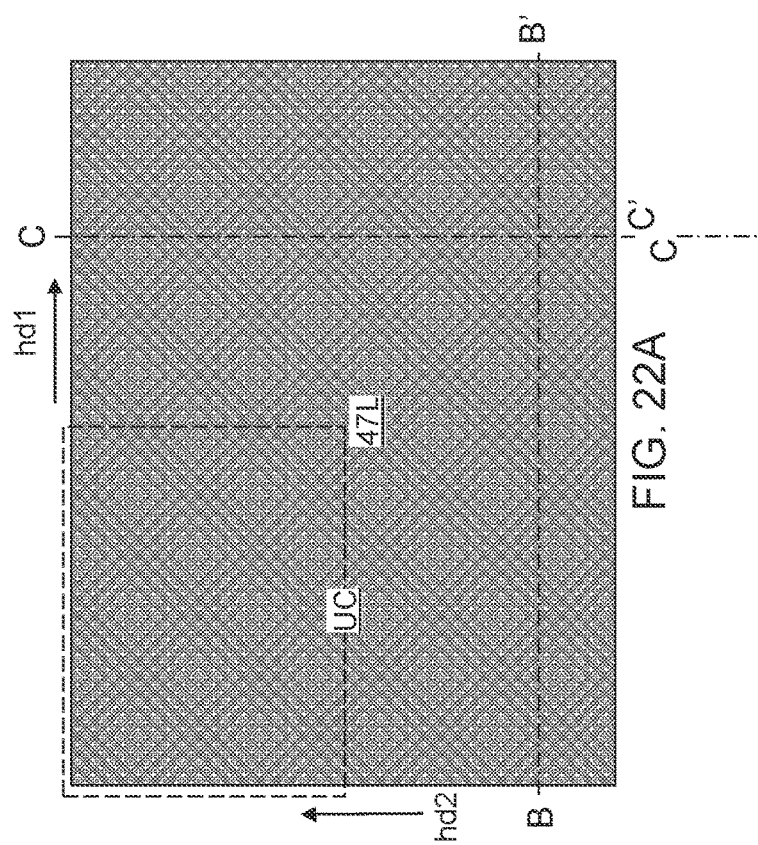
FIG. 22A
FIG. 22B

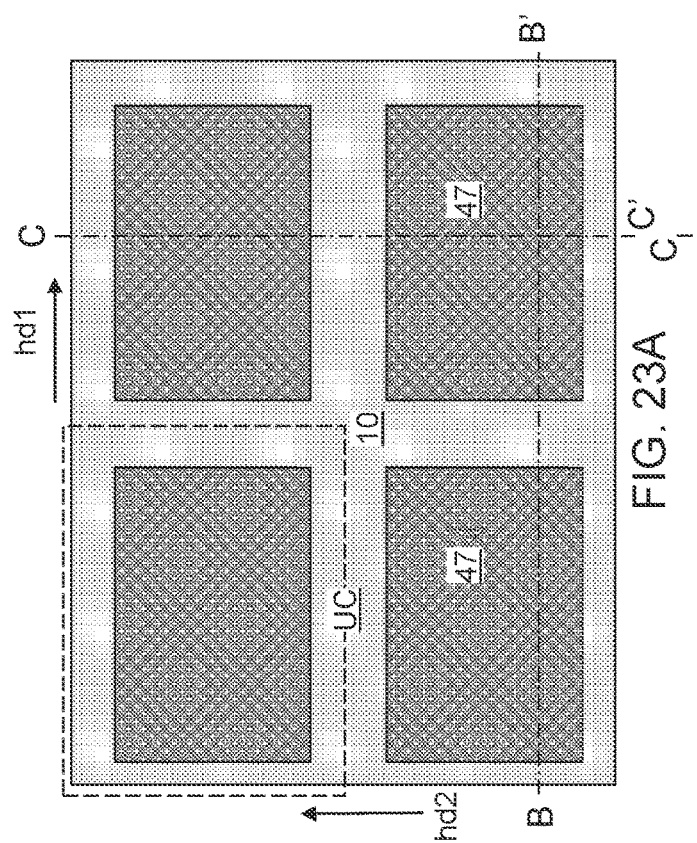

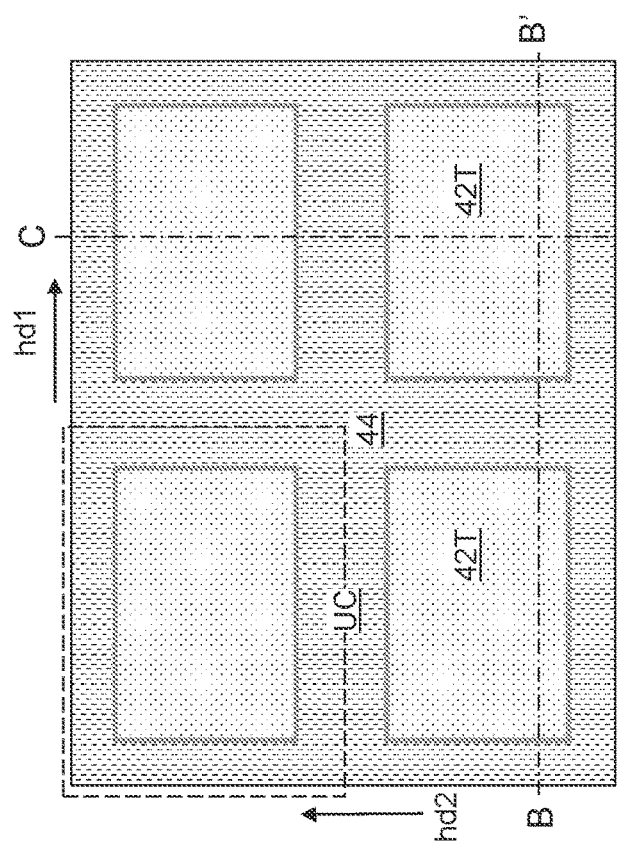
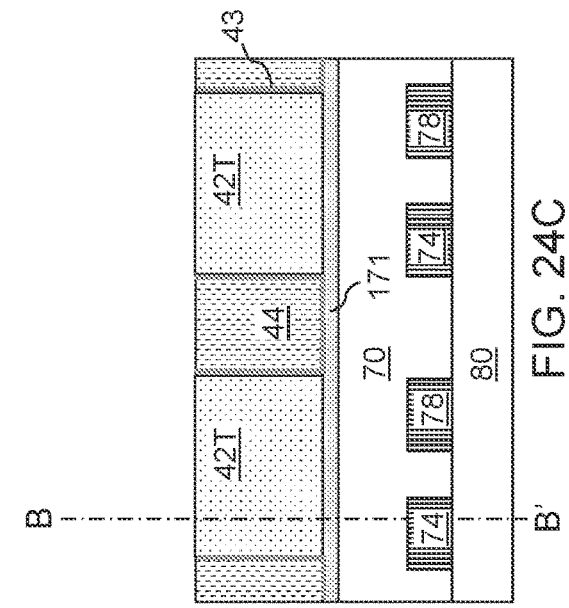
FIG. 24A
FIG. 24B
FIG. 24C

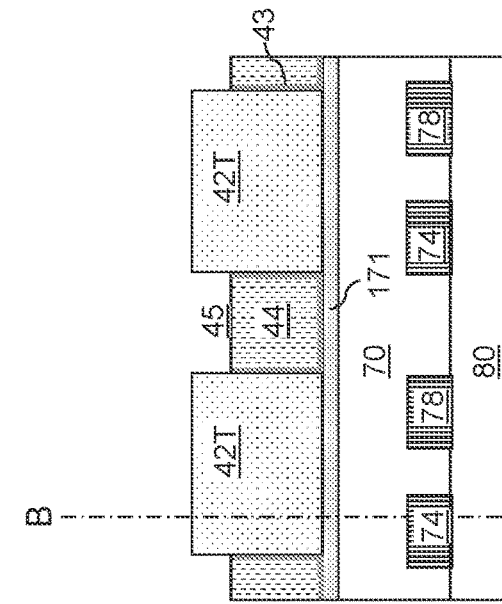
FIG. 25C
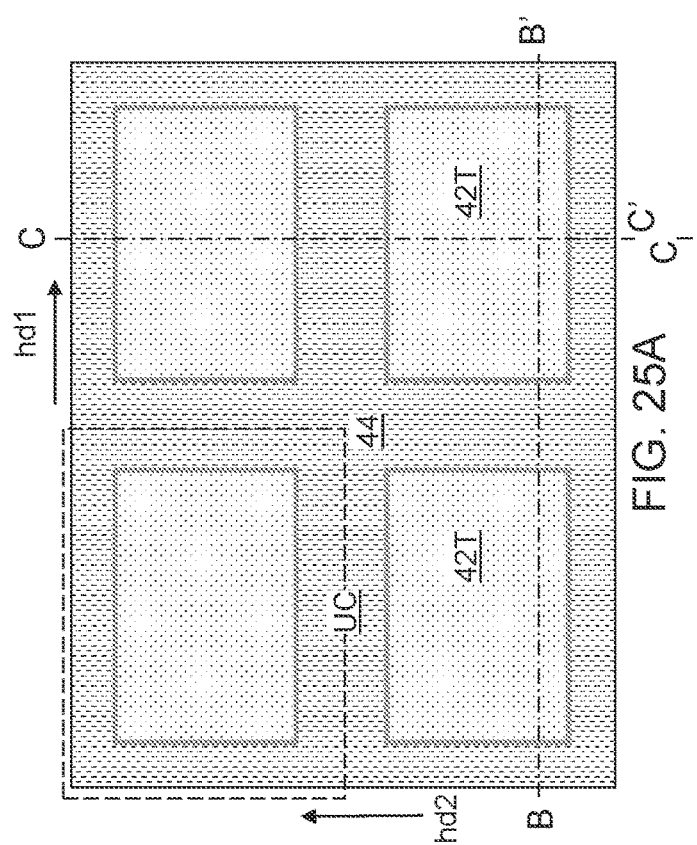
FIG. 25A
FIG. 25B

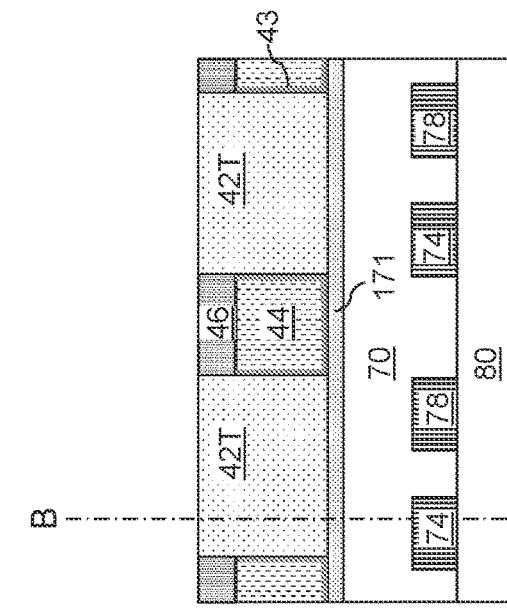
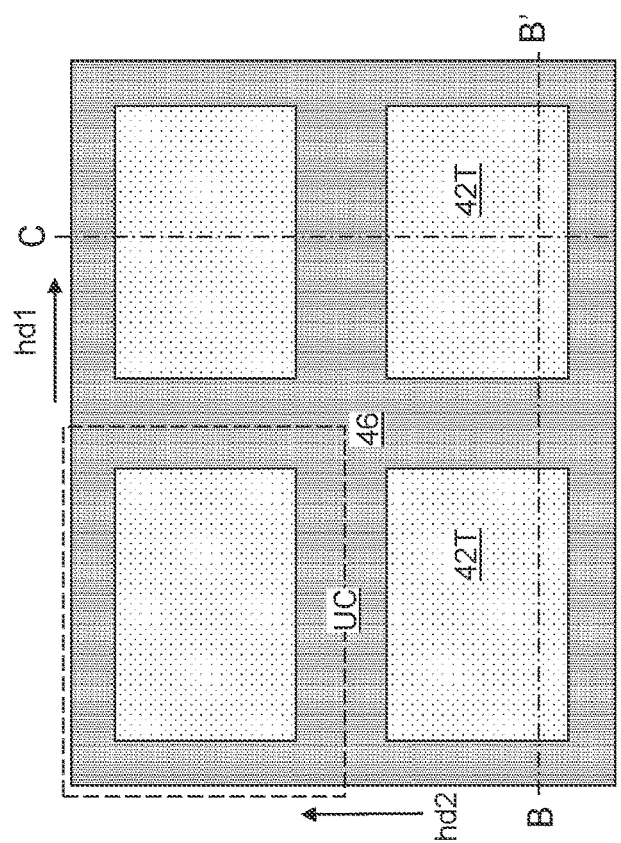
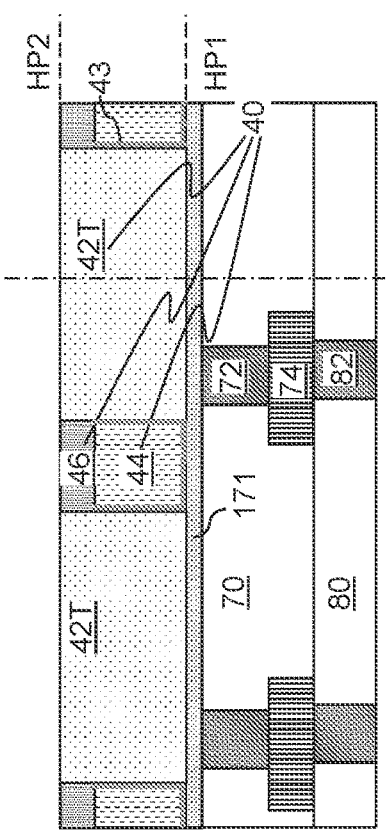
FIG. 26A
FIG. 26B
FIG. 26C

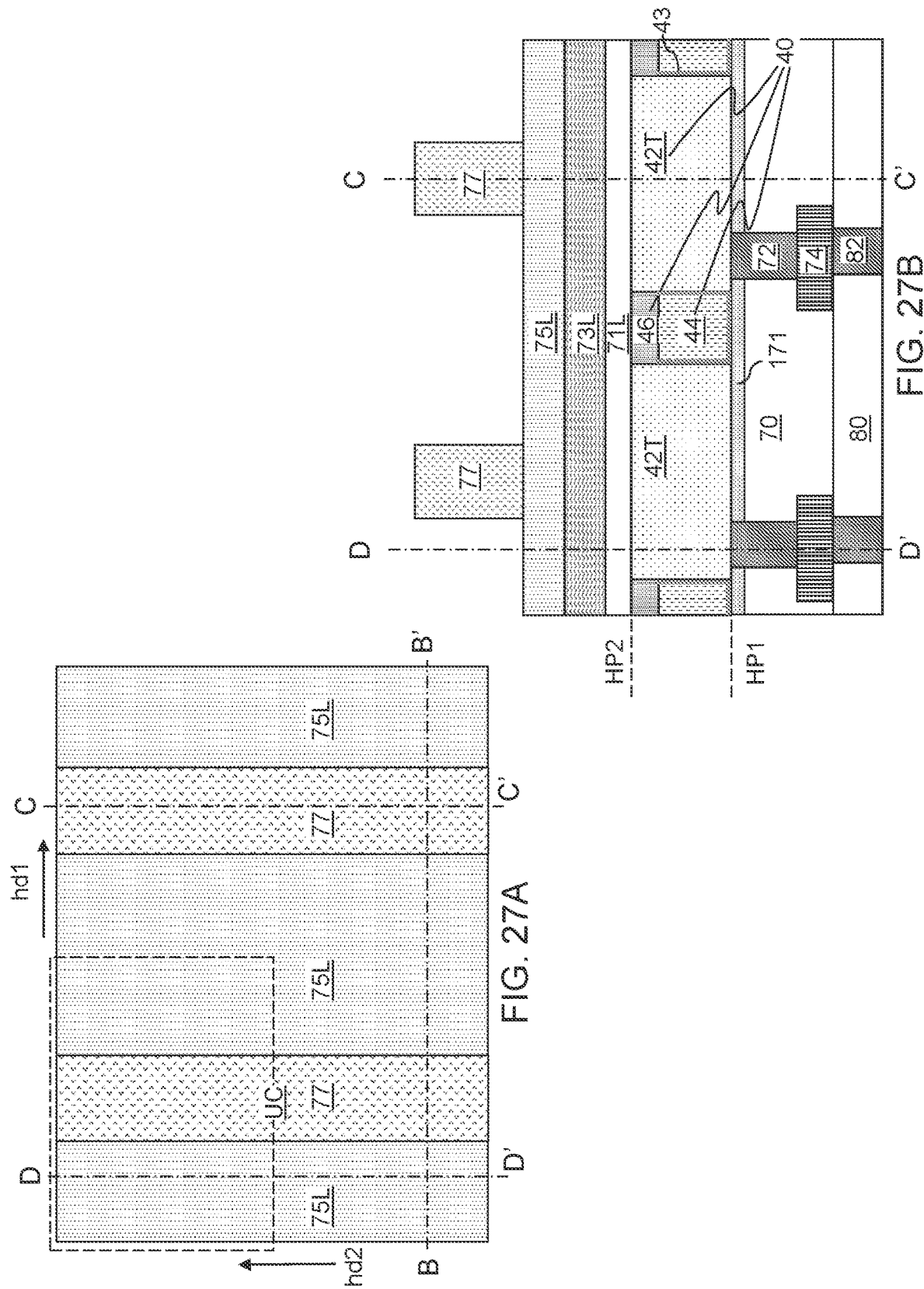

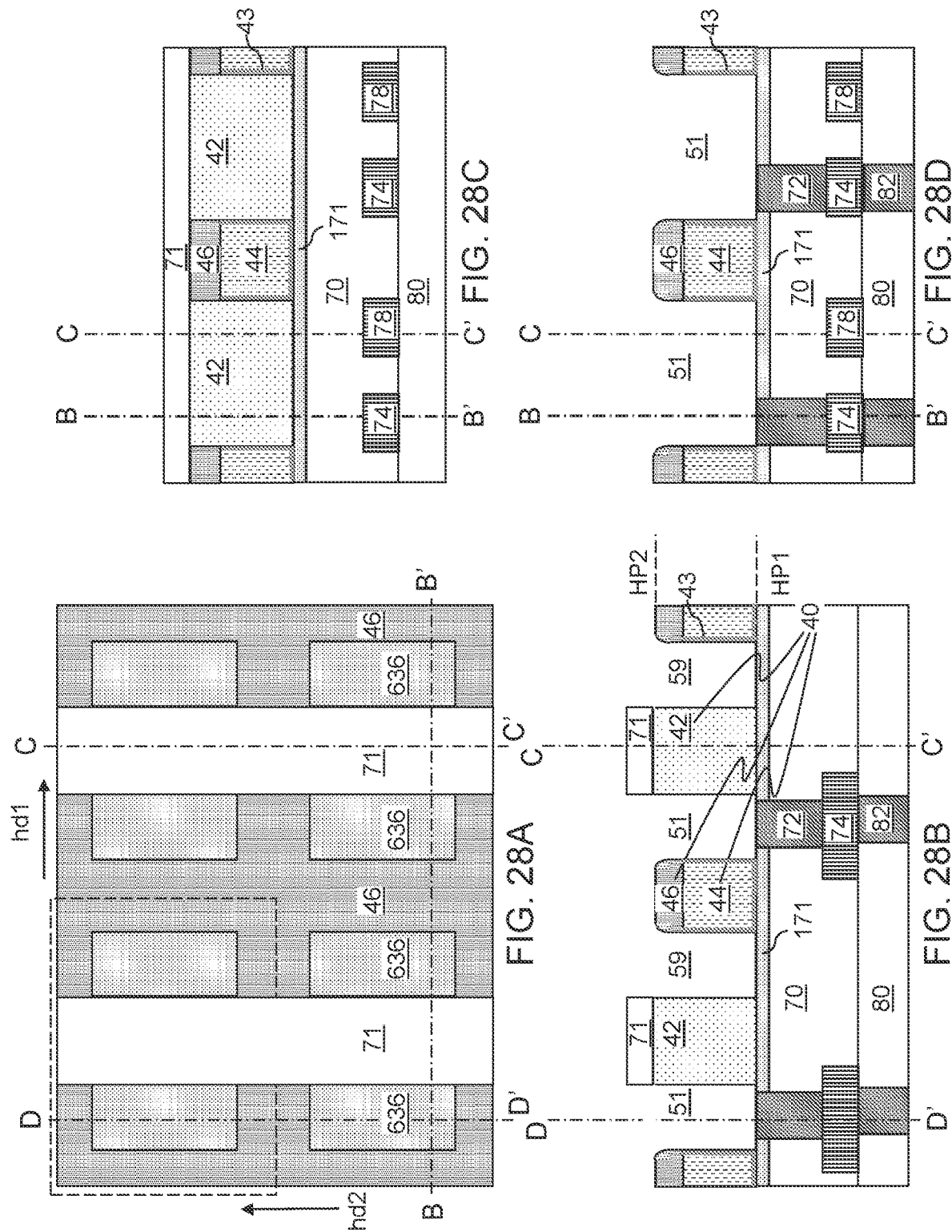

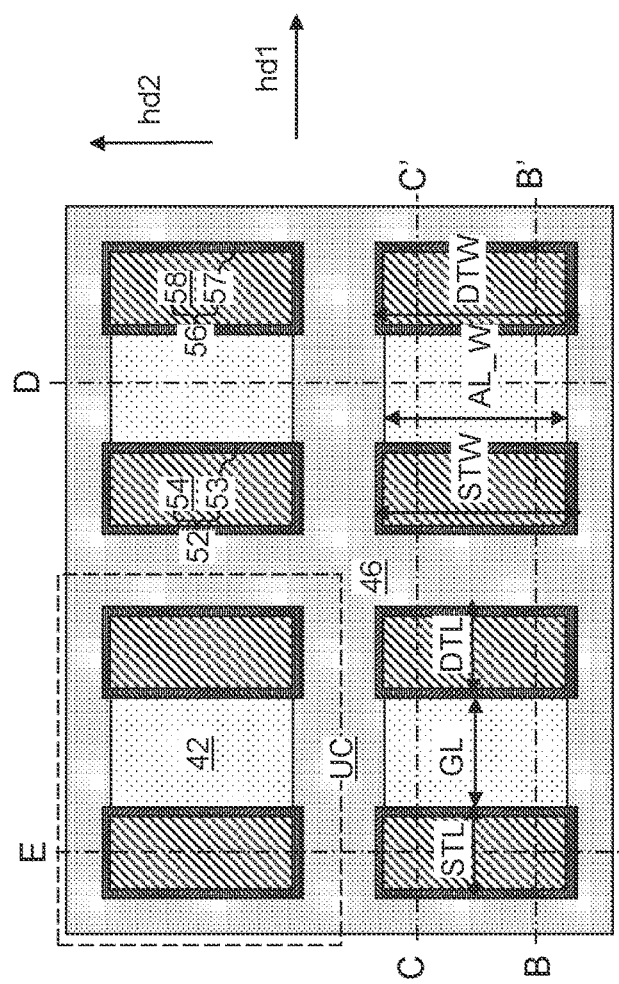
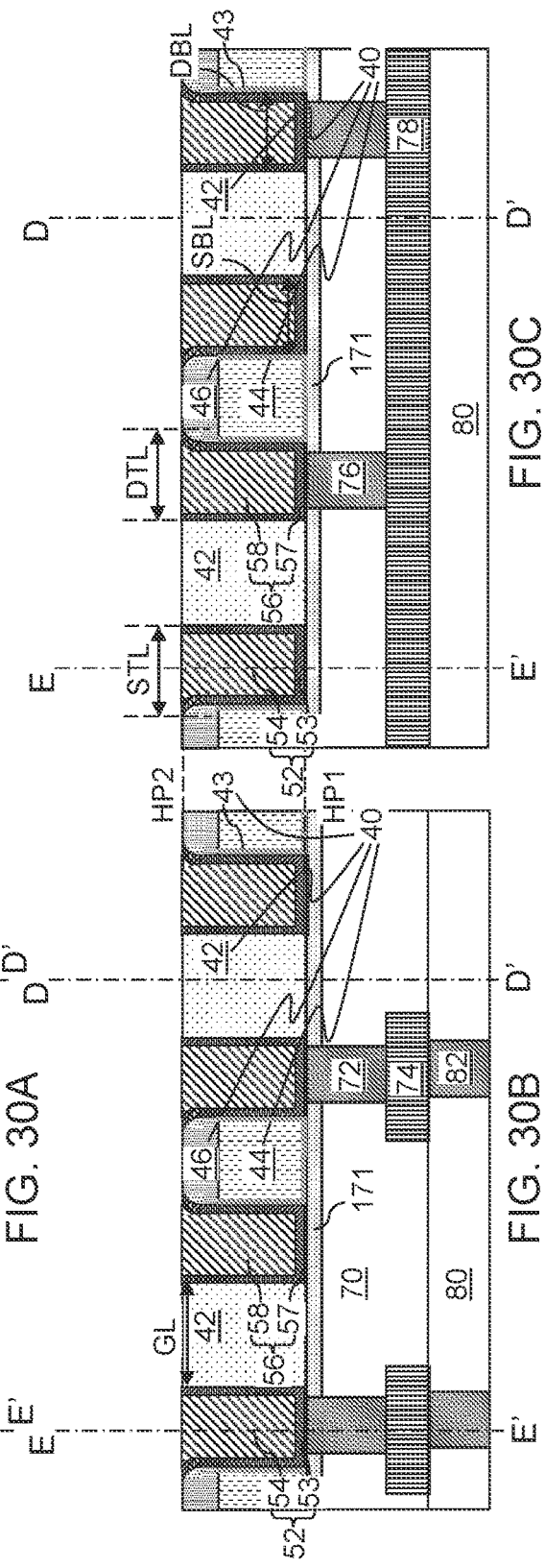
FIG. 30A
FIG. 30B
FIG. 30C

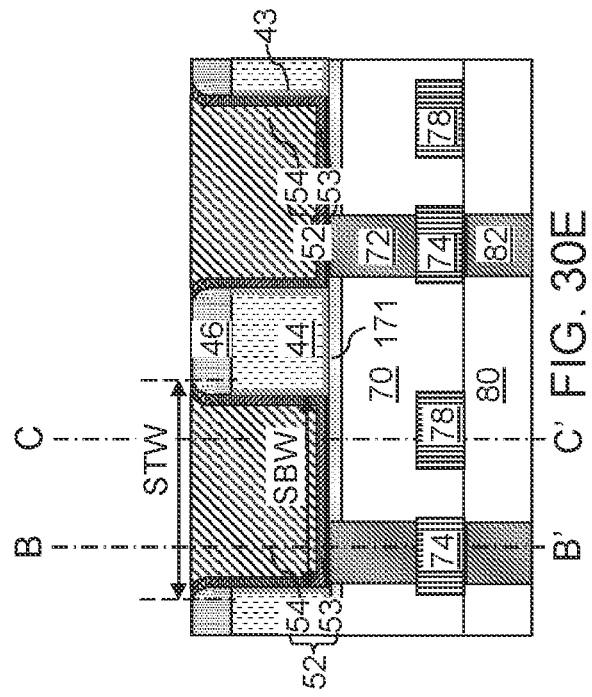
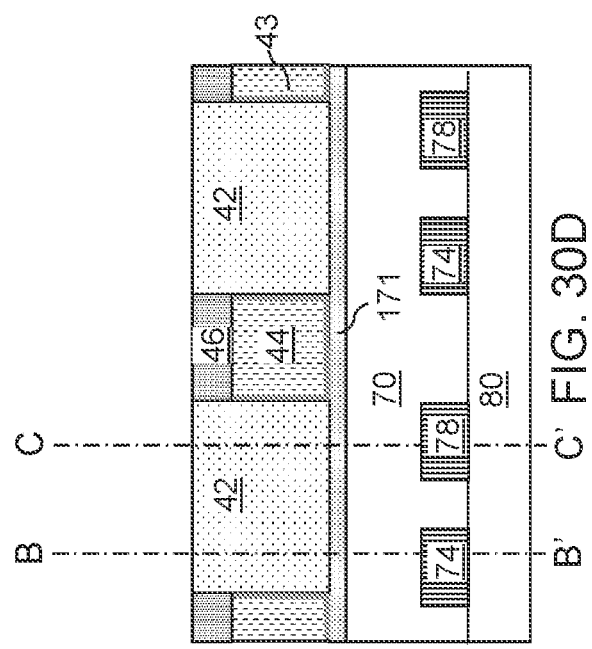

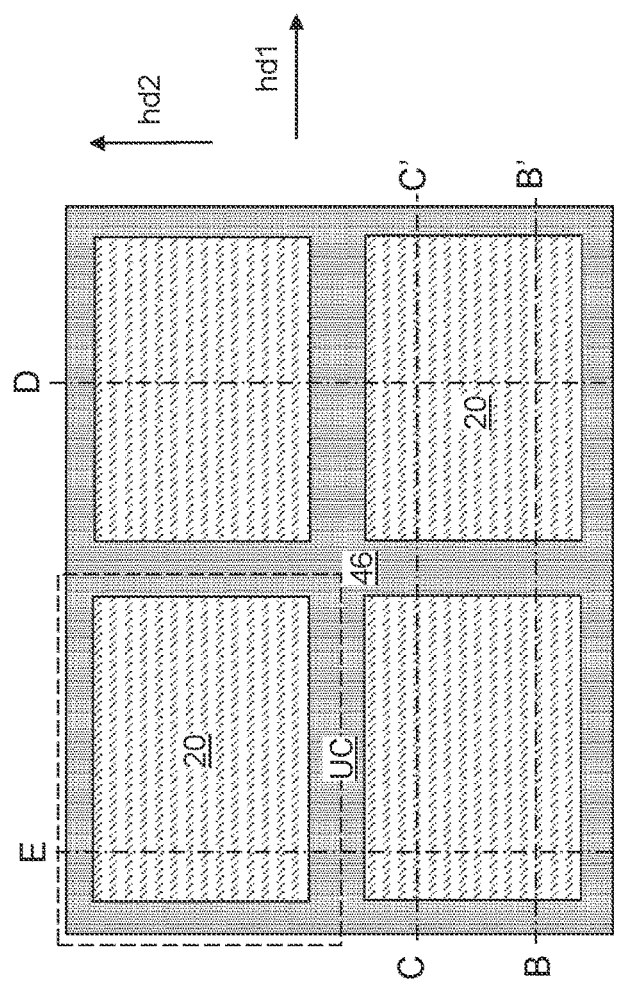
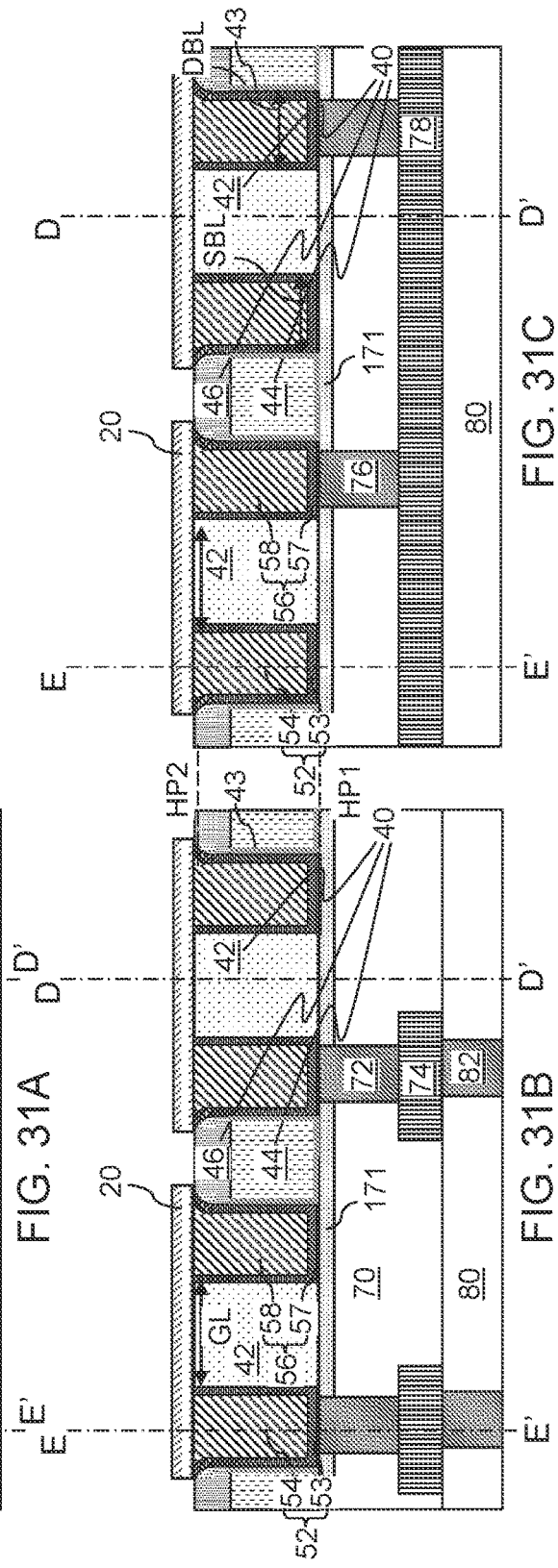
FIG. 31A
FIG. 31B
FIG. 31C

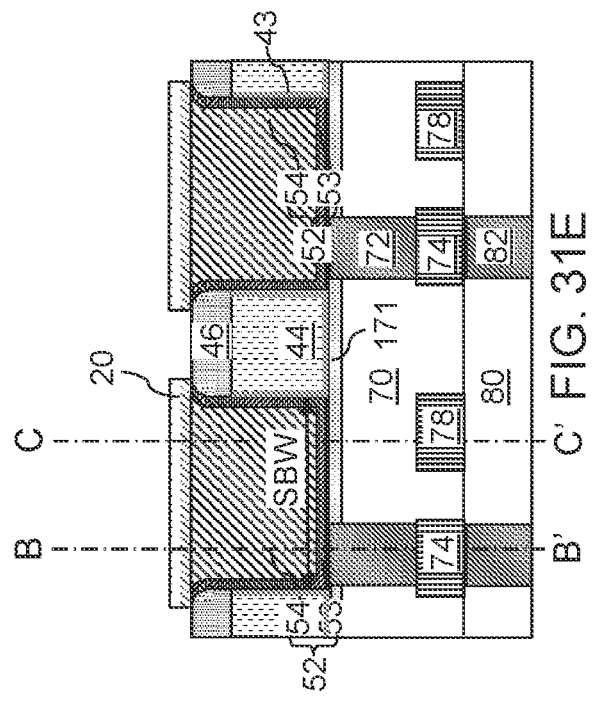
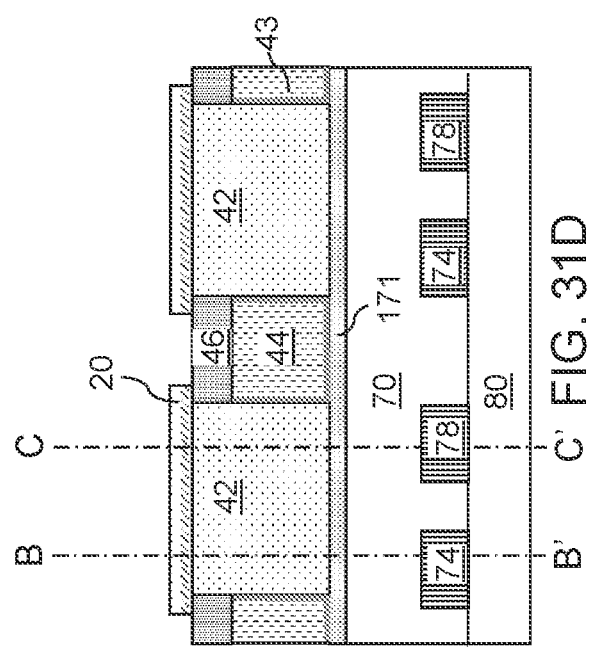

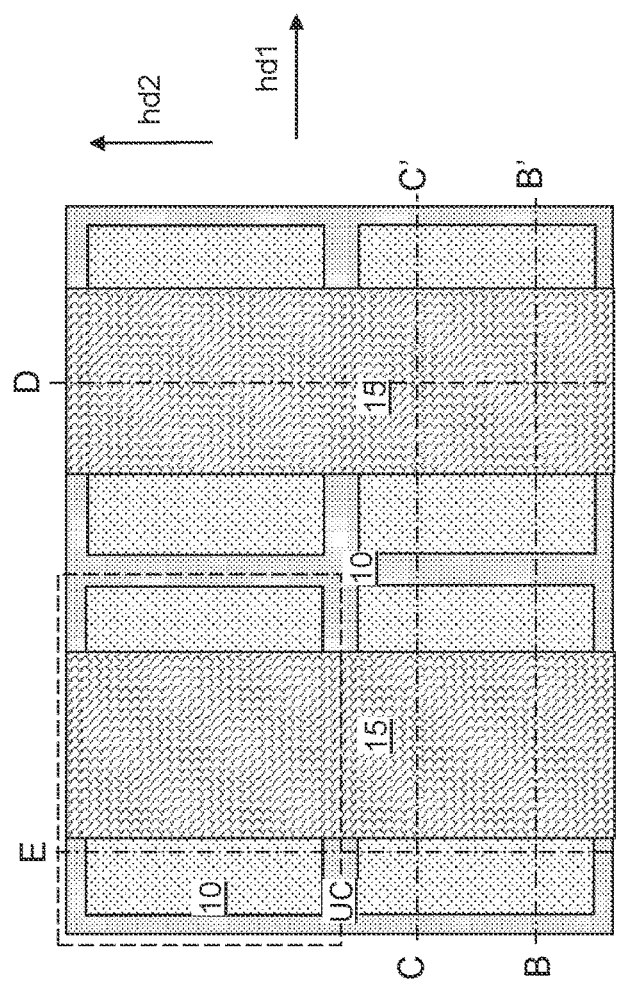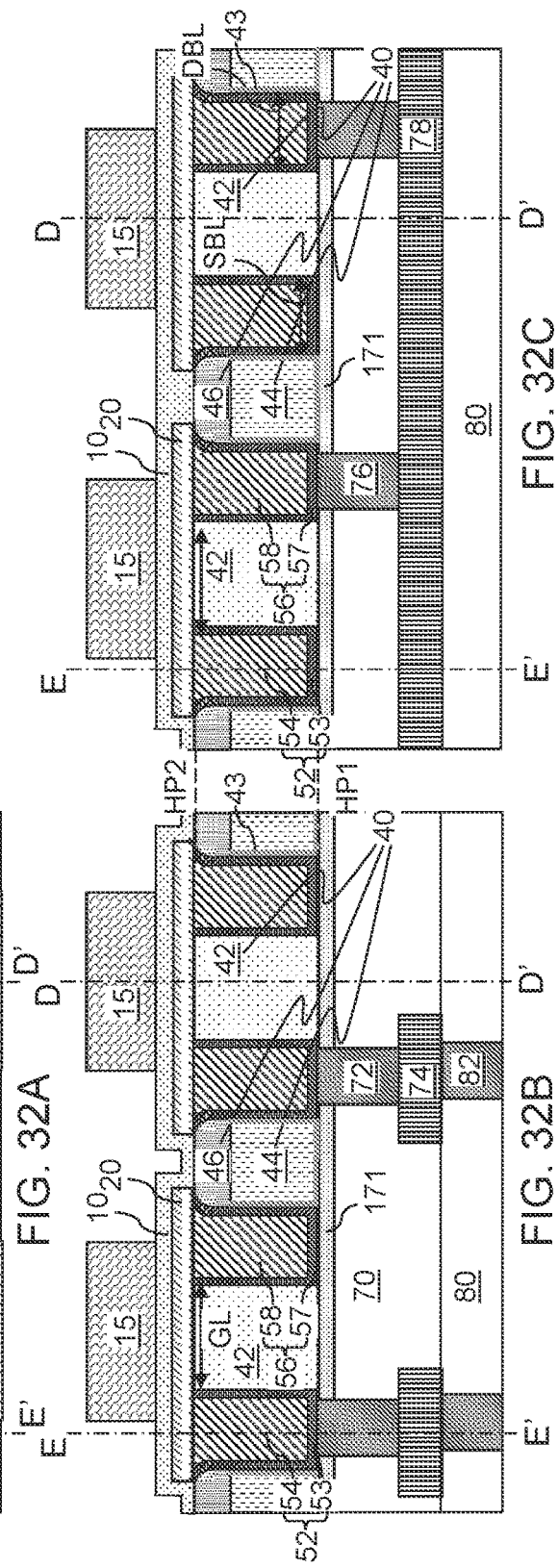

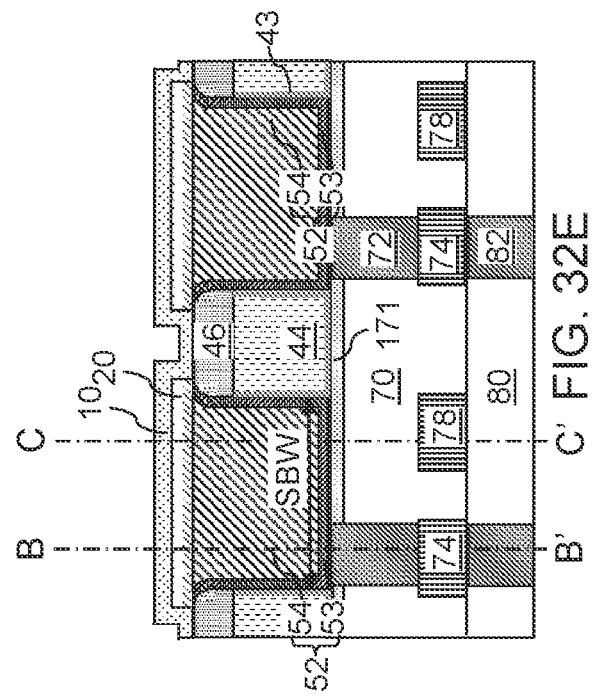
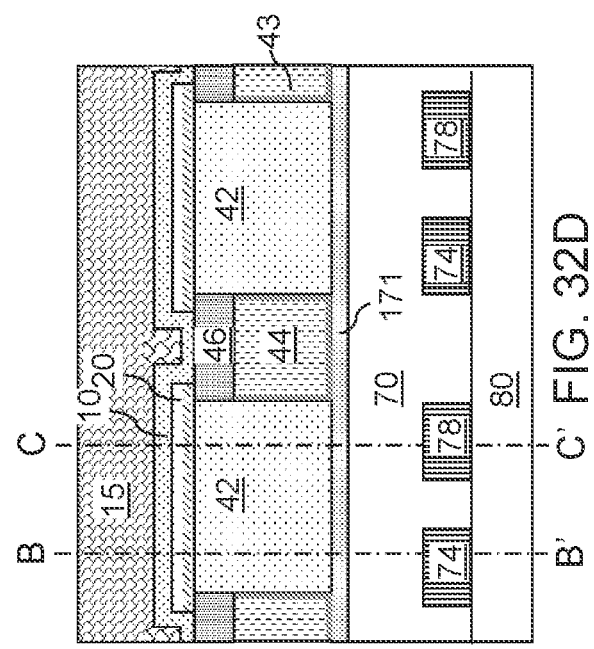

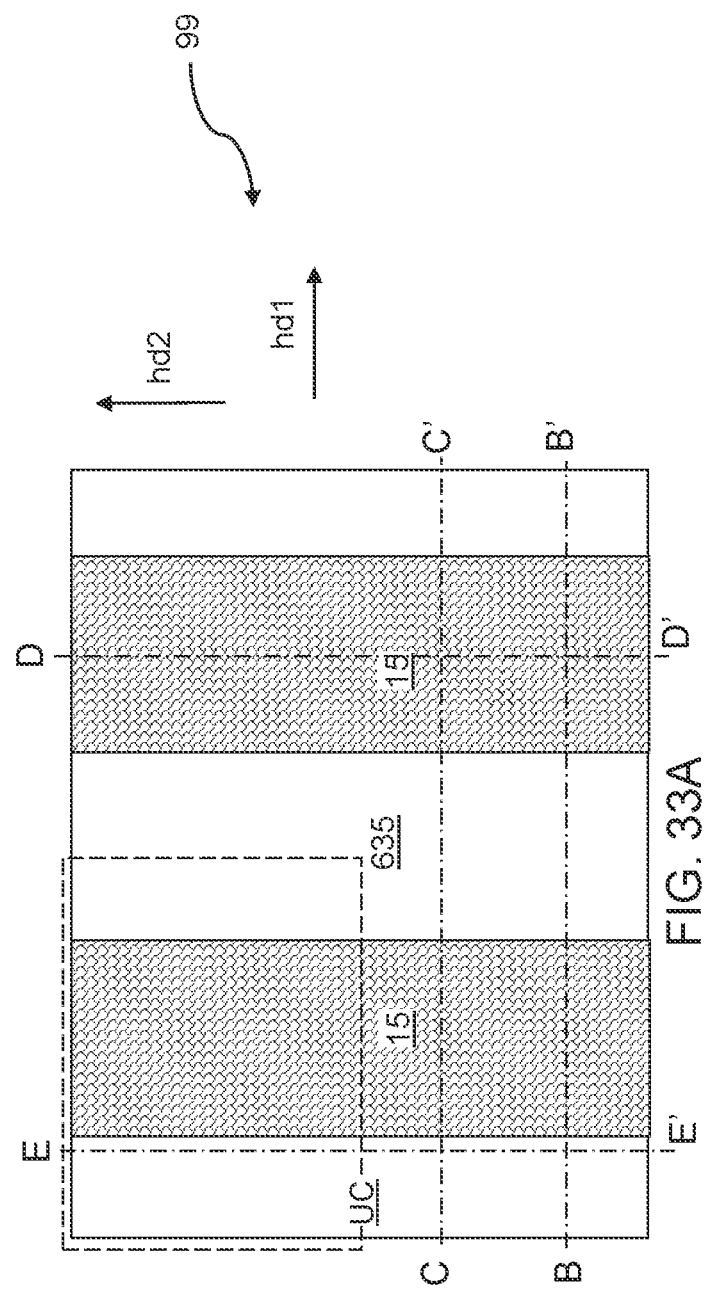

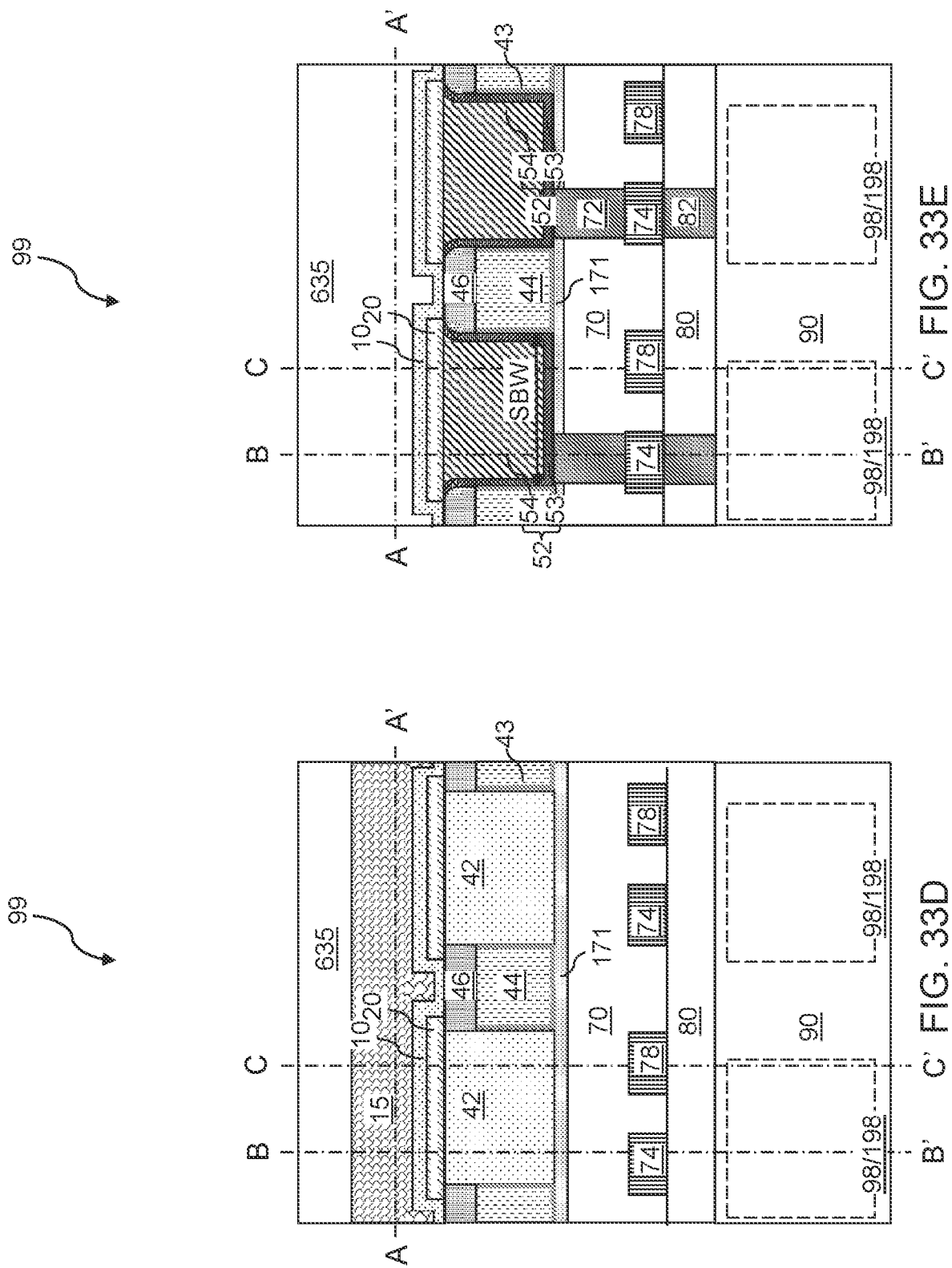

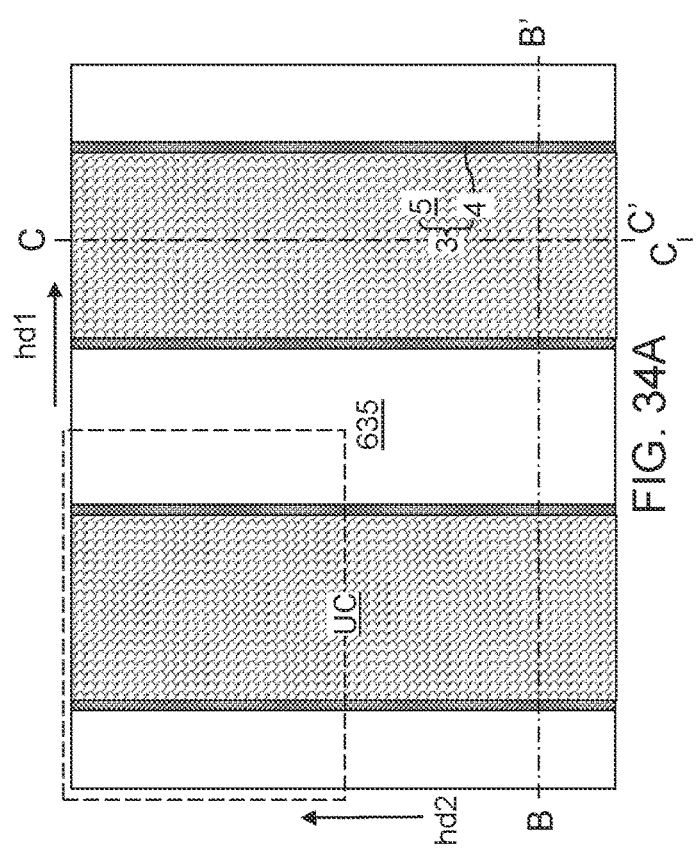
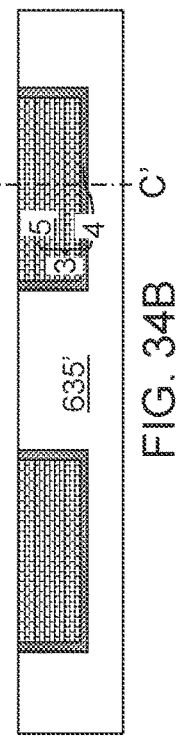

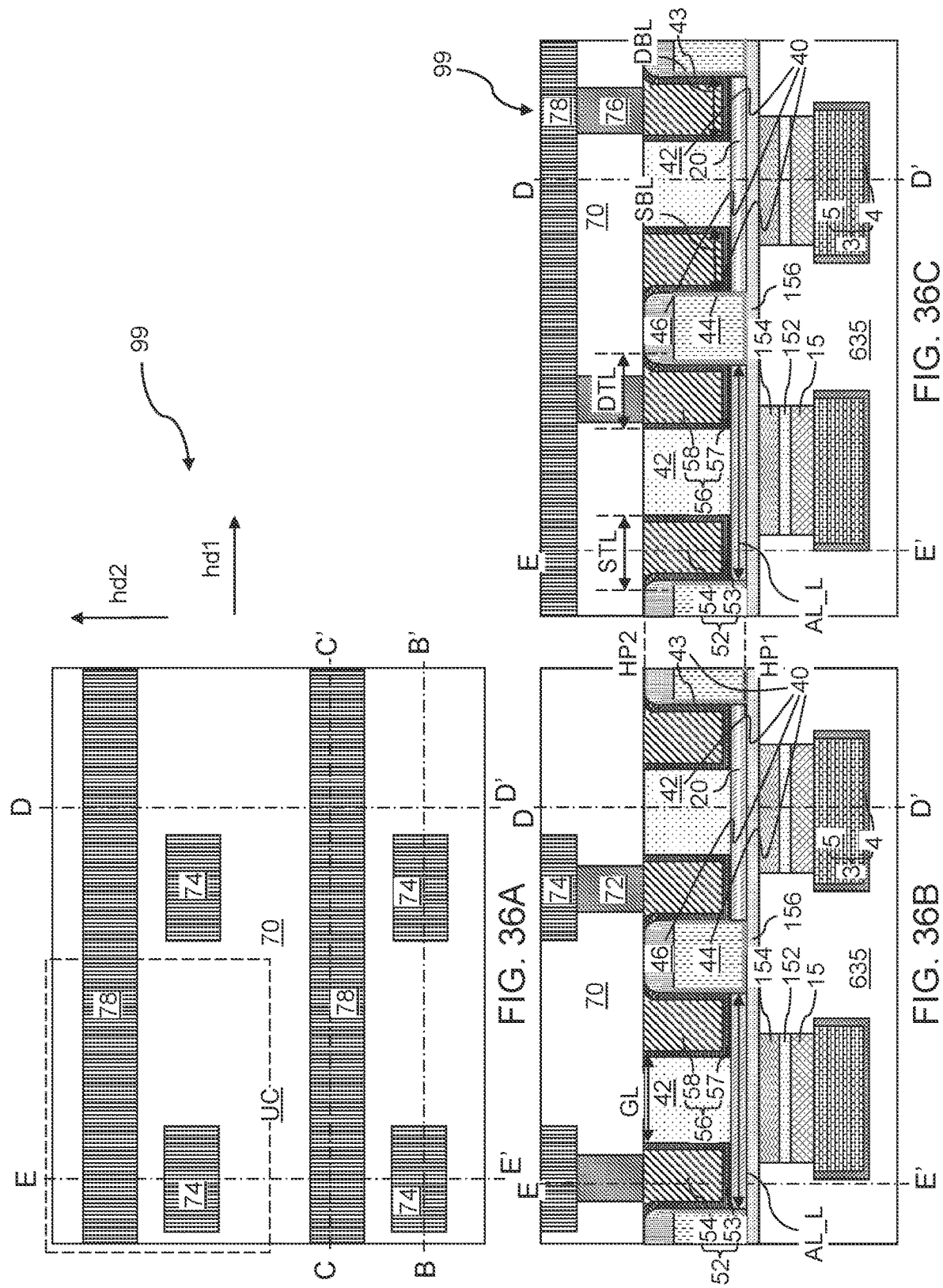

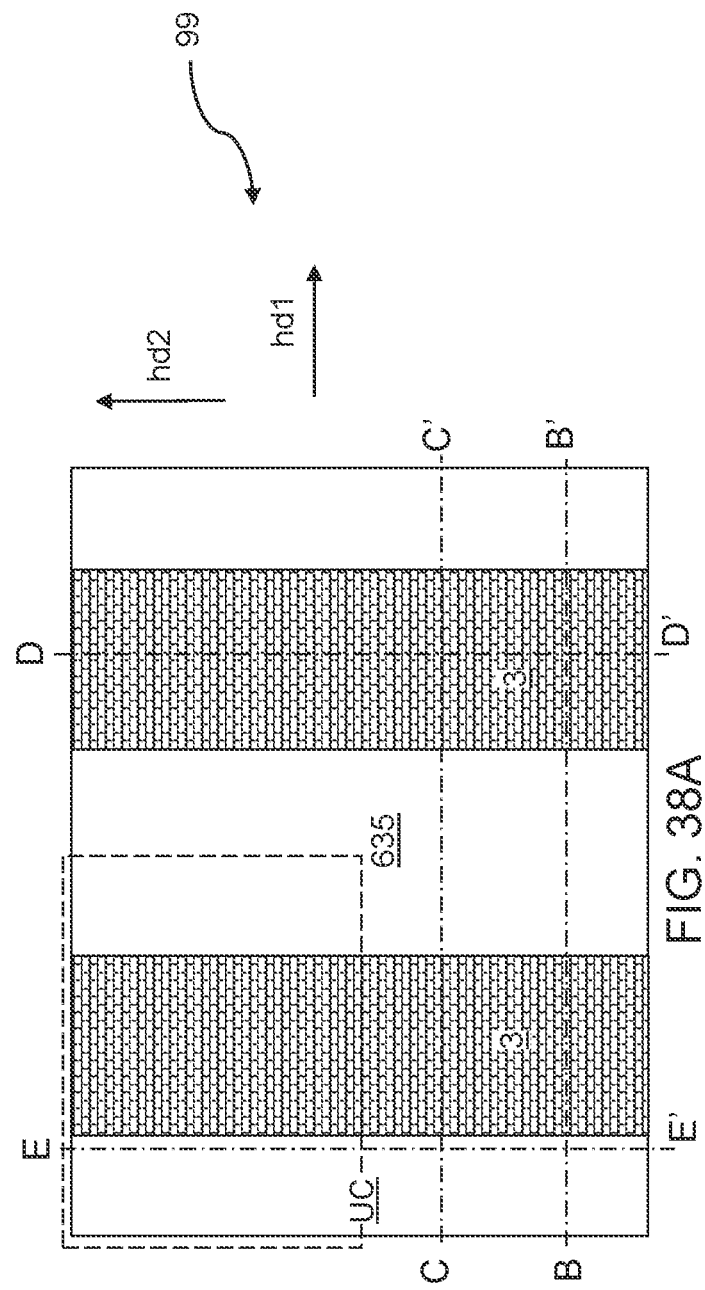

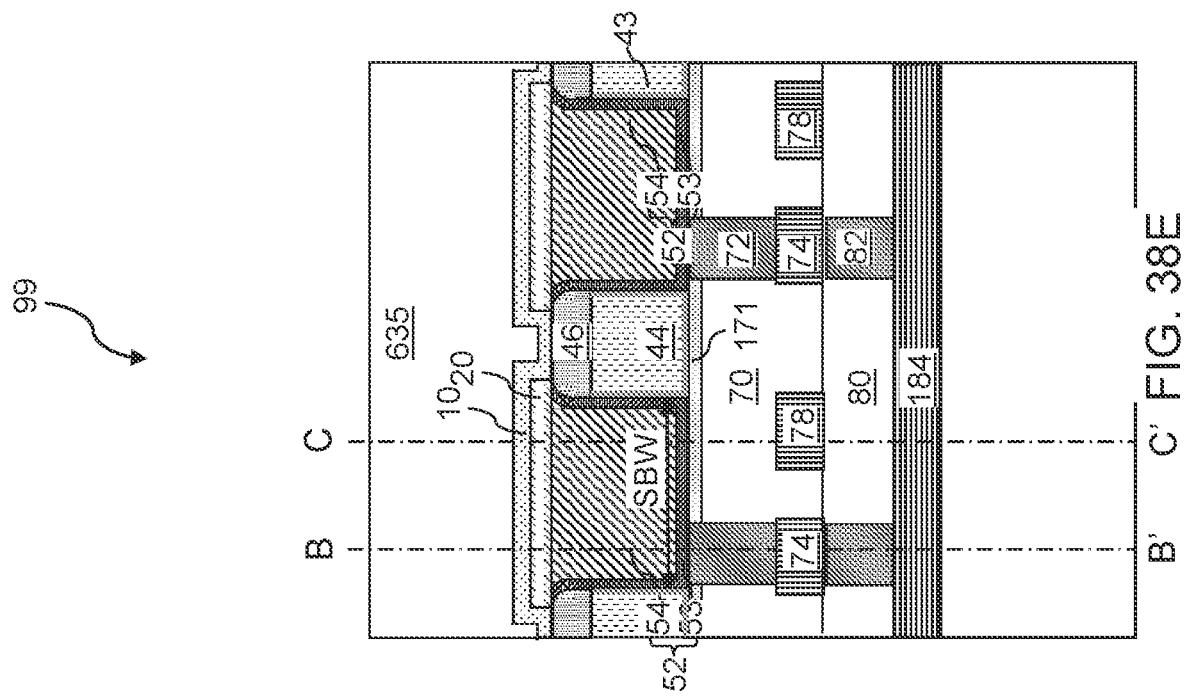
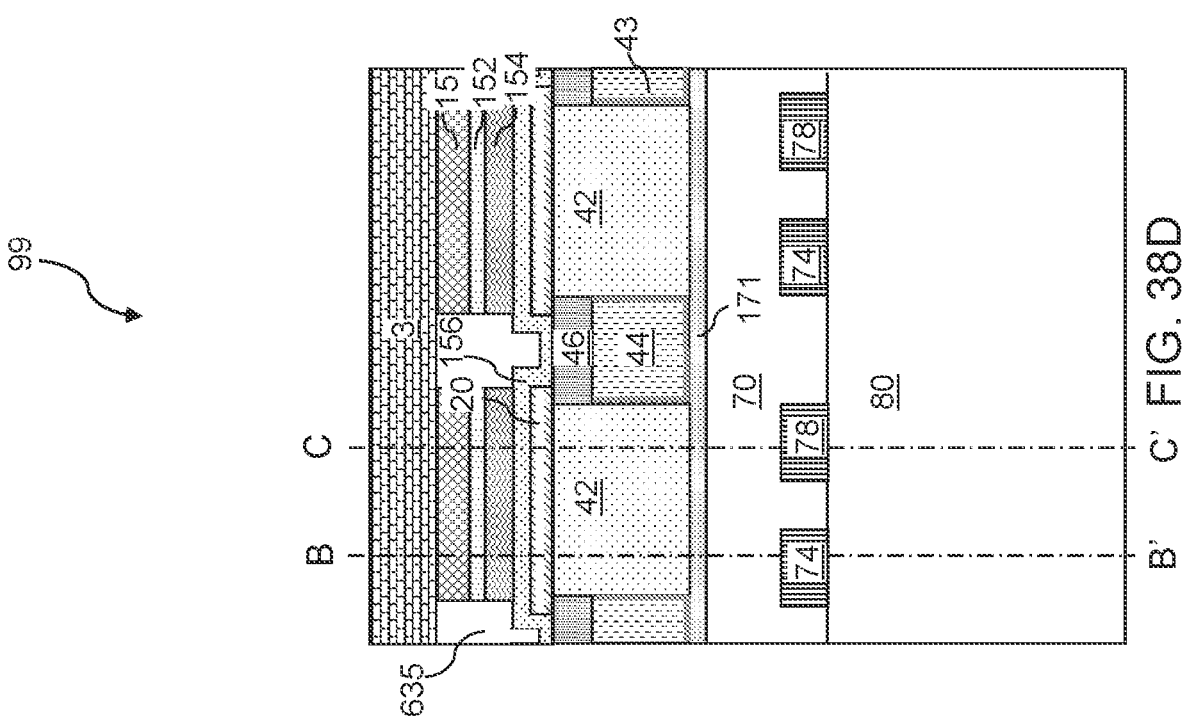

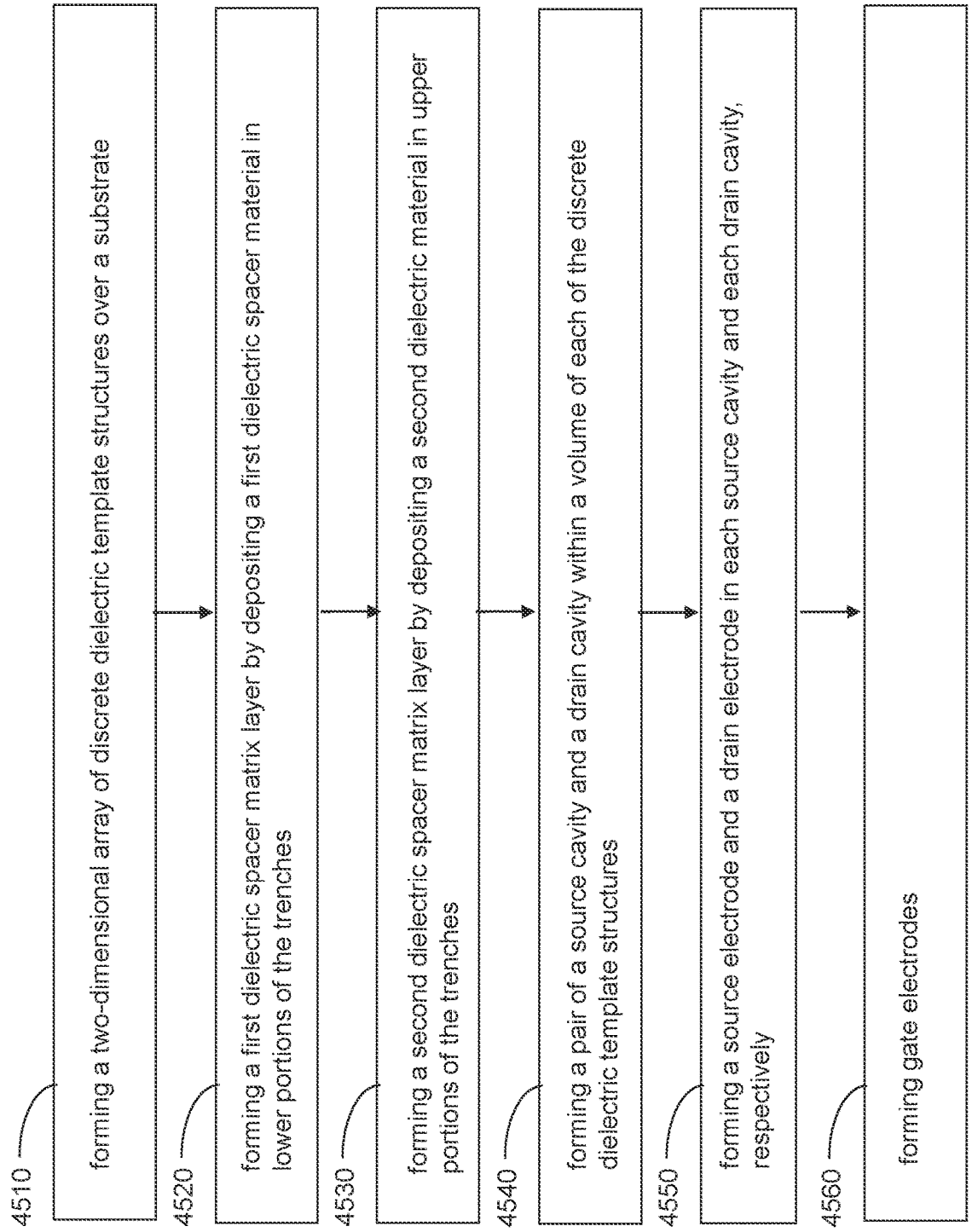

SELF-ALIGNED MULTILAYER SPACER MATRIX FOR HIGH-DENSITY TRANSISTOR ARRAYS AND METHODS FOR FORMING THE SAME

RELATED APPLICATIONS

This application claims the benefit of priority from a U.S. provisional application Ser. No. 63/287,741, titled "Semiconductor Device and Manufacturing Method Thereof," filed on Dec. 9, 2021, the entire contents of which are incorporated herein by reference.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Among the figures labeled with a combination of a figure numeral and an alphabetical suffix, figured with the same figure numeral correspond to a same processing step. Among figures with a figure numeral in a range from 2 to 12, figures labeled with a combination of a figure numeral and the alphabetical suffix "A" are top-down views. Among figures with a figure numeral in a range from 2 to 12, figures labeled with a combination of a figure numeral and an alphabetical suffix selected from "B," "C," "D," or "E" are vertical cross-sectional views along a vertical plane B-B', C-C', D-D', or E-E', respectively, of a structure illustrated in a figure labeled with the same figure numeral and the alphabetical index "A." Among figures with a figure numeral in a range from 2 to 12, vertical cross-sectional planes B-B', C-C', D-D', and E-E' are shown in various top-down views and various vertical cross-sectional views as applicable.

FIGS. 2A-2C are various views of a portion of a memory array region of the first exemplary structure after formation of an in-process gate-level insulating layer and word lines according to a first embodiment of the present disclosure. FIG. 2A is a top-down view, and FIGS. 2B and 2C are vertical cross-sectional views along the vertical plane B-B' or C-C' of FIG. 2A, respectively.

FIG. 3A is a top-down view, and FIGS. 3B and 3C are vertical cross-sectional views along the vertical plane B-B' or C-C' of FIG. 3A, respectively.

FIG. 4A is a top-down view, and FIGS. 4B and 4C are vertical cross-sectional views along the vertical plane B-B' or C-C' of FIG. 4A, respectively.

FIGS. 5A-5C are various views of the portion of the memory array region of the first exemplary structure after formation of a patterned hard mask layer, discrete dielectric template structures, and active layers according to the first embodiment of the present disclosure. FIG. 5A is a top-down view, and FIGS. 5B and 5C are vertical cross-sectional views along the vertical plane B-B' or C-C' of FIG. 5A, respectively.

FIGS. 6A-6C are various views of the portion of the memory array region of the first exemplary structure after formation of an etch stop dielectric liner and a first dielectric spacer matrix layer in trenches between the discrete dielectric template structures according to the first embodiment of the present disclosure. FIG. 6A is a top-down view, and FIGS. 6B and 6C are vertical cross-sectional views along the vertical plane B-B' or C-C' of FIG. 6A, respectively.

FIGS. 7A-7C are various views of the portion of the memory array region of the first exemplary structure after vertically recessing the first dielectric spacer matrix layer selective to the discrete dielectric template structures according to the first embodiment of the present disclosure. FIG. 7A is a top-down view, and FIGS. 7B and 7C are vertical cross-sectional views along the vertical plane B-B' or C-C' of FIG. 7A, respectively.

FIGS. 8A-8C are various views of the portion of the memory array region of the first exemplary structure after formation of a second dielectric spacer matrix layer in recessed volumes of the trenches according to the first embodiment of the present disclosure. FIG. 8A is a top-down view, and FIGS. 8B and 8C are vertical cross-sectional views along the vertical plane B-B' or C-C' of FIG. 8A, respectively.

FIGS. 9A-9D are various views of the portion of the memory array region of the first exemplary structure after formation of an etch mask material layer, at least one pattern-transfer assist layer, and a patterned photoresist layer according to the first embodiment of the present disclosure. FIG. 9A is a top-down view, and FIGS. 9B, 9C, and 9D are vertical cross-sectional views along the vertical plane B-B', C-C', or D-D' of FIG. 9A, respectively.

FIGS. 10A-10D are various views of the portion of the memory array region of the first exemplary structure after formation of source cavities and drain cavities by transfer of a pattern in the photoresist layer through the discrete dielectric template structures selective to the second dielectric spacer matrix layer according to the first embodiment of the present disclosure. FIG. 10A is a top-down view, and FIGS. 10B, 10, and 10D are vertical cross-sectional views along the vertical plane B-B', C-C', or D-D' of FIG. 10A, respectively.

FIGS. 11A-11D are various views of the portion of the memory array region of the first exemplary structure after deposition of at least one metallic material in the source cavities and the drain cavities according to the first embodiment of the present disclosure. FIG. 11A is a top-down view, and FIGS. 11B, 11C, and 11D are vertical cross-sectional views along the vertical plane B-B', C-C', or D-D' of FIG. 11A, respectively.

FIGS. 12A-12E are various views of the portion of the memory array region of the first exemplary structure after formation of source electrodes and drain electrodes according to the first embodiment of the present disclosure. FIG. 12A is a top-down view, and FIGS. 12B, 12C, 12D, and 12E are vertical cross-sectional views along the vertical plane B-B', C-C', D-D', or E-E' of FIG. 12A, respectively.

FIGS. 13A-13E are various views of the portion of the memory array region of the first exemplary structure after formation of at least one first connection-level dielectric material layer and first connection-level metal interconnect structures according to the first embodiment of the present disclosure. FIG. 13A is a top-down view, and FIGS. 13B, 13C, 13D, and 13E are vertical cross-sectional views along the vertical plane B-B', C-C', D-D', or E-E' of FIG. 13A, respectively.

FIGS. 14A-14E are various views of the portion of the memory array region of the first exemplary structure after formation of at least one second connection-level dielectric material layer and second connection-level metal interconnect structures according to the first embodiment of the present disclosure. FIG. 14A is a top-down view, and FIGS. 14B, 14C, 14D, and 14E are vertical cross-sectional views along the vertical plane B-B', C-C', D-D', or E-E' of FIG. 14A, respectively.

FIGS. 15A-15E are various views of the portion of the memory array region of the first exemplary structure after formation of a two-dimensional array of capacitor structures according to the first embodiment of the present disclosure. FIG. 15A is a horizonal cross-sectional view along the horizontal plane A-A' shown in FIGS. 15B-15E, and FIGS. 15B, 15C, 15D, and 15E are vertical cross-sectional views along the vertical plane B-B', C-C', D-D', or E-E' of FIG. 15A, respectively.

FIGS. 16A-16E are various views of the portion of the memory array region of a first alternative configuration of the first exemplary structure after formation of a two-dimensional array of resistive memory elements according to the first embodiment of the present disclosure. FIG. 16A is a horizonal cross-sectional view along the horizontal plane A-A' shown in FIGS. 16B-16E, and FIGS. 16B, 16C, 16D, and 16E are vertical cross-sectional views along the vertical plane B-B', C-C', D-D', or E-E' of FIG. 16A, respectively.

FIGS. 18A-18C are various views of the portion of the memory array region of a second alternative configuration of the first exemplary structure after formation of source electrodes and drain electrodes according to the first embodiment of the present disclosure. FIG. 18A is a top-down view, and FIGS. 18B and 18C are vertical cross-sectional views along the vertical plane B-B' or C-C' of FIG. 19A, respectively.

FIGS. 19A-19C are various views of the portion of the memory array region of a third alternative configuration of the first exemplary structure after formation of source electrodes and drain electrodes according to the first embodiment of the present disclosure. FIG. 19A is a top-down view, and FIGS. 19B and 19C are vertical cross-sectional views along the vertical plane B-B' or C-C' of FIG. 19A, respectively.

FIGS. 20A-20C are various views of the portion of the memory array region of a second alternative configuration of the first exemplary structure after formation of source electrodes and drain electrodes according to the first embodiment of the present disclosure. FIG. 20A is a top-down view, and FIGS. 20B and 20C are vertical cross-sectional views along the vertical plane B-B' or C-C' of FIG. 20A, respectively.

FIGS. 21A-21C are various views of the portion of a memory array region of a second exemplary structure after formation of a two-dimensional array of memory structures and connection-level metal interconnect structures embedded within connection-level dielectric material layers according to a second embodiment of the present disclosure. FIG. 21A is a top-down view, and FIGS. 21B and 21C are vertical cross-sectional views along the vertical plane B-B' or C-C' of FIG. 21A, respectively.

FIGS. 22A-22C are various views of a portion of a memory array region of the second exemplary structure after formation of a dielectric template material layer and a hard mask layer according to the second embodiment of the present disclosure. FIG. 22A is a top-down view, and FIGS. 22B and 22C are vertical cross-sectional views along the vertical plane B-B' or C-C' of FIG. 22A, respectively.

FIGS. 23A-23C are various views of the portion of the memory array region of the second exemplary structure after formation of a patterned hard mask layer and discrete dielectric template structures according to the second embodiment of the present disclosure. FIG. 23A is a top-down view, and FIGS. 23B and 23C are vertical cross-sectional views along the vertical plane B-B' or C-C' of FIG. 23A, respectively.

FIGS. 24A-24C are various views of the portion of the memory array region of the second exemplary structure after formation of an etch stop dielectric liner and a first dielectric spacer matrix layer in trenches between the discrete dielectric template structures according to the second embodiment of the present disclosure. FIG. 24A is a top-down view, and FIGS. 24B and 24C are vertical cross-sectional views along the vertical plane B-B' or C-C' of FIG. 24A, respectively.

FIGS. 25A-25C are various views of the portion of the memory array region of the second exemplary structure after vertically recessing the first dielectric spacer matrix layer selective to the discrete dielectric template structures according to the second embodiment of the present disclosure. FIG. 25A is a top-down view, and FIGS. 25B and 25C are vertical cross-sectional views along the vertical plane B-B' or C-C' of FIG. 25A, respectively.

FIGS. 26A-26C are various views of the portion of the memory array region of the second exemplary structure after formation of a second dielectric spacer matrix layer in recessed volumes of the trenches according to the second embodiment of the present disclosure. FIG. 26A is a top-down view, and FIGS. 26B and 26C are vertical cross-sectional views along the vertical plane B-B' or C-C' of FIG. 26A, respectively.

FIGS. 27A-27D are various views of the portion of the memory array region of the second exemplary structure after formation of an etch mask material layer, at least one pattern-transfer assist layer, and a patterned photoresist layer according to the second embodiment of the present disclosure. FIG. 27A is a top-down view, and FIGS. 27B, 27C, and 27D are vertical cross-sectional views along the vertical plane B-B', C-C', or D-D' of FIG. 27A, respectively.

FIGS. 28A-28D are various views of the portion of the memory array region of the second exemplary structure after formation of source cavities and drain cavities by transfer of a pattern in the photoresist layer through the discrete dielectric template structures selective to the second dielectric spacer matrix layer according to the second embodiment of the present disclosure. FIG. 28A is a top-down view, and FIGS. 28B, 28C, and 28D are vertical cross-sectional views along the vertical plane B-B', C-C', or D-D' of FIG. 28A, respectively.

FIG. 29A is a top-down view, and FIGS. 29B, 29C, and 29D are vertical cross-sectional views along the vertical plane B-B', C-C', or D-D' of FIG. 29A, respectively.

FIGS. 30A-30E are various views of the portion of the memory array region of the second exemplary structure after formation of source electrodes and drain electrodes according to the second embodiment of the present disclosure. FIG. 30A is a top-down view, and FIGS. 30B, 30C, 30D, and 30E are vertical cross-sectional views along the vertical plane B-B', C-C', D-D', or E-E' of FIG. 30A, respectively.

FIGS. 31A-31E are various views of the portion of the memory array region of the second exemplary structure after formation of a two-dimensional array of active layers according to the second embodiment of the present disclosure. FIG. 31A is a top-down view, and FIGS. 31B, 31C, 31D, and 31E are vertical cross-sectional views along the vertical plane B-B', C-C', D-D', or E-E' of FIG. 31A, respectively.

FIGS. 32A-32E are various views of the portion of the memory array region of the second exemplary structure after formation of a gate dielectric layer and gate electrodes according to the second embodiment of the present disclosure. FIG. 32A is a top-down view, and FIGS. 32B, 32C, 32D, and 32E are vertical cross-sectional views along the vertical plane B-B', C-C', D-D', or E-E' of FIG. 32A, respectively.

FIGS. 33A-33E are various views of the portion of the memory array region of the second exemplary structure after formation of a gate-level insulating layer according to the second embodiment of the present disclosure. FIG. 33A is a horizontal cross-sectional view along the horizontal plane A-A' of FIGS. 33B, 33C, 33D, and 33E, and FIGS. 33B, 33C, 33D, and 33E are vertical cross-sectional views along the vertical plane B-B', C-C', D-D', or E-E' of FIG. 33A, respectively.

FIGS. 34A-34C are various views of a portion of a memory array region of a third exemplary structure after formation of an in-process gate-level insulating layer and word lines according to a third embodiment of the present disclosure. FIG. 34A is a top-down view, and FIGS. 34B and 34C are vertical cross-sectional views along the vertical plane B-B' or C-C' of FIG. 34A, respectively.

FIG. 3A is a top-down view, and FIGS. 3B and 3C are vertical cross-sectional views along the vertical plane B-B' or C-C' of FIG. 3A, respectively.

FIGS. 36A-36E are various views of the portion of the memory array region of the third exemplary structure after formation of a two-dimensional array of flash memory devices, at least one first connection-level dielectric layer, and first connection-level metal interconnect structures according to the third embodiment of the present disclosure. FIG. 36A is a top-down view, and FIGS. 36B, 36C, 36D, and 36E are vertical cross-sectional views along the vertical plane B-B', C-C', D-D', or E-E' of FIG. 36A, respectively.

FIG. 37A is a top-down view, and FIGS. 37B, 37C, 37D, and 37E are vertical cross-sectional views along the vertical plane B-B', C-C', D-D', or E-E' of FIG. 37A, respectively.

FIGS. 38A-38E are various views of the portion of a memory array region of a fourth exemplary structure after formation of a two-dimensional array of flash memory devices according to the fourth embodiment of the present disclosure. FIG. 38A is a top-down view, and FIGS. 38B, 38C, 38D, and 38E are vertical cross-sectional views along the vertical plane B-B', C-C', D-D', or E-E' of FIG. 38A, respectively.

FIG. 45 is a second flowchart that illustrates the general processing steps for manufacturing the semiconductor devices according to an embodiment of the present disclosure.

DETAILED DESCRIPTION

Figure 1:
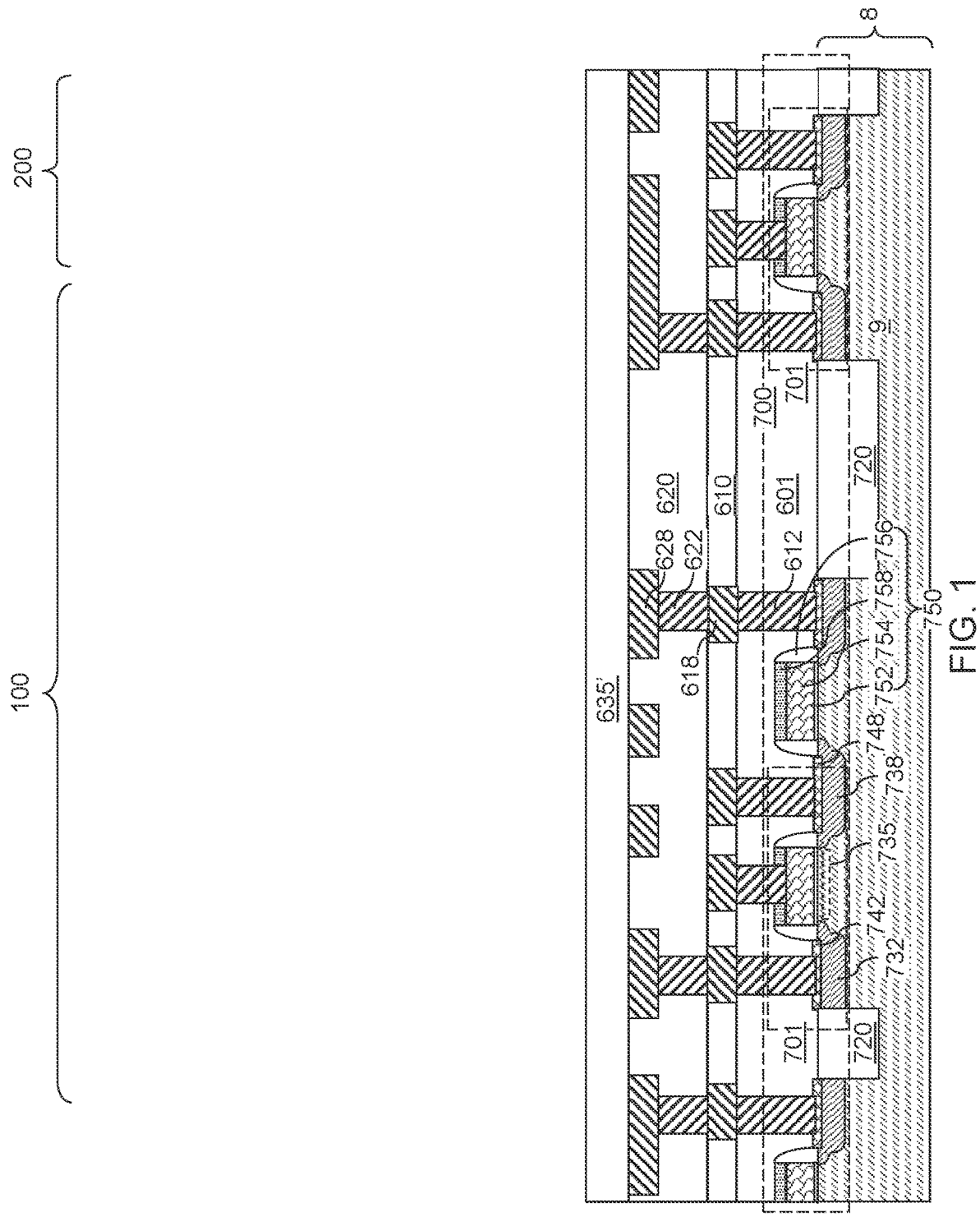
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form an embedded random access memory (RAM) in back-end-of-line (BEOL) structures in advanced nodes. Such an embedded RAM may provide advantages in device density over static random access memory (SRAM). The present disclosure uses transistors (e.g., thin film transistors) that include a semiconducting metal oxide active layer. As such, the embedded RAM of the present disclosure may include a BEOL structure, and does not take up device area at a front-end-of-line (FEOL) level unlike single crystalline silicon-based field effect transistors or fin field effect transistors using single crystalline semiconductor fins. The access transistors of the RAM may be formed as thin film transistors using a self-aligned composite dielectric matrix that includes a first dielectric spacer matrix layer that may provide reduced capacitive coupling between neighboring pair of access transistors through use of a low-k dielectric material, and a second dielectric spacer matrix layer that overlies the first dielectric spacer matrix layer and functions as a self-aligned etch mask for forming source cavities and drain cavities. As such, the source regions and the drain regions are self-aligned to the composite dielectric matrix, and electrical connections among neighboring access transistors may be avoided. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of memory cells may be subsequently formed. The first exemplary structure may further include a peripheral region 200 in which metal wiring for the array of memory devices is provided. Generally, the field effect transistors 701 in the CMOS circuitry 700 may be electrically connected to an electrode of a respective memory cell by a respective set of metal interconnect structures.

Devices (such as field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source electrode 732 or a respective drain electrode 738 that is subsequently electrically connected to a node of a respective memory cell to be subsequently formed.

In one embodiment, the CMOS circuitry 700 may include a programming control circuit configured to control gate voltages of a set of field effect transistors 701 that are used for programming a respective memory cell and to control gate voltages of transistors to be subsequently formed. In this embodiment, the programming control circuit may be configured to provide a first programming pulse that programs a respective dielectric material layer in a selected memory cell into a first polarization state in which electrical polarization in the dielectric material layer points toward a first electrode of the selected memory cell, and to provide a second programming pulse that programs the dielectric material layer in the selected memory cell into a second polarization state in which the electrical polarization in the dielectric material layer points toward a second electrode of the selected memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes, and optionally to source electrodes, of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of transistors and an array of memory cells may be subsequently deposited over the dielectric material layers (601, 610, 620) that have formed therein the metal interconnect structures (612, 618, 622, 628). The set of all dielectric material layer that are formed prior to formation of an array of transistors or an array of memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, transistors (e.g., thin film transistors (TFTs)) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an in-process gate-level insulating layer 635'. The in-process gate-level insulating layer 635' includes a dielectric material such as undoped silicate glass, a doped silicate glass, organosilicate glass, or a porous dielectric material, and may be deposited by chemical vapor deposition. The thickness of the in-process gate-level insulating layer 635' may be in a range from 20 nm to 300 nm, although lesser and greater thicknesses may also be used. Additional insulating layers may be added to, and increase the thickness of, the in-process gate-level insulating layer 635 in subsequent processing steps.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The in-process gate-level insulating layer 635' may be formed over the interconnect-level dielectric layers.

In one embodiment, the substrate 8 may include a single crystalline semiconductor material layer (such as a semiconductor material layer 9), and field effect transistors (such as complementary metal-oxide-semiconductor (CMOS) transistors) may include a respective portion of the single crystalline semiconductor material layer as a respective channel region may be formed on the substrate 8. A memory array including a two-dimensional array of unit cell structures may be subsequently formed over the first exemplary structure illustrated in FIG. 1.

Referring to FIGS. 2A-2C, a photoresist layer (not shown) may be applied over the in-process gate-level insulating layer 635', and may be lithographically patterned to form a line-and-space pattern. Each line pattern in the patterned photoresist layer may be laterally spaced apart along a first horizontal direction hd1, and may laterally extend along a second horizontal direction hd2 that is perpendicular to the first horizontal direction hd1. In one embodiment, the line-and-space pattern in the patterned photoresist layer may be a periodic pattern having a periodicity along the first horizontal direction hd1. An area for forming a unit cell structure is marked with a dotted rectangle marked "UC," and is herein referred to as a unit cell area UC. According to an embodiment of the present disclosure, at least four spaces in the line-and-space pattern laterally extends through each unit cell area UC. In other words, each unit cell area UC includes segments of at least four space patterns.

An anisotropic etch process may be performed to transfer the pattern of the spaces in the photoresist into an upper portion of the in-process gate-level insulating layer 635'. Line trenches, which are herein referred to as word line trenches, may be formed in the spaces from which the material of the in-process gate-level insulating layer 635' is removed by the anisotropic etch process. The word line trenches may laterally extend along the second horizontal direction hd2, and may be laterally spaced from one another along the first horizontal direction hd1. In one embodiment, the word line trenches may comprise straight line trenches having straight sidewalls that laterally extend along the second horizontal direction hd2. The word line trenches may have a periodicity along the first horizontal direction hd1 that is the same as the width of the unit cell area UC along the first horizontal direction hd1. In one embodiment, the word line trenches may have a same width along the first horizontal direction hd1 irrespective of the location. The depth of the word line trenches may be in a range from 10 nm to 300 nm, such as from 30 nm to 100 nm, although lesser and greater thicknesses may also be used. The patterned photoresist layer may be subsequently removed, for example, by ashing.

At least one metallic material may be deposited in the word line trenches. For example, a word-line metallic liner layer including a metallic barrier material and a word-line metallic fill material layer including a metallic fill material may be sequentially deposited in the word line trenches and over the in-process gate-level insulating layer 635'. The word-line metallic liner layer may include a metallic barrier material such as TiN, TaN, WN, TiC, TaC, WC, or a stack thereof, and may be deposited by physical vapor deposition of chemical vapor deposition. Other metallic liner materials are within the contemplated scope of disclosure. The thickness of the word-line metallic liner layer may be in a range from 1 nm to 30 nm, although lesser and greater thicknesses may also be used. The word-line metallic fill material layer may include W, Cu, Al, Co, Ru, Mo, Ta, Ti, alloys thereof, and/or combinations thereof. Other metallic fill materials are within the contemplated scope of disclosure. The thickness of the word-line metallic fill material layer may be selected such that the each of the word line trenches is filled with the combination of the word-line metallic liner layer and the word-line metallic fill material layer.

A planarization process, such as a chemical mechanical polishing (CMP) process, may be performed to remove portions of the word-line metallic liner layer and the word-line metallic fill material layer that overlie the horizontal plane that includes the top surface of the in-process gate-level insulating layer 635'. Each remaining contiguous portion of the word-line metallic liner layer and the word-line metallic fill material layer filling a respective word line trench constitutes a word line 3. Each word line 3 may include a word-line metallic liner 4 and a word-line metallic fill material portion 5. Each word-line metallic liner 4 is a portion of the word-line metallic liner layer that remains after the planarization process. Each word-line metallic fill material portion 5 is a portion of the word-line metallic fill material layer that remains after the planarization process.

Figure 3C:
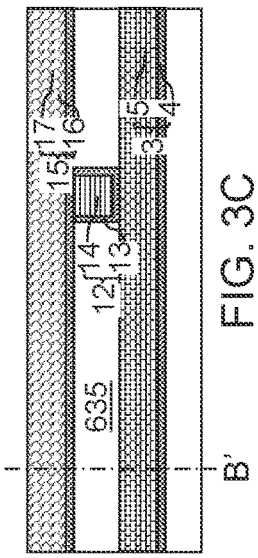
FIGS. 3A-3C are various views of the portion of the memory array region of the first exemplary structure after formation of gate-connection via structures and gate electrodes according to the first embodiment of the present disclosure.
Figure 3A:
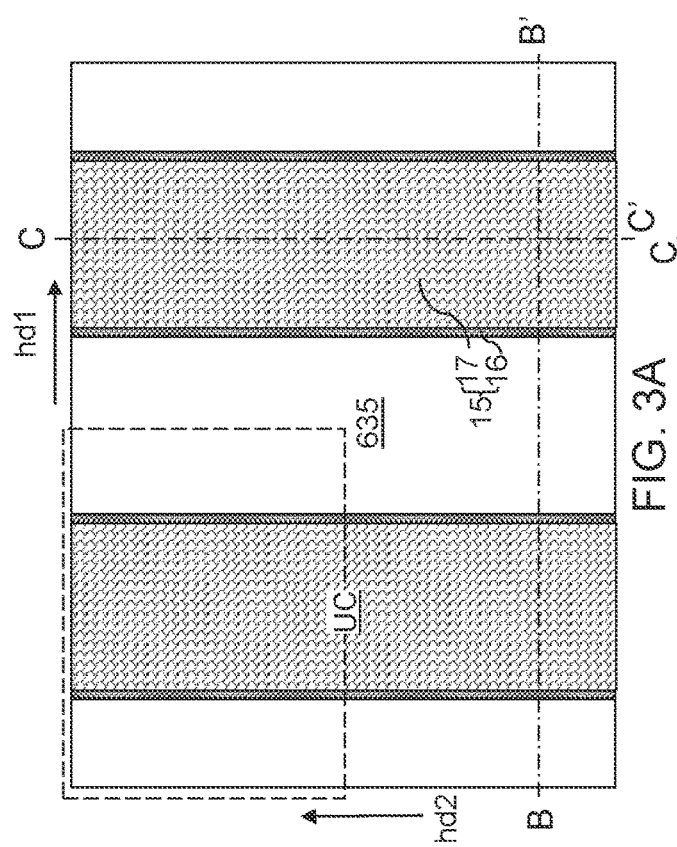
Figure 3B:

Referring to FIGS. 3A-3C, an insulating material layer (which is herein referred to as a gate-via-level insulating layer) may be deposited over the in-process gate-level insulating layer 635', and may be incorporated into the in-process gate-level insulating layer 635'. The thickness of the in-process gate-level insulating layer 635' may increase by the thickness of the added insulating material layer, which may be, for example, in a range from 30 nm to 300 nm, such as from 60 nm to 150 nm, although lesser and greater thicknesses may also be used.

Via cavities may be formed through the in-process gate-level insulating layer 635' such that top surfaces of the word lines 3 may be physically exposed at the bottom of each of the via cavities. At least one metallic material may be deposited in the via cavities. For example, a via metallic liner layer including a metallic barrier material and a via metallic fill material layer including a metallic fill material may be sequentially deposited in the via cavities and over the in-process gate-level insulating layer 635'. The via metallic liner layer may include a metallic barrier material such as TiN, TaN, WN, TiC, TaC, WC, or a stack thereof, and may be deposited by physical vapor deposition of chemical vapor deposition. The thickness of the via metallic liner layer may be in a range from 1 nm to 30 nm, although lesser and greater thicknesses may also be used. The via metallic fill material layer may include W, Cu, Al, Co, Ru, Mo, Ta, Ti, alloys thereof, and/or combinations thereof. The thickness of the via metallic fill material layer may be selected such that the each of the via cavities is filled with the combination of the via metallic liner layer and the via metallic fill material layer.

A planarization process, such as a chemical mechanical polishing (CMP) process, may be performed to remove portions of the via metallic liner layer and the via metallic fill material layer that overlie the horizontal plane including the top surface of the in-process gate-level insulating layer 635'. Each remaining contiguous portion of the via metallic liner layer and the via metallic fill material layer filling a respective via cavity constitutes a gate-connection via structure 12. Each gate-connection via structure 12 may include a via metallic liner 13 and a via metallic fill material portion 14. Each via metallic liner 13 is a portion of the via metallic liner layer that remains after the planarization process. Each via metallic fill material portion 14 is a portion of the via metallic fill material layer that remains after the planarization process.

An additional insulating material layer (which is herein referred to as a gate-electrode-level insulating layer) may be deposited over the in-process gate-level insulating layer 635', and may be incorporated into the in-process gate-level insulating layer 635'. The thickness of the in-process gate-level insulating layer 635' may increase by the thickness of the added insulating material layer, which may be, for example, in a range from 30 nm to 300 nm, such as from 60 nm to 150 nm, although lesser and greater thicknesses may also be used. The in-process gate-level insulating layer 635' becomes a gate-level insulating layer 635, which does not increase in thickness in subsequent processing steps.

Gate cavities (not shown) may be formed through the gate-level insulating layer 635 such that top surfaces of the gate-connection via structures 12 may be physically exposed at the bottom of the gate cavities. A top surface of a gate-connection via structure 12 may be physically exposed at the bottom of each gate cavity.

In one embodiment, each of the gate cavities may have a respective rectangular horizontal cross-sectional shape. At least one metallic material may be deposited in the gate cavities. For example, a gate metallic liner layer including a metallic barrier material and a gate metallic fill material layer including a metallic fill material may be sequentially deposited in the gate cavities and over the gate-level insulating layer 635. The gate metallic liner layer may include a metallic barrier material such as TiN, TaN, WN, TiC, TaC, WC, or a stack thereof, and may be deposited by physical vapor deposition of chemical vapor deposition. The thickness of the gate metallic liner layer may be in a range from 1 nm to 30 nm, although lesser and greater thicknesses may also be used. The gate metallic fill material layer may include W, Cu, Al, Co, Ru, Mo, Ta, Ti, alloys thereof, and/or combinations thereof. The thickness of the gate metallic fill material layer may be selected such that the each of the gate cavities is filled with the combination of the gate metallic liner layer and the gate metallic fill material layer.

A planarization process, such as a chemical mechanical polishing (CMP) process, may be performed to remove portions of the gate metallic liner layer and the gate metallic fill material layer that overlie the horizontal plane including the top surface of the gate-level insulating layer 635. Each remaining contiguous portion of the gate metallic liner layer and the gate metallic fill material layer filling a respective gate cavity constitutes a gate electrode 15. Each gate electrode 15 may include a gate metallic liner 16 and a gate metallic fill material portion 17. Each gate metallic liner 16 is a portion of the gate metallic liner layer that remains after the planarization process. Each gate metallic fill material portion 17 is a portion of the gate metallic fill material layer that remains after the planarization process. An array of gate electrodes 15 may be formed, which may be formed as a one-dimensional periodic array of gate electrodes 15 having a uniform pitch along the first horizontal direction hd1. Alternatively, the array of gate electrodes 15 may be formed as a two-dimensional array of gate electrodes 15 having an areal overlap with a respective pair of a source electrode and a drain electrode to be subsequently formed.

Figure 4C:
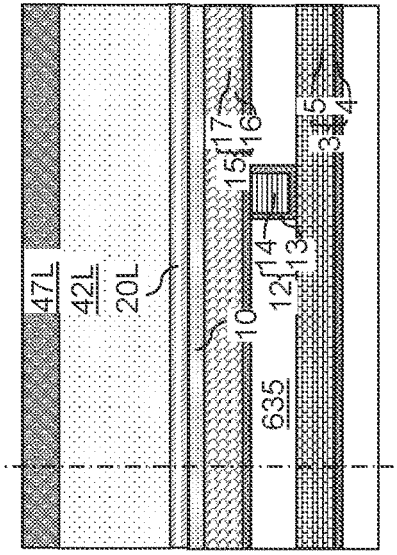
FIGS. 4A-4C are various views of the portion of the memory array region of the first exemplary structure after formation of a gate dielectric layer, a continuous active layer, a dielectric template material layer, and a hard mask layer according to the first embodiment of the present disclosure.
Figure 4A:
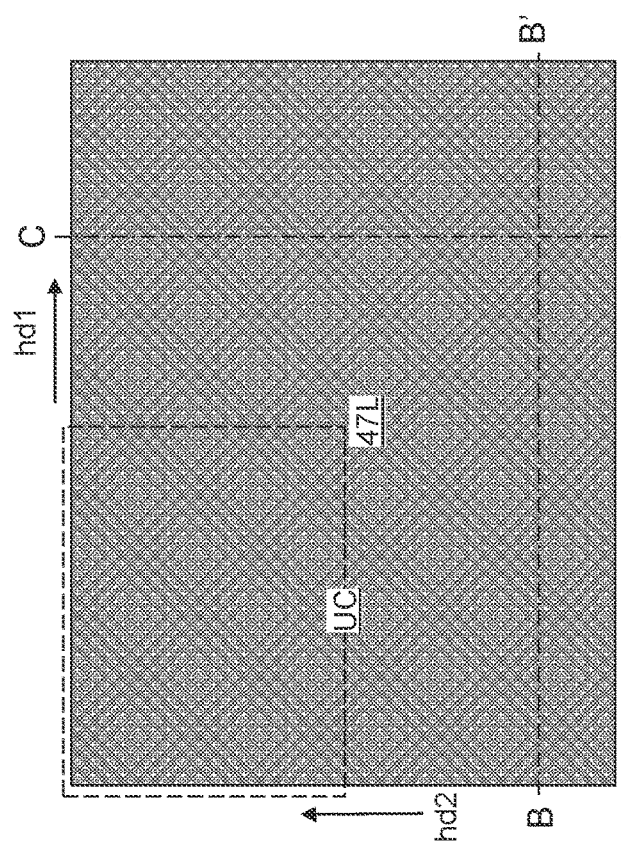
Figure 4B:
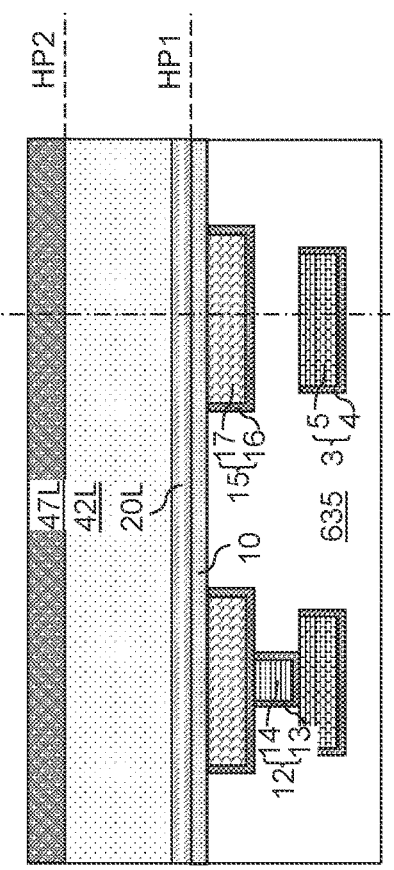
Figure 9D:
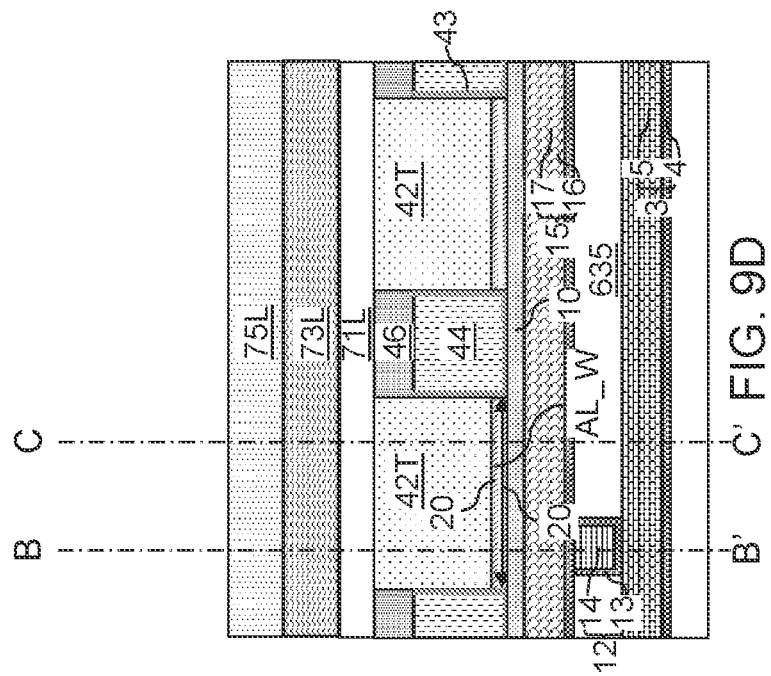
Figure 9C:
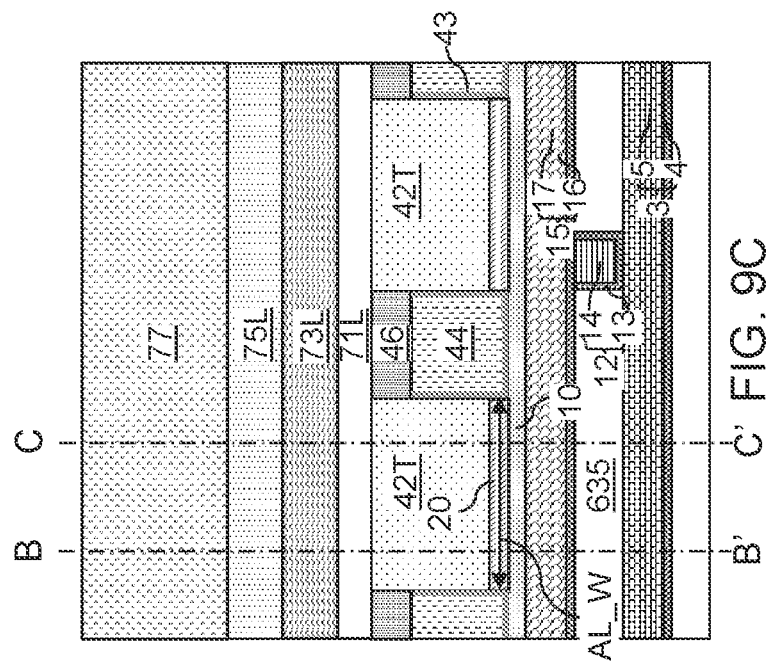
Figures 14B, 14C:
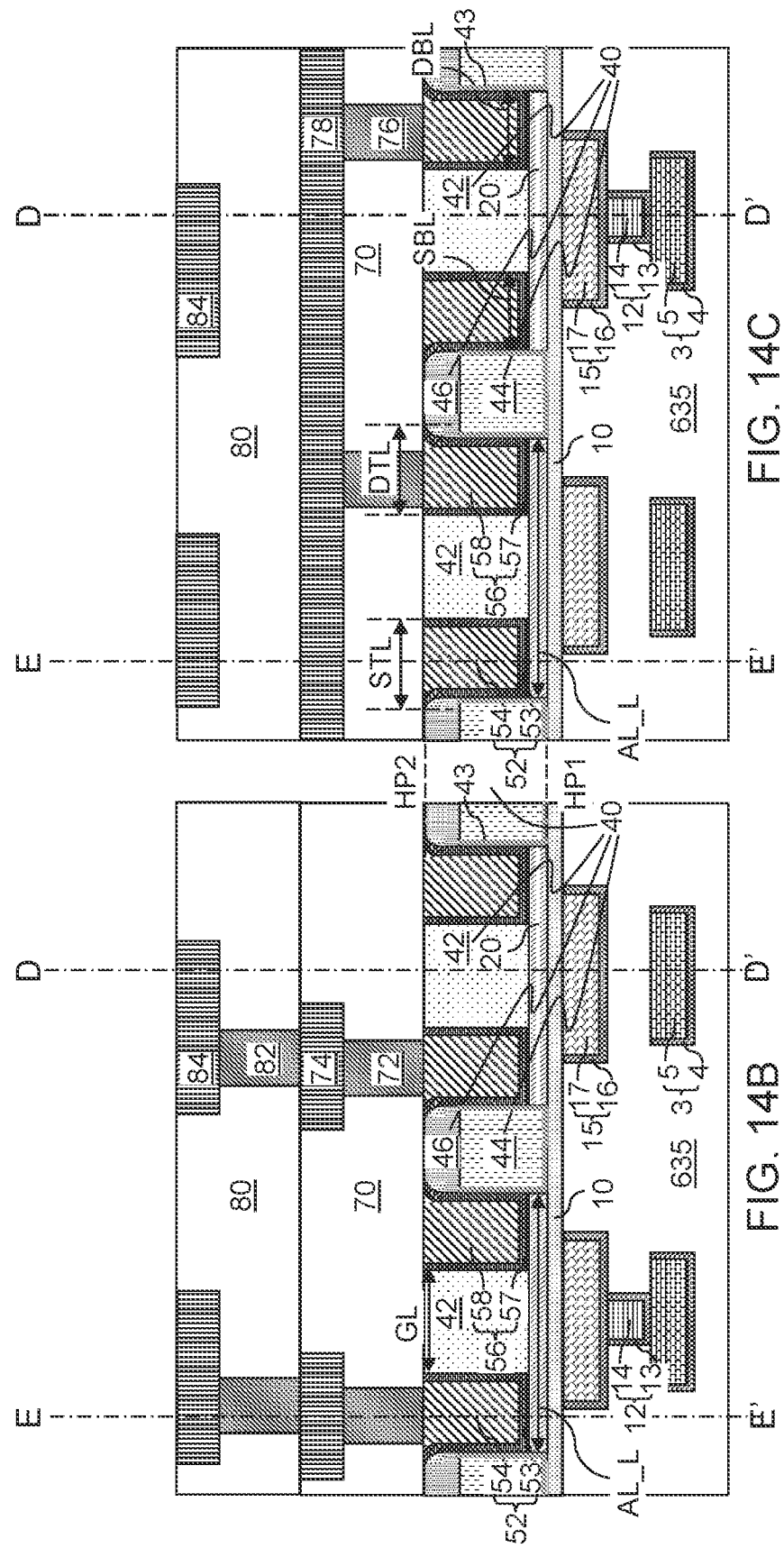
Figure 15E:
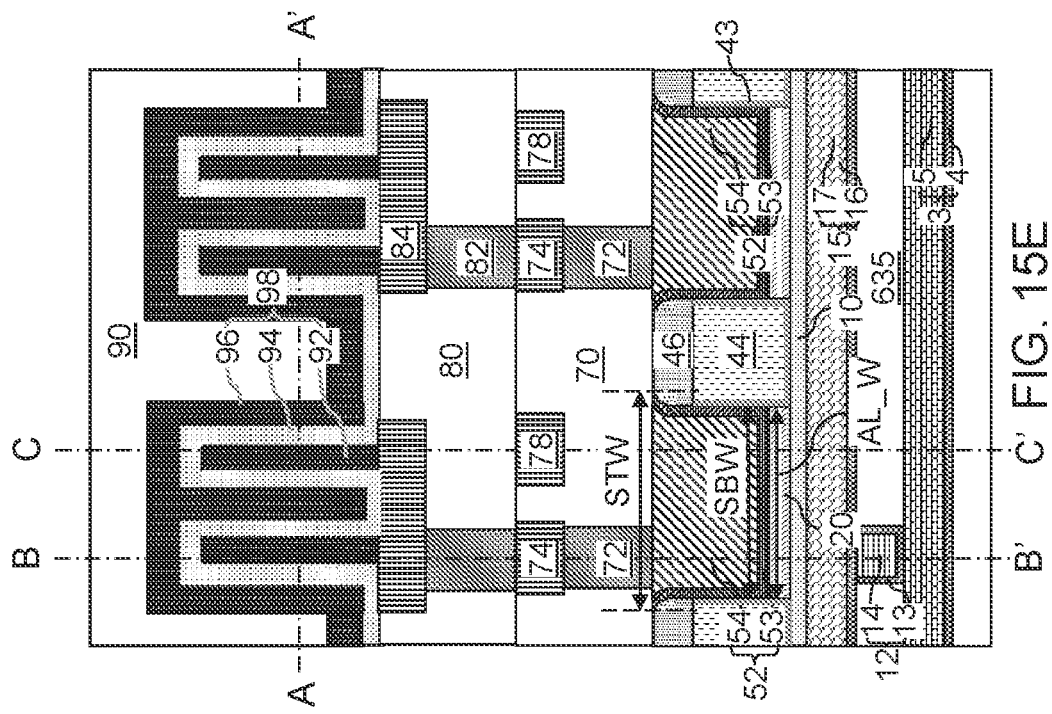
Figure 15D:
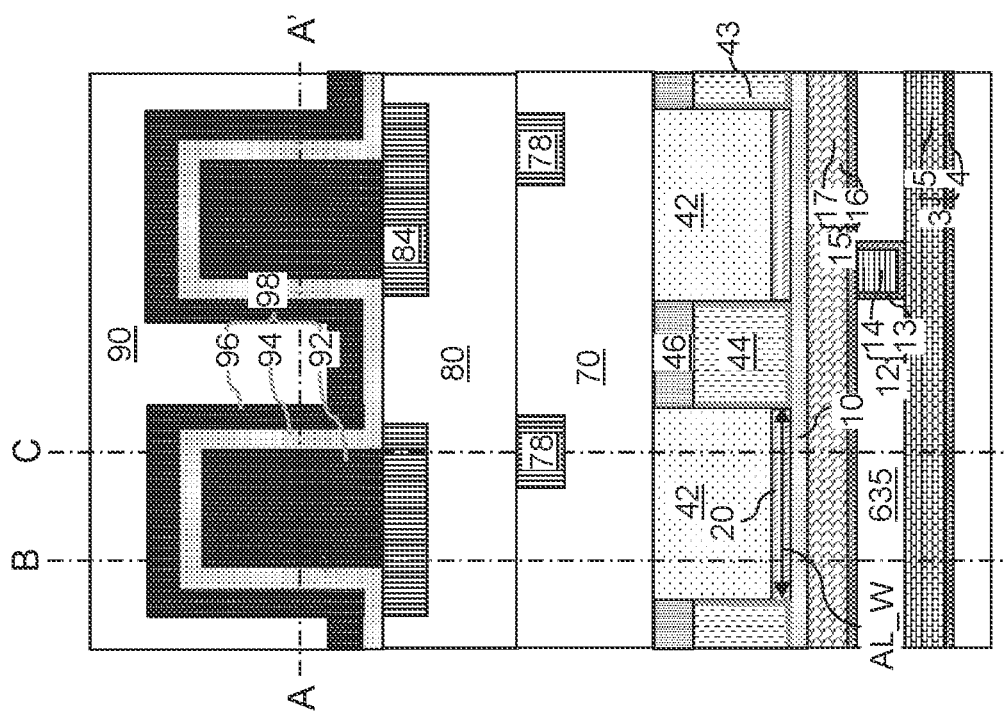
Figure 16A:
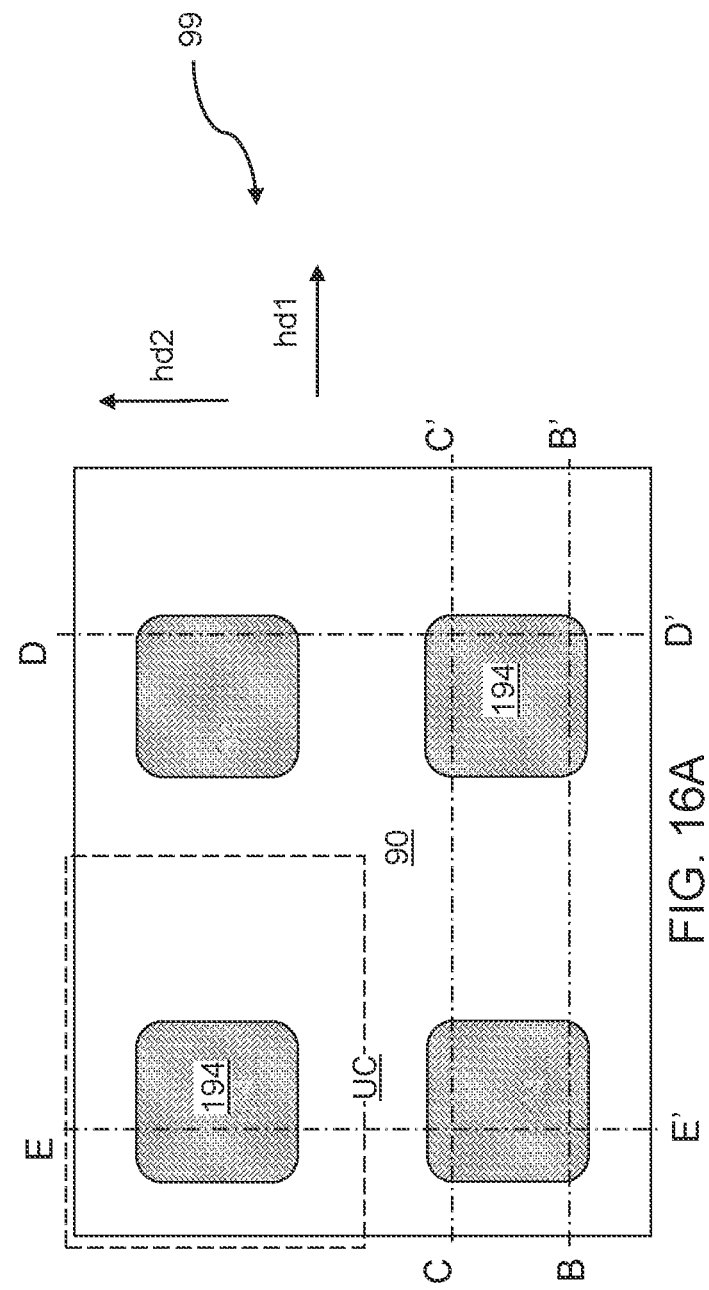

Referring to FIGS. 4A-4C, a gate dielectric layer 10, a continuous active layer 20L, a dielectric template material layer 42L, and a hard mask layer 47L may be sequentially deposited over the gate-level insulating layer 635 and the gate electrodes 15. The gate dielectric layer 10 may be formed over the gate-level insulating layer 635 and the gate electrodes 15 by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.) having a dielectric constant greater than the dielectric constant of silicon nitride (which is 7.9) and commonly referred to as a high-k dielectric material, or a stack thereof. Other suitable dielectric materials are within the contemplated scope of disclosure. The gate dielectric material may be deposited by atomic layer deposition or chemical vapor deposition. The thickness of the gate dielectric layer 10 may be in a range from 1 nm to 50 nm, such as from 3 nm to 30 nm, although lesser and greater thicknesses may also be used.

The continuous active layer 20L including a semiconducting material may be deposited over the gate dielectric layer 10. The continuous active layer 20L may be an un-patterned (i.e., blanket) semiconductor material layer. In one embodiment, the continuous active layer 20L may comprise a compound semiconductor material. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous active layer 20L include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Generally, the continuous active layer 20L may comprise oxides of at least one metal, such as at least two metals and/or at least three metals, selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and any combination of the above. Some of the metal elements may be present at a dopant concentration, e.g., at an atomic percentage less than 1.0%. Other suitable semiconducting materials are within the contemplated scope of disclosure. In one embodiment, the semiconducting material of the continuous active layer 20L may include indium gallium zinc oxide.

The continuous active layer 20L may include a polycrystalline semiconducting material, or an amorphous semiconducting material that may be subsequently annealed into a polycrystalline semiconducting material having a greater average grain size. The continuous active layer 20L may be deposited by physical vapor deposition although other suitable deposition processes may be used. The thickness of the continuous active layer 20L may be in a range from 1 nm to 50 nm, such as from 2 nm to 30 nm and/or from 4 nm to 15 nm, although lesser and greater thicknesses may also be used.

The dielectric template material layer 42L includes a dielectric material that may provide electrical isolation between source electrodes and drain electrodes to be subsequently formed. The dielectric template material layer 42L includes a material that may function as a planarization stopping layer in subsequent planarization processes to be subsequently performed. In one embodiment, the dielectric template material layer 42L may comprise, and/or may consist essentially of, undoped silicate glass or a doped silicate glass. The thickness of the dielectric template material layer 42L may be in a range from 2 nm to 1,000 nm, such as from 5 nm to 200 nm, although lesser and greater thicknesses may also be used.

The hard mask layer 47L may include a hard mask material that may be used as an etch mask during a subsequent anisotropic etch process to be used to etch unmasked portions of the dielectric template material layer 42L. In one embodiment, the hard mask layer 47L may comprise, and/or may consist essentially of, silicon nitride, silicon carbide nitride, amorphous carbon, or a dielectric metal oxide. The thickness of the hard mask layer 47L may be in a range from 2 nm to 50 nm, although lesser and greater thicknesses may also be used.

Referring to FIGS. 5A-5C, a photoresist layer (not shown) may be applied over the hard mask layer 47L, and may be lithographically patterned into a two-dimensional array of patterned photoresist material portions. In one embodiment, the two-dimensional array of patterned photoresist material portions may be a periodic two-dimensional array of patterned photoresists material portions having a first periodicity along the first horizontal direction hd1 and having a second periodicity along the second horizontal direction hd2. In one embodiment, the first periodicity may be in a range from 10 nm to 500 nm, and the second periodicity may be in a range from 5 nm to 500 nm, although lesser and greater dimensions may also be used for the first periodicity and for the second periodicity. In one embodiment, each patterned photoresist material portion may have a rectangular horizontal cross-sectional shape. In one embodiment, the gap between neighboring pairs of the patterned photoresist material portions may be in a range from 1 nm to 40 nm, such as from 2 nm to 20 nm, and/or from 3 nm to 10 nm, although lesser and greater dimensions may also be used for each gap. In one embodiment, one rectangular patterned photoresist material portion may be formed in each unit to cell area UC.

An anisotropic etch process may be performed to transfer the pattern in the patterned photoresist material portions through the hard mask layer 47L, the dielectric template material layer 42L, and the continuous active layer 20L. The pattern in the patterned photoresists material portions may be replicated in the patterned portions of the hard mask layer 47L, in the patterned portions of the dielectric template material layer 42L, and in the patterned portions of the continuous active layer 20L. The patterned portions of the hard mask layer 47L are collectively referred to as a patterned hard mask layer 47. The patterned portions of the dielectric template material layer 42L form a two-dimensional array of discrete dielectric template structures 42T. The patterned portions of the continuous active layer 20L form a two-dimensional array of active layers 20.

In one embodiment, sidewalls of the patterned hard mask layer 47 may be vertical or substantially vertical. In one embodiment, sidewalls of the discrete dielectric template structures 42T may be vertical, or substantially vertical. In one embodiment, sidewalls of the active layers 20 may be vertical, or substantially vertical. The patterned hard mask layer 47 may be used as an etch mask structure at least during a terminal portion of the anisotropic etch process, and may improve the vertical profile of the sidewalls of the discrete dielectric template structures 42T, and a vertical profile of the sidewalls of the active layers 20. In other words, sidewalls of the discrete dielectric template structures 42T and the sidewalls of the active layers 20 may become more vertical through use of the patterned hard mask layer 47. The patterned photoresists material portions may be consumed in during the anisotropic etch process, or may be removed after the anisotropic etch process, for example, by ashing.

A periodic two-dimensional array of layer stacks of an active layer 20, a discrete dielectric template structure 42T, and a portion of the patterned hard mask layer 47 (i.e., a hard mask portion) may be formed over the gate dielectric layer 10. Sidewalls of an active layer 20, a discrete dielectric template structure 42T, and a hard mask portion within each layer stack may be vertically coincident, i.e., may overlie or underlie one another and located within a respective vertical plane. Generally, the dielectric template material layer 42L and the continuous active layer 20L may be patterned into a stack of the two-dimensional array of discrete dielectric template structures 42T and a two-dimensional array of active layers 20 having a same horizontal cross-sectional shape and having the same two-dimensional periodicity. In embodiments in which each active layer 20 as a rectangular horizontal cross-sectional shape including a pair of lengthwise edges extending along the first horizontal direction hd1 and a pair of widthwise edges extending along the second horizontal direction hd2, the length of the lengthwise edges is herein referred to as an active layer length AL_L, and the length of the widthwise edges is herein referred to as an active layer width AL_W. The active layer length AL_L may be in a range from 8 nm to 480 nm, and the active layer width AL_W may be in a range from 3 nm to 480 nm, although lesser and greater dimensions may also be used for the active layer length AL_L and for the active layer width AL_W.

The discrete dielectric template structures 42T within the two-dimensional array of discrete dielectric template structures 42T may be spaced from one another by trenches 41. The trenches 41 include first trenches laterally extending along the first horizontal direction hd1 and second trenches laterally extending along the second horizontal direction hd2. The width of each trench 41 may be in a range from 1 nm to 20 nm, although lesser and greater widths may also be used. Bottom surfaces of the two-dimensional array of active layers 20 may be formed within a first horizontal plane HP1 that includes a top surface of the gate dielectric layer 10. Top surfaces of the two-dimensional array of discrete dielectric template structures 42T may be formed within a second horizontal plane HP2.

Referring to FIGS. 6A-6C, an etch stop dielectric liner 43 may be optionally formed on all sidewalls of the active layers 20 and the discrete dielectric template structures 42T and on physically exposed to portions of the gate dielectric layer 10. In embodiments in which the patterned hard mask layer 47 is present, the etch stop dielectric liner 43 may be formed on surfaces of the patterned hard mask layer 47. Alternatively, the patterned hard mask layer 47 may be removed selective to materials of the active layers 20 and the discrete dielectric template structures 42T prior to formation of the etch stop dielectric liner 43. In this embodiment, the etch stop dielectric liner 43 may be formed on the top surfaces of the discrete dielectric template structures 42T. The etch stop dielectric liner 43 comprises a non-porous dielectric material that may function as an etch stop layer during a subsequent anisotropic etch process that removes unmasked portions of the discrete dielectric template structures 42T. For example, the etch stop dielectric liner 43 may comprise a dielectric material such as silicon oxide, silicon nitride, silicon oxynitride, silicon carbide nitride, or a dielectric metal oxide having a dielectric constant greater than 7.9, i.e., a high-k dielectric material. The thickness of the etch stop dielectric liner 43 may be in a range from 0.3 nm to 3 nm, such as from 0.6 nm to 1.5 nm, although lesser and greater thicknesses may also be used. The etch stop dielectric liner 43 may be deposited using a conformal deposition process such as on atomic layer deposition process or a chemical vapor deposition process.

A first dielectric spacer matrix layer 44 may be deposited in remaining volumes of the trenches 41 between the discrete dielectric template structures 42T. The first dielectric spacer matrix layer 44 comprises a first dielectric spacer material that is different from the materials of the discrete dielectric template structures 42T and the etch stop dielectric liner 43. In one embodiment, the first dielectric spacer matrix layer 44 comprises a material that may be subsequently recessed selective to the material of the discrete dielectric template structures 42T. For example, in embodiments in which the discrete dielectric template structures 42T comprise undoped silicate glass or a doped silicate glass, the first dielectric spacer matrix layer 44 may comprise a porous or non-porous low-k dielectric material having a dielectric constant less than 3.9. In one embodiment, the first dielectric spacer matrix layer 44 may comprise, and/or may consist essentially of, or as or non-porous organosilicate glass. In another example, the first dielectric spacer matrix layer 44 may comprise, and/or may consist essentially of, a dielectric diffusion barrier material that may effectively block diffusion of oxygen atoms or hydrogen atoms. For example, the first dielectric spacer matrix layer 44 may comprise, and/or may consist essentially of, a dielectric metal oxide material such as a high-k dielectric metal oxide material, silicon nitride, or silicon carbide nitride. Yet alternatively, the first dielectric spacer matrix layer 44 may comprise a silicate glass material. In this embodiment, the material of the first dielectric spacer matrix layer 44 is a selected such that the first dielectric spacer matrix layer 44 may be subsequently recessed selective to the material of the discrete dielectric template structures 42T. In an illustrative example, the discrete dielectric template structures 42T may comprise undoped silicate glass, and the first dielectric spacer matrix layer 44 may comprise a doped silicate glass providing a higher etch rate than undoped silicate glass (such as borosilicate glass). The first dielectric spacer matrix layer 44 may be deposited by a conformal deposition process such as a chemical vapor deposition process or an atomic layer deposition process.

A planarization process may be performed to remove portions of the first dielectric spacer matrix layer 44 and the optional etch stop dielectric liner 43 from above the second horizontal plane HP2, i.e., the horizontal plane including the top surfaces of the discrete dielectric template structures 42T. In embodiments in which the patterned hard mask layer 47 is present, a chemical mechanical polishing process or recess etch process may be performed using the patterned hard mask layer 47 as a polishing stop structure or as an etch stop structure. The recess etch process may be extended, or an additional recess etch process may be performed to vertically recess remaining portions of the first dielectric spacer matrix layer 44 and the optional etch stop dielectric liner 43 from above the second horizontal plane HP2. Subsequently, the patterned hard mask layer 47 may be removed selective to the discrete dielectric template structures 42T, for example, by performing a wet etch process. In embodiments in which the patterned hard mask layer 47 is removed prior to deposition of the optional etch stop dielectric liner 43 and the first dielectric spacer matrix layer 44, the discrete dielectric template structures 42T may be used as a polishing stop structure or as an etch stop structure.

Referring to FIGS. 7A-7C, the first dielectric spacer matrix layer 44 may be vertically recessed selective to the discrete dielectric template structures 42T by performing a selective etch process. The chemistry of the selective etch process may be selected such that the selective etch process removes the material of the first dielectric spacer matrix layer 44 without removing the material of the discrete dielectric template structures 42T, or with minimal removal of the material of the discrete dielectric template structures 42T. The selective etch process may comprise an anisotropic etch process or an isotropic etch process. Alternatively, in embodiments in which a recess etch processes used at the processing steps of FIGS. 6A-6C, the duration of the recess etch process at the processing steps of FIGS. 6A-6C may be extended such that the top surface of the first dielectric spacer matrix layer 44 is vertically recessed below the second horizontal plane HP2. In some embodiments, removal of the patterned hard mask layer 47 may be performed after the top surface of the first dielectric spacer matrix layer 44 is a recessed below the second horizontal plane HP2.

A recess region 45 may be formed between the recessed horizontal surface of the first dielectric spacer matrix layer 44 and the second horizontal plane HP2 within volumes of upper portions of the trenches 41 as formed at the processing steps of FIGS. 5A-5C. The depth of the recess region 45 may be in a range from 10% to 90%, such as from 20% to 80%, and/or from 30% to 70%, of the height (i.e., the thickness) of the discrete dielectric template structures 42T. For example, the depth of the recess region 45 may be in a range from 1 nm to 900 nm, such as from 10 nm to 200 nm, and/or from 5 nm to 50 nm, although lesser and greater depths may also be used. In one embodiment, portions of the etch stop dielectric liner 43 that protrude above the recessed top surface of the first dielectric spacer matrix layer 44 may be removed by performing a and isotropic etch process. Generally, lower portions of the trenches 41 may be filled with the optional etch stop dielectric liner 43 and the first dielectric spacer matrix layer 44. The recess region 45 may be present in upper portions of the trenches 41.

Referring to FIGS. 8A-8C, a second dielectric spacer matrix layer 46 comprising a second dielectric spacer material may be deposited in the recess region 45, which includes recessed volumes of the trenches 41. The second dielectric spacer material is different from the materials of the discrete dielectric template structures 42T and the first dielectric spacer matrix layer 44. The second dielectric spacer material may be the same as, or may be different from, the material of the etch stop dielectric liner 43. In one embodiment, the second dielectric spacer matrix layer 46 comprises a material that may function as an etch mask material during a subsequent anisotropic etch process that etches the material of the discrete dielectric template structures 42T. For example, in embodiments in which the discrete dielectric template structures 42T comprise undoped silicate glass or a doped silicate glass, the second dielectric spacer matrix layer 46 may comprise silicon nitride, silicon carbide nitride, silicon oxynitride, a dielectric metal oxide having a dielectric constant greater than 7.9, i.e., a high-k dielectric metal oxide material. Alternatively, the second dielectric spacer matrix layer 46 may comprise a nitrogen-doped low-k dielectric material such as nitrogen-doped organosilicate glass. Yet alternatively, the first dielectric spacer matrix layer 44 may comprise a doped silicate glass material such as borosilicate glass or fluorosilicate glass, and the second dielectric spacer matrix layer 46 may comprise undoped silicate glass that may function as an etch mask material for the doped silicate glass material during a subsequent anisotropic etch process. The second dielectric spacer matrix layer 46 may be deposited by a conformal deposition process such as a chemical vapor deposition process or an atomic layer deposition process.

A planarization process may be performed to remove portions of the second dielectric spacer matrix layer 46 from above the second horizontal plane HP2, i.e., the horizontal plane including the top surfaces of the discrete dielectric template structures 42T. A chemical mechanical polishing process or recess etch process may be performed to remove the portions of the second dielectric spacer matrix layer 46 from above the second horizontal plane HP2. In embodiments in which overpolishing or overetching is used during the planarization process, the second horizontal plane HP2 may vertically shifted downward by the overpolish distance or the overetch distance, which may be in a range from 0 nm to 50 nm, such as from 0 nm to 5 nm, and/or from 0 nm to 1 nm. The planarized top surface of the second dielectric spacer matrix layer 46 may be located within a same horizontal plane as the horizontal plane including the top surfaces of the discrete dielectric template structures 42T, i.e., the second horizontal plane HP2.

The combination of the optional etch stop dielectric liner 43, the first dielectric spacer matrix layer 44, and the second dielectric spacer matrix layer 46 is herein referred to as a composite dielectric matrix (43, 44, 46), which laterally surrounds the two-dimensional array of discrete dielectric template structures 42T. In other words, each discrete dielectric template structure 42T within the two-dimensional array of discrete dielectric template structures 42T is a laterally surrounded by the composite dielectric matrix (43, 44, 46). In embodiments in which the composite dielectric matrix (43, 44, 46) comprises the etch stop dielectric liner 43, the etch stop dielectric liner 43 may contact the entire of a bottom surface and sidewalls of the first dielectric spacer matrix layer 44, and the lower portions of each of the discrete dielectric template structures 42T. The etch stop dielectric liner 43 may contact segments of the bottom surface of the second dielectric spacer matrix layer 46.

In one embodiment, the bottom surface of the composite dielectric matrix (43, 44, 46) and bottom surfaces of the active layers 20 within the two-dimensional array of active layers 20 may be located within a same horizontal plane, i.e., the first horizontal plane HP1. In one embodiment, the bottom surface of each active layer 20 within the two-dimensional array of active layers 20 may be located within a horizontal plane including the bottom surface of the composite dielectric matrix (43, 44, 46), i.e., within the first horizontal plane HP1.

Referring to FIGS. 9A-9D, an etch mask material layer 71L, at least one optional pattern-transfer assist layer (73L, 75L), and a photoresist layer 77 may be sequentially formed over the two-dimensional array of discrete dielectric template structures 42T and the composite dielectric matrix (43, 44, 46).

The etch mask material layer 71L may include a material that may function as an etch mask material during an anisotropic etch step that etches the material of the first dielectric spacer matrix layer 44. For example, in embodiments in which the first dielectric spacer matrix layer 44 comprises a silicate glass material, the etch mask material layer 71L may comprise silicon nitride, silicon carbide nitride, silicon oxynitride, or a dielectric metal oxide material having a dielectric constant greater than 7.9. In embodiments in which the first dielectric spacer matrix layer 44 comprises non-porous organosilicate glass, the etch mask material layer 71L may comprise silicon oxide. The etch stop material layer 71L may be formed by a conformal or non-conformal deposition process. The thickness of the etch stop material layer 71L may be in a range from 2 nm to 100 nm, such as from 5 nm to 50 nm, and/or from 10 nm to 30 nm, although lesser and greater thicknesses may also be used.

The at least one optional pattern-transfer assist layer (73L, 75L) may comprise at least one material that may be advantageously used to improve the fidelity of image transfer from the photoresist layer 77 on to unmasked portions of the discrete dielectric template structures 42T. In an illustrative example, the at least one optional pattern-transfer assist layer (73L, 75L) may comprise a first pattern-transfer assist layer 73L and a second pattern-transfer assist layer 75L. The first pattern-transfer assist layer 73L may comprise a bottom anti reflection coating (BARC) layer as known in the art. The second pattern-transfer assists layer 75L may comprise a spin-on oxide (SOG) material having a thickness in a range from 10 nm to 35 nm. Generally speaking, any lithographic material stack that may improve image formation in the photoresist layer 77 and/or may improve the fidelity of pattern transfer into underlying material layers may be used for the at least one optional pattern-transfer assist layer (73L, 75L).

The photoresist layer 77 may be formed over the etch stop material layer 71L and the at least one optional pattern-transfer assist layer (73L, 75L). According to an aspect of the present disclosure, a two-dimensional array of openings may be formed in the photoresist layer 77 by lithographic exposure and development. The pattern of the openings in the photoresist layer 77 may be selected such that each opening in the two-dimensional array of openings in the photoresist layer 77 has a respective area that continuously extends over a neighboring pair of dielectric template structures 42T selected from the discrete dielectric template structures 42T that are laterally spaced apart along the first horizontal direction hd1, which is the horizontal direction along which a first subset of the trenches 41 (i.e., the first trenches) are laterally spaced apart, and over a portion of the second dielectric spacer matrix layer 46. In other words, each opening in the photoresist layer 77 continuously extends over a portion of a first discrete dielectric template structure 42T, a portion of a second discrete dielectric template structure 42T that is laterally spaced apart from the portion of the first discrete dielectric template structure 42T along the first horizontal direction hd1, and the portion of the composite dielectric matrix (43, 44, 46) that is located between the portion of the first discrete dielectric template structure 42T and the portion of the second discrete dielectric template structure 42T.

In one embodiment, the photoresist layer 77 may be patterned with a line and space pattern in which the openings in the photoresist layer 77 have straight edges that laterally extend along a second horizontal direction hd2 that is perpendicular to the first horizontal direction hd1. In one embodiment, each opening in the photoresist layer 77 may have a first straight edge that extends over a first column of the discrete dielectric template structures 42T that are arranged along the second horizontal direction hd2 and a second straight edge that extends over a second column of the discrete dielectric template structures 42T. The second column may be laterally offset from the first column by less than a pitch of the two-dimensional array of the discrete dielectric template structures 42T along the first horizontal direction hd1. A portion of the composite dielectric matrix (43, 44, 46) that fills a second trench, i.e., a trench 41 that laterally extends along the second horizontal direction hd2, underlies each opening in the photoresist layer 77.

Referring to FIGS. 10A-10D, the pattern in the photoresist layer 77 may be transferred through at least one optional pattern-transfer assist layer (73L, 75L) and the etch mask material layer 71L and into a portions of the discrete dielectric template structures 42T selective to the material of the second dielectric spacer matrix layer 46 by performing an anisotropic etch process. In one embodiment, the anisotropic etch process may comprise a first anisotropic etch step that transfers the pattern in the photoresist layer 77 through at least one optional pattern-transfer assist layer (73L, 75L) and the etch mask material layer 71L. The etch mask material layer 71L may be patterned into etch mask material portions 71 that replicates the pattern of the openings in the photoresist layer 77. In one embodiment, the etch mask material portions 71 may be formed as a one-dimensional periodic array of etch mask material portions 71 having a line-and-space pattern with the periodicity along the first horizontal direction hd1 that is the same as the periodicity of the gate electrodes 15 and the periodicity of the active layers 20 along the first horizontal direction hd1. In one embodiment, each etch mask material portion 71 may have a pair of straight lengthwise edges that laterally extend along the second horizontal direction hd2 and may be straddled by a column of discrete dielectric template structures 42T and an underlying column of active layers 20 that are arranged along the second horizontal direction hd2. In one embodiment, each etch mask material portion 71 may have a uniform width throughout, and may be located at a center portion of each discrete dielectric template structure 42T within a respective column of discrete dielectric template structures 42T.

The anisotropic etch process may include a second anisotropic etch step that etches the material of the discrete dielectric template structures 42T selective to the material of the second dielectric spacer matrix layer 46. As used herein, an etch process that etches a first material is referred to as a selective etch to a second material if the etch rate of the second material during the etch process is less than 1/3 of the etch rate of the first material during the etch process. Thus, the etch rate of the material of the second dielectric spacer matrix layer 46 during the second anisotropic etch step is less than 1/3, and preferably less than 1/10 and/or less than 1/30, of the etch rate of the material of the discrete dielectric template structures 42T during the second anisotropic etch step. The second anisotropic etch step anisotropically etches portions of the discrete dielectric template structures 42T that are not masked by the patterned etch mask material layer, i.e., the etch mask material portions 71. Put another way, the photoresist layer 77 and second dielectric spacer matrix layer 46 may mask any underlying materials from the anisotropic etch process. In one embodiment, the chemistry of the second anisotropic etch step may be selective to the material of the etch stop dielectric liner 43. In other words, in embodiments in which the etch stop dielectric liner 43 is present, the etch stop dielectric liner 43 may be used as an etch stop structure to protect the first dielectric spacer matrix layer 44 from collateral etching during the second anisotropic etch step.

Generally, portions of the discrete dielectric template structures 42T that are located within areas of the openings in the photoresist layer 77 may be anisotropically etched selective to the material of the second dielectric spacer matrix layer 46 during the second anisotropic etch step. Source cavities 51 and drain cavities 59 may be formed in the volumes that may be created as portions of discrete dielectric template structures 42T are removed by the etch process. The pattern of the openings in the photoresist layer 77 may be transferred through the discrete dielectric template structures 42T selective to the second dielectric spacer matrix layer 46. Thus, the pattern of the source cavities 51 and the drain cavities 59 may be a composite pattern that is a conjunction of the pattern of the openings in the photoresists layer 77 and the pattern of the discrete dielectric template structures 42T. In other words, the pattern of the source cavities 51 and the drain cavities 59 include areas that are located within a respective one of the openings in the photoresists layer 77 and within a respective one of the discrete dielectric template structures 42T. A top surface of an active layer 20 may be physically exposed at the bottom of each source cavity 51 as well as at the bottom of each drain cavity 59.

A pair of a source cavity 51 and a drain cavity 59 may be formed within a volume of each of the discrete dielectric template structures 42T. A volume of the source cavity 51 and a volume of the drain cavity 59 may be the same, substantially the same, or may be in a range from 50% to 200%, and/or from 75% to 133%, and/or from 90% to 110%, of each other for each pair of the source cavity 51 and the drain cavity 59 formed by removal of portions of a same discrete dielectric template structure 42T. Each remaining portion of the discrete dielectric template structures 42T after the second anisotropic etch step include an inter-electrode dielectric spacer 42 that separates the source cavity 51 and the drain cavity 59. Each inter-electrode dielectric spacer 42 is located between, and physically exposed to, a respective one of the source cavities 51 and a respective one of the drain cavities 59. A source electrode 52 may be formed in each source cavity 51 in a subsequent processing step, and a drain electrode 56 may be formed in each drain cavity 59 in a subsequent processing step. Upon formation of the source electrodes 52 and the drain electrodes 56, each inter-electrode dielectric spacer 42 may be positioned between a source electrode 52 and the drain electrode 56.

According to an aspect of the present disclosure, an etch mask material portion 71 overlies a column of inter-electrode dielectric spacers 42 that are arranged along the second horizontal direction hd2. The etch mask material portion 71 protects physically exposed sidewall surfaces of the column of inter-electrode dielectric spacers 42 throughout the second anisotropic etch step from corner erosion. Thus, the entirety of all physically exposed sidewalls of the inter-electrode dielectric spacers 42 may be located within vertical planes that are vertically coincident with the lengthwise sidewalls of the etch mask material portions 71 that laterally extend along the second horizontal direction hd2.

In contrast, top corner portions of the second dielectric spacer matrix layer 46 that are adjacent to the source cavities 51 or the drain cavities 59 may be subjected to collateral etching, albeit at a lower etch rate, during the second anisotropic etch step. Thus, corner rounding may occur at top corner portions of the second dielectric spacer matrix layer 46 that are adjacent to the source cavities 51 or the drain cavities 59 during the second anisotropic etch step. In various embodiments, each source cavity 51 and each drain cavity 59 may comprise at least one contoured sidewall that is adjoined to a top surface of the second dielectric spacer matrix layer 46, such as three contoured sidewalls that are adjoined to a top surface of the second dielectric spacer matrix layer 46. Each contoured sidewall may comprise a tapered convex surface segment of the second dielectric spacer matrix layer 46 that is adjoined to a vertically-extending surface segment of the second dielectric spacer matrix layer 46. The vertically-extending surface segment of the second dielectric spacer matrix layer 46 may be adjoined to a vertical sidewall of the etch stop dielectric liner 43, or, in embodiments in which an etch stop dielectric liner is not present, to a vertical sidewall of the first dielectric spacer matrix layer 44.

Referring to FIGS. 11A-11D, at least one metallic material may be deposited in the source cavities 51 and the drain cavities 59 and over the etch mask material portions 71 (i.e., patterned portions of the etch mask material layer 71L), a two-dimensional array of inter-electrode dielectric spacers 42, and the composite dielectric matrix (43, 44, 46). The at least one metallic material may include a metallic liner material and a metallic fill material. For example, a metallic liner layer 53L including a metallic liner material may be deposited, and a metallic fill material layer 54L including a metallic fill material may be subsequently deposited. The metallic liner layer 53L may include a conductive metallic nitride or a conductive metallic carbide such as TiN, TaN, WN, TiC, TaC, and/or WC. Other suitable materials within the contemplated scope of disclosure may also be used. The metallic liner layer 53L may be deposited by a non-conformal deposition process such as a physical vapor deposition process, or may be deposited by a conformal deposition process such as a chemical vapor deposition process. The thickness of the horizontally-extending portions of the metallic liner layer 53L that contacts a top surface of a respective one of the active layers 20 may be in a range from 1 nm to 30 nm, such as from 2 nm to 10 nm, although lesser and greater thicknesses may also be used. The metallic fill material layer 54L may include W, Cu, Al, Co, Ru, Mo, Ta, Ti, alloys thereof, and/or combinations thereof. Other suitable materials within the contemplated scope of disclosure may also be used. The metallic fill material layer 54L may be formed by physical vapor deposition, chemical vapor deposition, electroplating, and/or electroless plating. The thickness of the metallic fill material layer 54L may be selected such that the source cavities 51 and the drain cavities 59 are filled with the combination of the metallic liner layer 53L and the metallic fill material layer 54L.

Referring to FIGS. 12A-12E, excess portions of the at least one metallic material may be removed from above the second horizontal plane HP2, i.e., the horizontal plane including the top surface of the composite dielectric matrix (43, 44, 46) and the two-dimensional array of inter-electrode dielectric spacers 42, by a planarization process. The planarization process may comprise a chemical mechanical polishing (CMP) process and/or a recess etch process. The etch mask material portions 71 may be collaterally removed during the planarization process. Other suitable planarization processes may be used. Each remaining portion of the at least one metallic material filling a source cavity 51 constitutes a source electrode 52. Each remaining portion of the at least one metallic material filling a drain cavity 59 constitutes a drain electrode 56. A source electrode 52 and a drain electrode 56 may be formed in each source cavity 51 and each drain cavity 59, respectively.

In one embodiment, each source electrode 52 may include a source metallic liner 53 that is a remaining portion of the metallic liner layer 53L deposited in the source cavity 51, and a source metallic fill material portion 54 that is a remaining portion of the metallic fill material layer 54L deposited in the source cavity 51. Each drain electrode 56 may include a drain metallic liner 57 that is a remaining portion of the metallic liner layer 53L deposited in the drain cavity 59, and a drain metallic fill material portion 58 that is a remaining portion of the metallic fill material layer 54L deposited in the drain cavity 59. Generally, a source electrode 52 and a drain electrode 56 may be formed on a respective portion of a top surface of each active layer 20. A transistor (e.g., a thin film transistor) may be formed in each unit cell area UC.

In one embodiment, the sidewalls of the inter-electrode dielectric spacers 42 that are perpendicular to the first horizontal direction hd1 extend straight from a top surface of a respective inter-electrode dielectric spacer 42 to a bottom surface of the respective inter-electrode dielectric spacer 42. As such, the entirety of each interface between the inter-electrode dielectric spacers 42 and the source electrodes 52 is straight and vertical (i.e., located within a two-dimensional Euclidean plane), and the entirety of each interface between the inter-electrode dielectric spacers 42 and the drain electrodes 56 is straight and vertical.

In one embodiment, at least one interface between each of the source electrodes 52 and the composite dielectric matrix (43, 44, 46) may be contoured, i.e., may not be located entirely within any Euclidean plane, and may be tapered, i.e., each point has a tangential plane that is at an angle with respect to a vertical direction. In one embodiment, each of the at least one interface between each of the source electrodes 52 and the composite dielectric matrix (43, 44, 46) may comprise a contoured and tapered interface segment extending downward from an edge of a horizontal top surface of the second dielectric spacer matrix layer 46, and a vertical interface segment adjoined to a bottom edge of the contoured and tapered interface segment and extending downward to a bottom surface of the composite dielectric matrix (43, 44, 46). In embodiments in which the etch stop dielectric liner 43 is present, the vertical interface segment may include an interface between the etch stop dielectric liner 43 and a respective one of the source electrodes 52 and the drain electrodes 56. In embodiments in which the etch stop dielectric liner 43 is not present, the vertical interface segment may include an interface between the first dielectric spacer matrix layer 44 and a respective one of the source electrodes 52 and the drain electrodes 56.

The contour of the interfaces between the composite dielectric matrix (43, 44, 46) and each of the source electrodes 52 and the drain electrodes 56 may cause each of the source electrodes 52 and the drain electrodes 56 to have flared vertical cross-sectional profiles in which the lateral dimensions of each of the source electrodes 52 and the drain electrodes 56 gradually increase near the top portions that are proximal to the second horizontal plane HP2. Specifically, the lateral dimensions of each of the source electrodes 52 and the drain electrodes 56, as measured along the first horizontal direction hd1 and/or along the second horizontal direction hd2 as a function of a vertical distance from the substrate, may be uniform below the interface between the first dielectric spacer matrix layer 44 and the second dielectric spacer matrix layer 46, and may gradually increase with the vertical distance from the substrate at the level of the second dielectric spacer matrix layer 46, i.e., may display flaring characteristics.

The length of the bottom surface of a source electrode 52 along the first horizontal direction hd1 as measured at an interface with an underlying active layer 20 is herein referred to as a source bottom length SBL. The length of the top surface of a source electrode 52 (which is contained within the second horizontal plane HP2) along the first horizontal direction hd1 is herein referred to as a source top length STL. According to an aspect of the present disclosure, the source top length STL may be greater than the source bottom length SBL. The length of each source electrode 52 along the first horizontal direction hd1 at the level of the first dielectric spacer matrix layer 44 may be uniform, and may be the same as the source bottom length SBL. The length of each source electrode 52 along the horizontal direction hd1 at the level of the second dielectric spacer matrix layer 46 increases gradually with a vertical distance from the substrate between the source bottom length SBL and the source top length STL. The difference between the source top length STL and the source bottom length SBL may be in a range from 0.5 nm to 10 nm, such as from 1 nm to 8 nm and/or from 2 nm to 6 nm, although lesser and greater dimensions may also be used.

The length of the bottom surface of a drain electrode 56 along the first horizontal direction hd1 as measured at an interface with an underlying active layer 20 is herein referred to as a drain bottom length DBL. The length of the top surface of a drain electrode 56 (which is contained within the second horizontal plane HP2) along the first horizontal direction hd1 is herein referred to as a drain top length DTL. According to an aspect of the present disclosure, the drain top length DTL may be greater than the drain bottom length DBL. The length of each drain electrode 56 along the first horizontal direction hd1 at the level of the first dielectric spacer matrix layer 44 may be uniform, and may be the same as the drain bottom length DBL. The length of each drain electrode 56 along the horizontal direction hd1 at the level of the second dielectric spacer matrix layer 46 increases gradually with a vertical distance from the substrate between the drain bottom length DBL and the drain top length DTL. The difference between the drain top length DTL and the drain bottom length DBL may be in a range from 0.5 nm to 10 nm, such as from 1 nm to 8 nm and/or from 2 nm to 6 nm, although lesser and greater dimensions may also be used.

The length of each inter-electrode dielectric spacer 42 along the first horizontal direction hd1 defines the channel length of a respective thin film transistor, and is herein referred to as a gate length GL. The sum of the source bottom length SBL, the gate length GL, and the drain bottom length DBL may be the same as the active layer length AL_L.

The width of the bottom surface of a source electrode 52 along the second horizontal direction hd2 as measured at an interface with an underlying active layer 20 is herein referred to as a source bottom width SBW. The width of the top surface of a source electrode 52 (which is contained within the second horizontal plane HP2) along the second horizontal direction hd2 is herein referred to as a source top width STW. According to an aspect of the present disclosure, the source top width STW may be greater than the source bottom width SBW. The width of each source electrode 52 along the second horizontal direction hd2 at the level of the second dielectric spacer matrix layer 44 may be uniform, and may be the same as the source bottom width SBW. The width of each source electrode 52 along the horizontal direction hd2 at the level of the second dielectric spacer matrix layer 46 increases gradually with a vertical distance from the substrate between the source bottom width SBW and the source top width STW. The difference between the source top width STW and the source bottom width SBW may be in a range from 1 nm to 20 nm, such as from 2 nm to 16 nm and/or from 4 nm to 12 nm, although lesser and greater dimensions may also be used. The source bottom width SBW may be the same as the active layer width AL_W, i.e., the lateral dimension of an underlying active layer 20 along the second horizontal direction hd2.

The width of the bottom surface of a drain electrode 56 along the second horizontal direction hd2 as measured at an interface with an underlying active layer 20 is herein referred to as a drain bottom width. The width of the top surface of a drain electrode 56 (which is contained within the second horizontal plane HP2) along the second horizontal direction hd2 is herein referred to as a drain top width DTW. According to an aspect of the present disclosure, the drain top width may be greater than the drain bottom width DBW. The width of each drain electrode 56 along the second horizontal direction hd2 at the level of the second dielectric spacer matrix layer 44 may be uniform, and may be the same as the drain bottom width. The width of each drain electrode 56 along the horizontal direction hd2 at the level of the second dielectric spacer matrix layer 46 increases gradually with a vertical distance from the substrate between the drain bottom width and the drain top width. The difference between the drain top width and the drain bottom width may be in a range from 1 nm to 20 nm, such as from 2 nm to 16 nm and/or from 4 nm to 12 nm, although lesser and greater dimensions may also be used. The drain bottom width may be the same as the active layer width AL_W, i.e., the lateral dimension of an underlying active layer 20 along the second horizontal direction hd2.

Each contiguous combination of an inter-electrode dielectric spacer 42, a source electrode 52, and a drain electrode 56 is herein referred to as a source-spacer-drain combination (52, 42, 56). Each source-spacer-drain combination (52, 42, 56) is laterally surrounded by the composite dielectric matrix (43, 44, 46). A two-dimensional array of source-spacer-drain combination (52, 42, 56) is located over a two-dimensional array of active layers 20 such that a bottom periphery of each source-spacer-drain combination (52, 42, 56) coincides with a top periphery of a respective underlying active layer 20. In other words, the active layer length AL_L (which is dimension of each active layer 20 along the first horizontal direction hd1) may be the same as the sum of the source bottom length SBL, the gate length GL, and the drain bottom length DBL.

In one embodiment, an entirety of an interface between the inter-electrode dielectric spacer 42 and the source electrode 52 within each source-spacer-drain combination (52, 42, 56) and an entirety of an interface between the inter-electrode dielectric spacer 42 and the drain electrode 56 within each source-spacer-drain combination (52, 42, 56) may be located within vertical planes. In contrast, an interface between the source electrode 52 within each source-spacer-drain combination (52, 42, 56) and the composite dielectric matrix (43, 44, 46) may comprise a contoured interface segment that is adjoined to a top surface of the second dielectric spacer matrix layer 46. A tapered convex surface segment of the second dielectric spacer matrix layer 46 may contact a tapered concave surface segment of the source electrode 52 at the contoured interface segment. Likewise, an interface between the drain electrode 56 within each drain-spacer-drain combination (52, 42, 56) and the composite dielectric matrix (43, 44, 46) may comprise a contoured interface segment that is adjoined to a top surface of the second dielectric spacer matrix layer 46. A tapered convex surface segment of the second dielectric spacer matrix layer 46 may contact a tapered concave surface segment of the drain electrode 56 at the contoured interface segment.

Generally, a two-dimensional array of source-spacer-drain combinations (52, 42, 56) may be located over a substrate, and may be laterally spaced apart from one another by a composite dielectric matrix (43, 44, 46). Each source-spacer-drain combination (52, 42, 56) selected from the two-dimensional array of source-spacer-drain combinations (52, 42, 56) comprises an inter-electrode dielectric spacer 42 in contact with a source electrode 52 and a drain electrode 56. The composite dielectric matrix (43, 44, 46) comprises a first dielectric spacer matrix layer 44 comprising a first dielectric spacer material and a second dielectric spacer matrix layer 46 comprising a second dielectric spacer material and overlying the first dielectric spacer matrix layer 44. Each source-spacer-drain combination (52, 42, 56) within the two-dimensional array of source-spacer-drain combinations (52, 42, 56) contacts a horizontal surface of a respective active layer 20 within the two-dimensional array of active layers 20.

Each contiguous combination of a source electrode 52, a drain electrode 56, and an inter-electrode dielectric spacer 42 contacts a horizontal surface of a respective stack of a an active layer 20 selected from the two-dimensional array of active layers 20, a gate dielectric layer 10, and a gate electrode 15. In one embodiment, a top surface of the composite dielectric matrix (43, 44, 46), top surfaces of the inter-electrode dielectric spacers 42, and top surfaces of the source electrodes 52 and the drain electrodes 56 are located within a same horizontal plane, i.e., the second horizontal plane HP2.

In one embodiment, the composite dielectric matrix (43, 44, 46) comprises an etch stop dielectric liner 43 contacting a bottom surface and sidewalls of the first dielectric spacer matrix layer 44 and contacting lower portions of each of the source electrodes 52 and the drain electrodes 56 and contacting lower portions of each of the inter-electrode dielectric spacers 42. In one embodiment, the etch stop dielectric liner 43 may contact all sidewalls of the active layers 20, and may have a bottom surface located within a same horizontal plane (i.e., the first horizontal plane HP1) that contains all bottom surfaces of the active layers 20.

While the first exemplary structure is described using an embodiment in which gate electrodes 15 are formed prior to formation of the two-dimensional array of discrete dielectric template structures 42T, various embodiments of the present disclosure allow formation of gate electrodes 15 prior to, or after, formation of the two-dimensional array of discrete dielectric template structures 42T, whereby a two-dimensional array of field effect transistors (including a two-dimensional array of thin film transistors) is formed.

Generally, a two-dimensional array of active layers 20 may be formed prior to, or after, formation of the source electrodes 52 and the drain electrodes 56 such that each of the active layers 20 has an areal overlap within a respective one of the source electrodes 52 and with a respective one of the drain electrodes 56. As used herein, an areal overlap means an overlap in areas in a plan view along a vertical direction. Generally, the two-dimensional array of active layers 20 overlies, or underlies, the two-dimensional array of source-spacer-drain combinations (52, 42, 56). The gate electrodes 15 are spaced from the two-dimensional array of active layers 20 by a gate dielectric layer 10.

Referring to FIGS. 13A-13E, at least one first connection-level dielectric material layer 70 and first connection-level metal interconnect structures (72, 74, 76, 78) may be formed over the composite dielectric matrix (43, 44, 46) and the source-spacer-drain combinations (52, 42, 56). The at least one first connection-level dielectric material layer 70 may include a first via-level dielectric material layer through which source contact via structures 72 and drain contact via structures 76 vertically extend, and a first line-level dielectric material layer in which source connection pads 74 and bit lines 78 are formed. In one embodiment, the first via-level dielectric material layer may be formed first, and the source contact via structures 72 and the drain contact via structures 76 may be formed through the first via-level dielectric material layer. The first line-level dielectric material layer may be subsequently formed over the first via-level dielectric material layer, and the first source connection pads 74 and the bit lines 78 may be subsequently formed through the first line-level dielectric material layer on a respective one of the source contact via structures 72 and the drain contact via structures 76.

Alternatively, the first via-level dielectric material layer and the first line-level dielectric material layer may be formed as a single dielectric material layer, and a dual damascene process may be performed to form integrated line and via structures. The integrated line and via structures include source-side integrated line and via structures including a respective combination of a source contact via structure 72 and a first source connection pad 74, and drain-side integrated line and via structures including a respective combination of drain contact via structures 76 and a bit line 78 that is integrally formed within the drain contact via structures 76. In one embodiment, each bit line 78 laterally extends along the first horizontal direction hd1 and may be electrically connected to a set of drain electrodes 56 that are arranged along the first horizontal direction hd1.

Generally, source contact via structures 72 may be formed on the source electrodes 52, and drain contact via structure 76 may be formed on the drain electrodes 56. Bit lines 78 may be formed on the drain contact via structure 76 such that each of the bit lines 78 laterally extends along a horizontal direction that is perpendicular to the lengthwise direction of the word lines 3. The bit lines 78 may laterally extend along a horizontal direction (such as the first horizontal direction hd1) that is different from the second horizontal direction hd2. In one embodiment, each of the active layers 20 may have a rectangular horizontal-cross-sectional shape having first sides that are parallel to the first horizontal direction hd1 and having second sides that are parallel to the second horizontal direction hd2.

Referring to FIGS. 14A-14E, at least one second connection-level dielectric material layer 80 and second connection-level metal interconnect structures (82, 84) may be formed over the at least one first connection-level dielectric material layer 70. The at least one second connection-level dielectric material layer 80 may include a second via-level dielectric material layer through which source connection via structures 82 vertically extend, and a second line-level dielectric material layer in which second source connection pads 84 are formed. In one embodiment, the second via-level dielectric material layer may be formed, and the source contact via structures 82 may be formed through the second via-level dielectric material layer. The second line-level dielectric material layer may be subsequently formed over the second via-level dielectric material layer, and the second source connection pads 84 may be subsequently formed through the second line-level dielectric material layer on a respective one of the source connection via structures 82.

Alternatively, the second via-level dielectric material layer and the second line-level dielectric material layer may be formed as a single dielectric material layer, and a dual damascene process may be performed to form integrated line and via structures. The integrated line and via structures include source-side integrated line and via structures including a respective combination of a source connection via structure 82 and a second source connection pad 84.

Generally, connection-level dielectric material layers (70, 80) may be formed over the field effect transistors. Source-connection metal interconnect structures (72, 74, 82, 84) may be formed within the connection-level dielectric material layers (70, 80), which may be used to electrically connect each of the source electrodes 52 to a conductive node of a respective memory element to be subsequently formed.

Referring to FIGS. 15A-15E, a two-dimensional array of memory structures may be formed over the two-dimensional array of field effect transistors. The metal interconnect structures (72, 74, 82, 84) located between the two-dimensional array of field effect transistors and the two-dimensional array of memory structures may be configured such that each memory structure within the two-dimensional array of memory structures is electrically connected to a source electrode 52 of a respective field effect transistor within the two-dimensional array of field effect transistors.

In an illustrative example, capacitor structures 98 and a memory-level dielectric material layer 90 may be formed over the connection-level dielectric material layers (70, 80). For example, first electrodes 92 (also referred to as first capacitor plates) may be formed on top surfaces of the second source connection pads 84 by deposition and patterning a first conductive material, which may be a metallic material or a heavily doped semiconductor material. A node dielectric layer 94 may be formed on each first electrode 92 by deposition of a node dielectric material such as silicon nitride and/or a dielectric metal oxide (e.g., aluminum oxide, lanthanum oxide, and/or hafnium oxide). A second electrode 96 (also referred to as a second capacitor plate or a ground-side plate) may be formed on physically exposed surfaces of the node dielectric by deposition and pattering of a second conductive material, which may be a metallic material or a heavily doped semiconductor material. Each portion of the node dielectric layer 94 located between a first electrode 92 and the second electrode 96 constitutes a node dielectric. Each contiguous combination of a first electrode 92, a node dielectric (which is a portion of the node dielectric layer 94), and the second electrode 96 may constitute a capacitor structure 98. The memory-level dielectric material layer 90 may be formed over the capacitor structures 98. Each of the capacitor structures 98 may be formed within, and laterally surrounded by, the memory-level dielectric material layer 90.

In one embodiment, each of the first electrodes 92 may be electrically connected to (i.e., electrically connected to) a respective one of the source electrodes 52. Each of the second electrodes 96 may be electrically grounded, for example, by forming an array of conductive via structures (not shown) that contact the second electrodes 96 and connected to an overlying metallic plate (not shown). Generally, capacitor structures 98 may be formed over a horizontal plane including a top surface of the bit lines 78. Each of the capacitor structures 98 comprise a node that is electrically connected to a respective one of the source electrodes 52. A two-dimensional array of memory cells 99 may be thus provided. Each memory cell 99 comprises a respective access transistor (which is one of the thin film transistors) and a respective capacitor structure 98. Each memory cell 99 may be formed within a respective unit cell area UC.

Referring to FIGS. 16A-16E, a first alternative configuration of the first exemplary structure is illustrated, which may be derived from the first exemplary structure illustrated in FIGS. 14A-14E by forming a two-dimensional array of resistive memory structures 198 in lieu of the two-dimensional array of capacitor structures illustrated in FIGS. 15A-15E. In this embodiment, each resistive memory structure 198 may comprise a vertical stack of a respective first electrode 192, a resistive memory element 194 that includes a material providing at least two different levels of electrical resistivity, and a second electrode 196. Each resistive memory element 194 may include any of the resistive memory elements known in the art, which include a phase change memory material portion, a magnetic tunnel junction cell, an oxygen-vacancy modulated dielectric metal oxide portion (such as hafnium oxide), a metal-insulator-transition (MIT) material portion (which may include, for example, $VO_2$ or $NbO_2$), etc. The second electrodes 196 may be electrically connected to a suitable voltage source or electrical ground as needed. In the illustrative example, a metal plate 199 may be formed over the two-dimensional array of the second electrodes 196. Alternative electrical connection schemes may be used as needed. A two-dimensional array of memory cells 99 may be thus provided. Each memory cell 99 comprises a respective access transistor (which is one of the thin film transistors) and a respective resistive memory structure 198. Each memory cell 99 may be formed within a respective unit cell area UC.

Generally speaking, a two-dimensional array of memory structures may be formed over, or under, the two-dimensional array of field effect transistors of the present disclosure. Metal interconnect structures (72, 74, 76, 78, 82, 84) may be formed over, or under, the two-dimensional array of field effect transistors such that each memory structure within the two-dimensional array of memory structures is electrically connected to a source electrode 52 of a respective field effect transistor within the two-dimensional array of field effect transistors. In some embodiments, the two-dimensional array of memory structures comprises a two-dimensional array of capacitor structures including a respective first capacitor plate (such as a first electrode 92), a respective node dielectric (which is a portion of a node dielectric layer 94 in contact with the first capacitor plate), and a respective second capacitor plate (such as a second electrode 96); or a two-dimensional array of resistive memory structures including a respective first electrode 192, a resistive memory element 194 that includes a material providing at least two different levels of electrical resistivity, and a second electrode 196.

Figure 17:
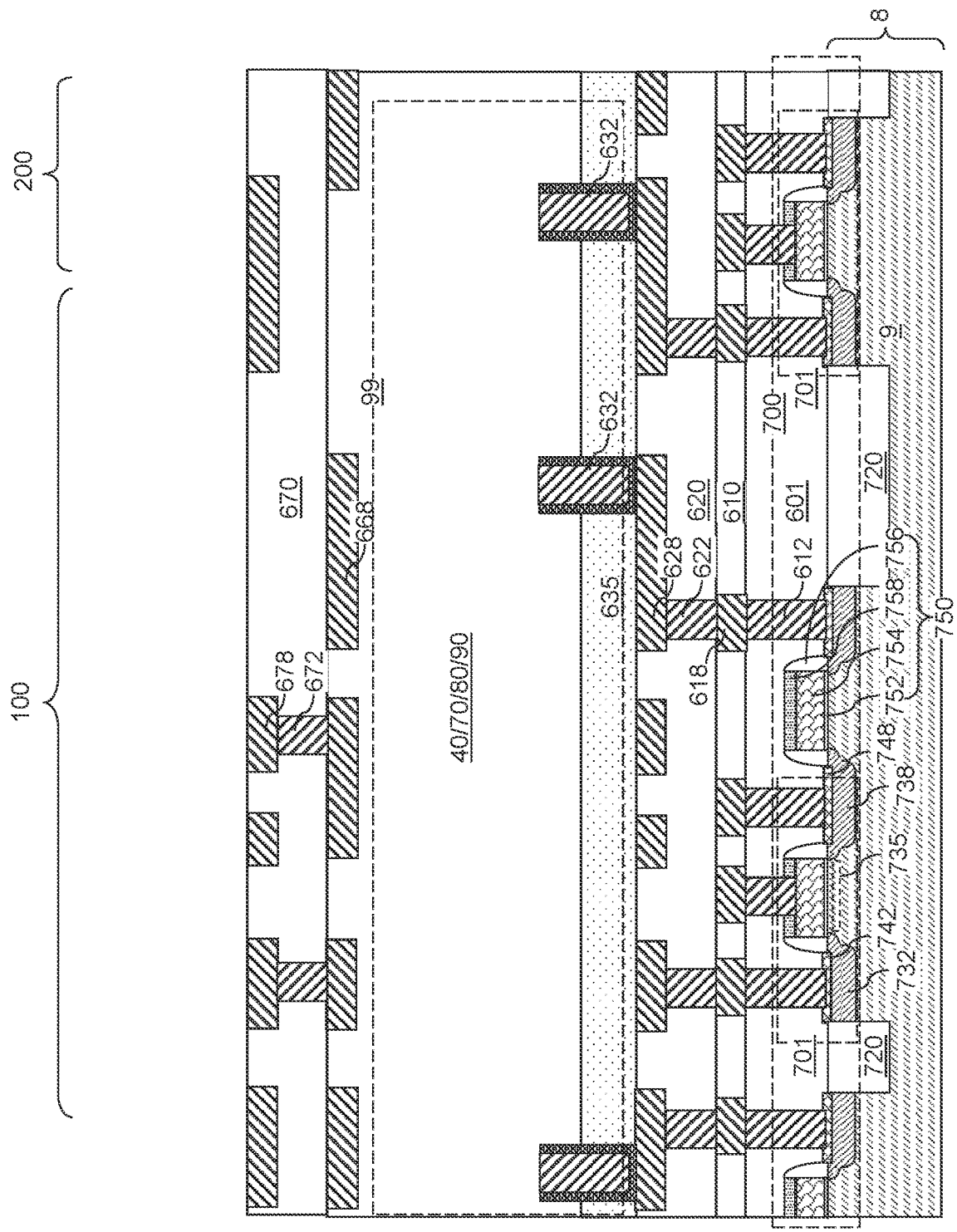
FIG. 17 is a vertical cross-sectional view of the first exemplary structure after formation of additional connection-level dielectric material layers and additional upper-level metal interconnect structures according to the first embodiment of the present disclosure.
Figure 27D:
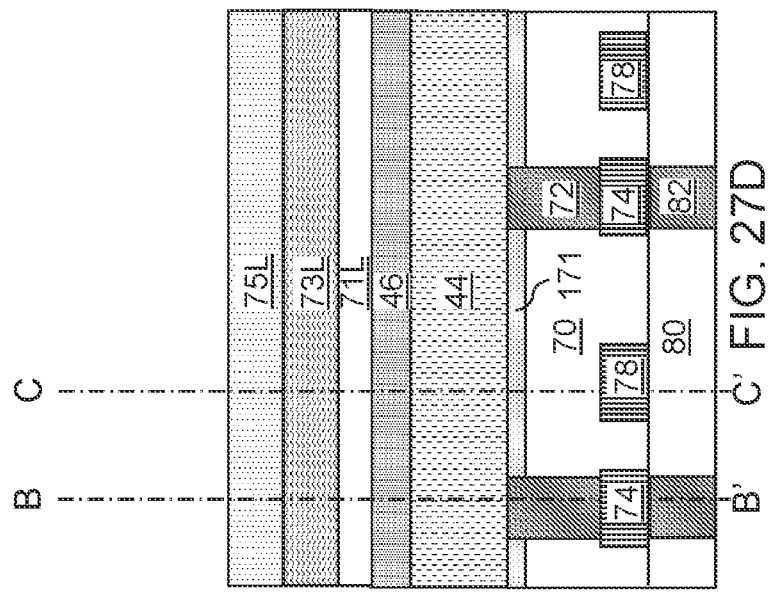
Figure 27C:
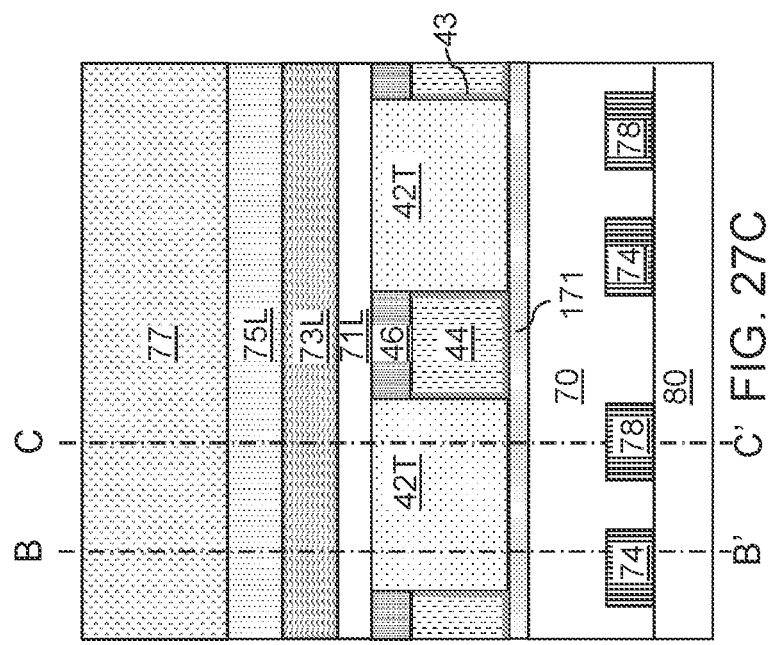
Figure 29A:
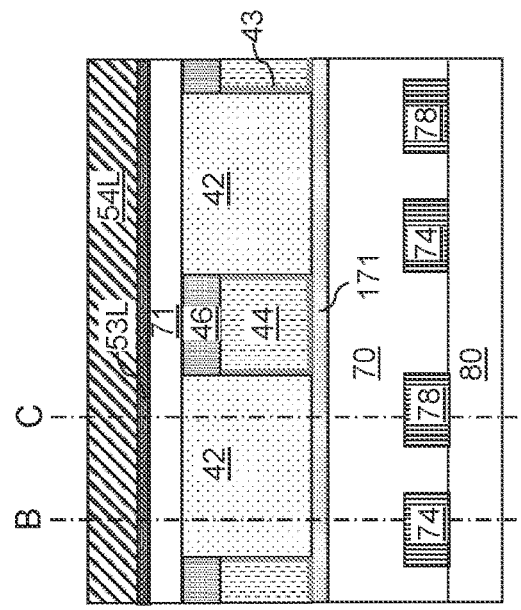
FIGS. 29A-29D are various views of the portion of the memory array region of the second exemplary structure after deposition of at least one metallic material in the source cavities and the drain cavities according to the second embodiment of the present disclosure.
Figure 29C:
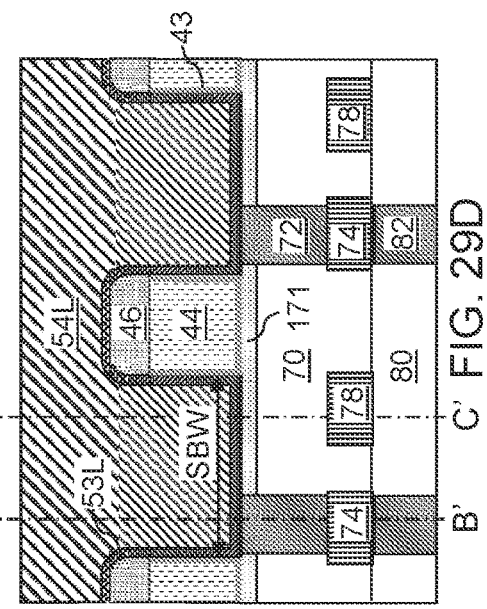
Figure 29B:
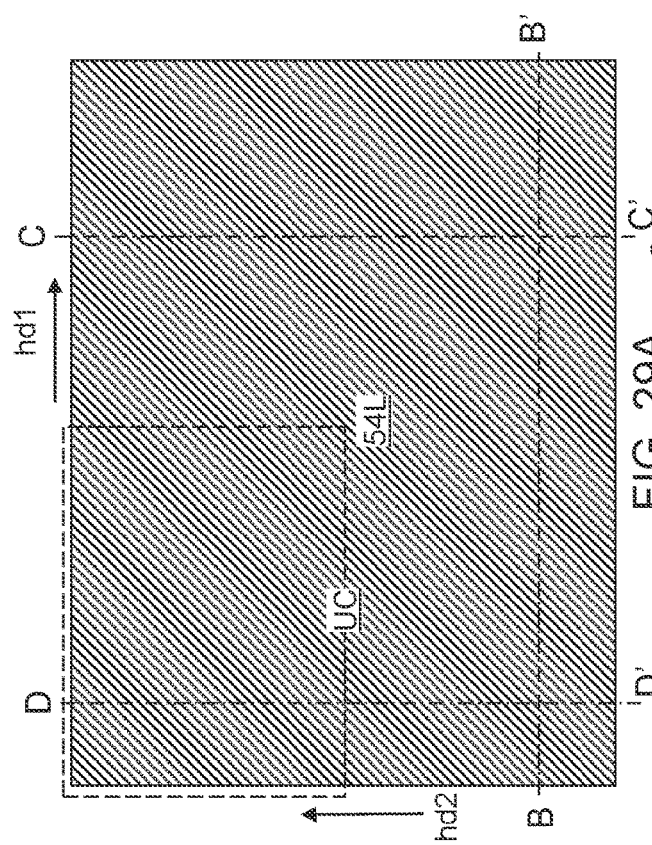
Figure 29D:
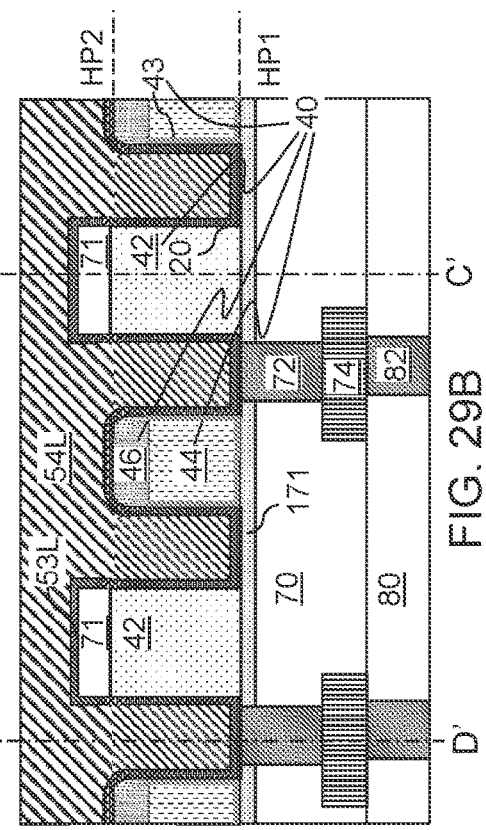
Figures 33B, 33C:
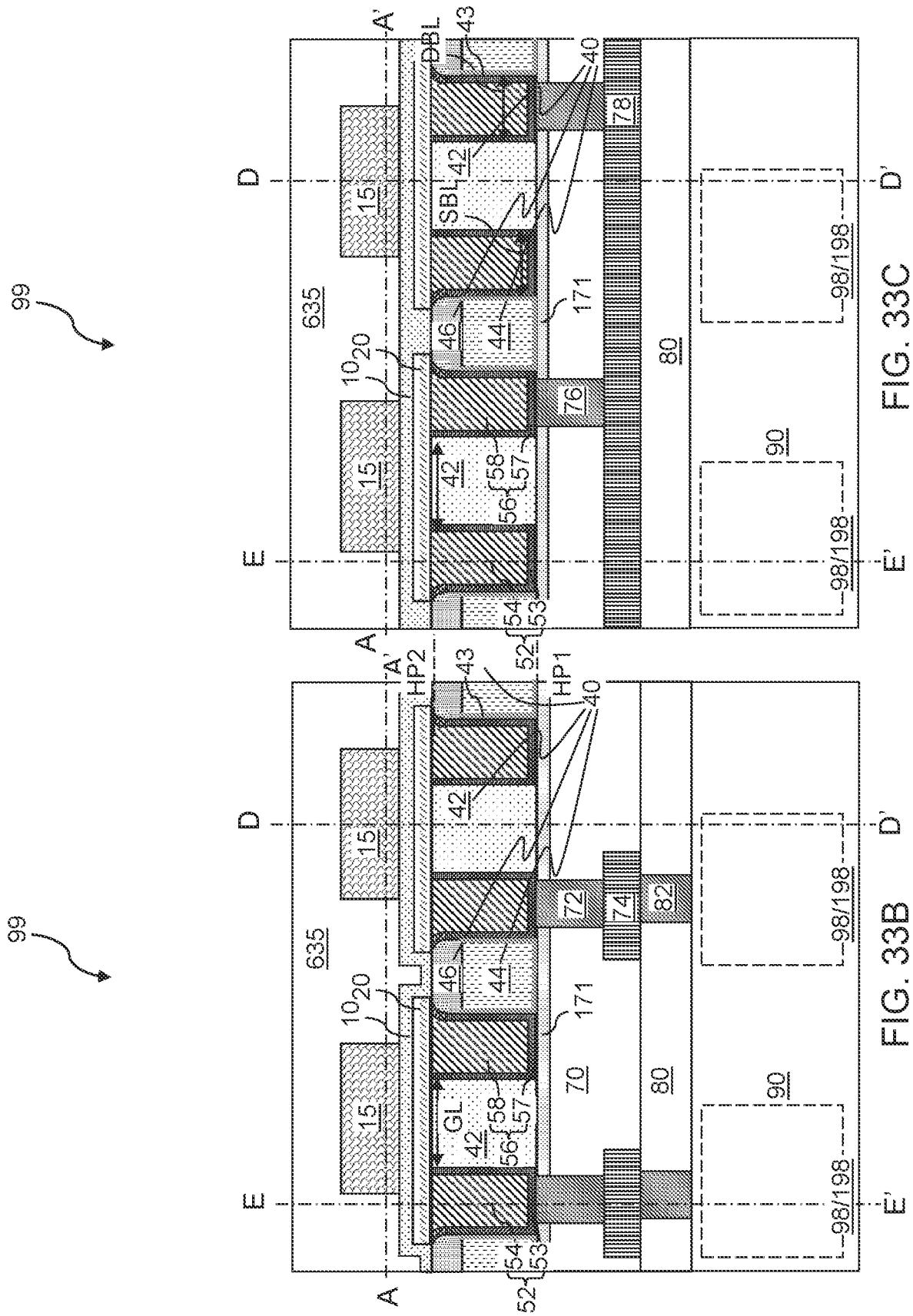

Referring to FIG. 17, the first exemplary structure is illustrated after formation of a two-dimensional array of memory cells 99 over the gate-level insulating layer 635. Various additional metal interconnect structures (632, 668) may be formed in the gate-level insulating layer 635, the dielectric layer 40, the connection-level dielectric material layers (70, 80), and the memory-level dielectric material layer 90. The additional metal interconnect structures (632, 668) may include, for example, second metal via structures 632 that may be formed through the gate-level insulating layer 635 and the dielectric layer 40 on a top surface of a respective one of the second metal line structures 628. Further, the additional metal interconnect structures (632, 668) may include, for example, metal line structures that are formed in upper portions of the memory-level dielectric material layer 90, which are herein referred to as sixth metal line structures 668.

Additional interconnect-level dielectric material layer and additional metal interconnect structures may be subsequently formed. For example, a seventh interconnect-level dielectric material layer 670 embedding seventh metal line structures 678 and sixth metal via structures 672 may be formed above the memory-level dielectric material layer 90. While the present disclosure is described using an embodiment in which seven levels of metal line structures are used, embodiments are expressly contemplated herein in which a lesser or greater number of interconnect levels are used.

Generally, the shapes of the top surfaces of the source electrodes 52 and the drain electrodes 56 may vary depending on the degree and the geometry of the chamfer at top edges of the second dielectric spacer matrix layer 46 during the second anisotropic etch step at the processing steps of FIGS. 10A-10D. FIGS. 18A-18C, 19A-19C, and 20A-20C illustrate variations in the shapes of the top surfaces of the source electrodes 52 and the drain electrodes 56 at the processing steps 12A-12E that may occur due to variations in the processing conditions during the second anisotropic etch step at the processing steps of FIGS. 10A-10D.

FIGS. 18A-18C illustrate a second alternative configuration of the first exemplary structure after formation of source electrodes 52 and drain electrodes 56. In the second alternative configuration, the top surfaces of the source electrodes 52 and the drain electrodes 56 may have a respective shape of a rounded rectangle.

FIGS. 19A-19C illustrate a third alternative configuration of the first exemplary structure after formation of source electrodes 52 and drain electrodes 56. In this embodiment, the chamfer at the top peripheries of the second dielectric spacer matrix layer 46 during the second anisotropic etch step at the processing steps of FIGS. 10A-10D may be more severe than in the second alternative configuration of the first exemplary structure. In the third alternative configuration, the section of the top periphery of each of the source electrodes 52 and the drain electrodes 56 in contact with the composite dielectric matrix (43, 44, 46) may have a respective contoured profile such that the entirety, or a predominant portion, of the top periphery of each of the source electrodes 52 and the drain electrodes 56 in contact with the composite dielectric matrix (43, 44, 46) is curved.

FIGS. 20A-20C illustrate a fourth alternative configuration of the first exemplary structure after formation of source electrodes 52 and drain electrodes 56. In this embodiment, each discrete dielectric template structure 42T may be formed with a non-rectangular horizontal cross-sectional shape such that the areas in which the source electrodes 52 and the drain electrodes 56 are to be formed have a greater width along the second horizontal direction hd2 than the areas in which the inter-electrode dielectric spacers 42 are to be subsequently formed. In the fourth alternative configuration, end portions of each of the source electrodes 52 and the drain electrodes 56 that laterally protrude along the second horizontal direction hd2 may have a rounded horizontal cross-sectional profile.

Referring collectively to FIGS. 18A-18C, 19A-19C, and 20A-20C, the horizontal cross-sectional shapes of the discrete dielectric template structures 42T and the horizontal cross-sectional shapes of the source electrodes 52 and the drain electrodes 56 may be selected to optimize device performance of the field effect transistors. Generally, the etch mask material portions 71 may be formed with straight edges that laterally extend along the second horizontal direction hd2. In this embodiment, the entirety of the vertical sidewalls of the inter-electrode dielectric spacers 42 that contact the source electrodes 52 or the drain electrodes 56 may be located within a respective Euclidean vertical plane, i.e., within a respective vertical plane without a curvature.

A top surface of the composite dielectric matrix (43, 44, 46), top surfaces of the inter-electrode dielectric spacers 42, and top surfaces of the source electrodes 52 and the drain electrodes 56 may be formed within a same horizontal plane, such as the second horizontal plane HP2. In one embodiment, the entirety of each interface between the inter-electrode dielectric spacers 42 and the source electrodes 52 may be straight and vertical, and may be located within a respective vertical Euclidean plane. In one embodiment, the entirety of each interface between the inter-electrode dielectric spacers 42 and the drain electrodes 56 may be straight and vertical, and may be located within a respective vertical Euclidean plane. In one embodiment, at least one, and/or each, interface between each of the source electrodes 52 and the composite dielectric matrix (43, 44, 46) comprises a contoured and tapered interface segment extending downward from an edge of a horizontal top surface of the second dielectric spacer matrix layer 46, and a vertical interface segment adjoined to a bottom edge of the contoured and tapered interface segment and extending downward to a bottom surface of the composite dielectric matrix (43, 44, 46). In one embodiment, at least one, and/or each, interface between each of the drain electrodes 56 and the composite dielectric matrix (43, 44, 46) comprises a contoured and tapered interface segment extending downward from an edge of a horizontal top surface of the second dielectric spacer matrix layer 46, and a vertical interface segment adjoined to a bottom edge of the contoured and tapered interface segment and extending downward to a bottom surface of the composite dielectric matrix (43, 44, 46).

Referring to FIGS. 21A-21C, a second exemplary structure according to a second embodiment of the present disclosure may be derived from the first exemplary structure illustrated in FIG. 1 by omitting formation of the in-process gate-level insulating layer 63S', and by forming a two-dimensional array of memory structures (98, 198). The two-dimensional array of memory structures (98, 198) may comprise a two-dimensional array of capacitor structures 98 or a two-dimensional array of resistive memory structures 198. The components of the two-dimensional array of memory structures (98, 198) may be vertically arranged such that a first electrode (92, 192) of the memory structures (98, 198) are formed on top. In this embodiment, a subset of metal interconnect structures (such as source connection via structures 82) to be subsequently formed may contact a top surface of a respective one of the first electrodes (92, 192) of the memory structures (98, 198). Generally, the two-dimensional array of memory structures (98, 198) may be formed within a memory-level dielectric material layer 90.

Connection-level dielectric material layers (70, 80) may be formed above the memory-level dielectric material 90, and metal interconnect structures (72, 74, 76, 78, 82, 84) may be formed within the connection-level dielectric material layers (70, 80). For example, at least one second connection-level dielectric material layer 80 and second upper-level metal interconnect structures 82 may be formed over the memory-level dielectric material layer 90. The at least one second connection-level dielectric material layer 80 may include a second via-level dielectric material layer through which source connection via structures 82 vertically extend. Each of the source contact via structures 82 may contact a respective first electrode of the memory structures (98, 198).

At least one first connection-level dielectric material layer 70 and an optional etch stop dielectric layer 171 may be subsequently formed. First connection-level metal interconnect structures (72, 74, 76, 78) may be formed in the at least one first connection-level dielectric material layer 70 and the optional etch stop electric layer 171. The at least one first connection-level dielectric material layer 70 may include a first line-level dielectric material layer in which source connection pads 74 and bit lines 78 are formed, and a first via-level dielectric material layer through which source contact via structures 72 and drain contact via structures 76 vertically extend.

Generally, source contact via structures 72 may be formed on the source electrodes 52, and drain contact via structure 76 may be formed on the drain electrodes 56. Bit lines 78 may be formed on the drain contact via structure 76 such that each of the bit lines 78 laterally extends along a horizontal direction that is perpendicular to the lengthwise direction of the word lines 3. The bit lines 78 may laterally extend along a horizontal direction (such as the first horizontal direction hd1) that is different from the second horizontal direction hd2. In one embodiment, each of the active layers 20 may have a rectangular horizontal-cross-sectional shape having first sides that are parallel to the first horizontal direction hd1 and having second sides that are parallel to the second horizontal direction hd2.

Source-connection metal interconnect structures (72, 74, 82) may be formed within the connection-level dielectric material layers (70, 80), and may be used to electrically connect each first electrode of the memory structures (98, 198) to a respective source electrode to be subsequently formed. In this embodiment, each source contact via structure 72 may be formed through the etch stop dielectric layer 171 at a location at which a source electrode is to be subsequently formed. Likewise, drain-connection metal interconnect structures (76, 78) may be formed within the connection-level dielectric material layers (70, 80), and may be used to electrically connect the bit lines 78 to a respective subset of the drain electrodes to be subsequently formed. In this embodiment, each drain contact via structure 78 may be formed though the etch stop dielectric layer 171 at a location at which a drain electrode is to be subsequently formed. The source contact via structures 72 may be formed as a two-dimensional periodic array of source contact via structures 78, and the drain contact via structures 76 may be formed as a two-dimensional periodic array of drain contact via structures 76.

Referring to FIGS. 22A-22C, a dielectric template material layer 42L and a hard mask layer 47L may be formed over the two-dimensional periodic array of source contact via structures 78 and the two-dimensional periodic array of drain contact via structures 76. The processing steps of FIGS. 4A-4C may be used to form the dielectric template material layer 42L and the hard mask layer 47L. Each of the dielectric template material layer 42L and the hard mask layer 47L may have the same material composition and the same thickness range as in the first embodiment of the present disclosure.

Referring to FIGS. 23A-23C, the processing steps of FIGS. 5A-5C may be performed to pattern the hard mask layer 47L and the dielectric template material layer 42L into a patterned hard mask layer 47 and a two-dimensional periodic array of discrete dielectric template structures 42T. The bottom surfaces of the discrete dielectric template structures 42T may be locate within a first horizontal plane HP1, and top surfaces of the discrete dielectric template structures 42T may be located within a second horizontal plane HP2. Because a continuous active layer is not present within the second exemplary structure at this processing step, the anisotropic etch process may use the etch stop dielectric layer 171 as an etch stop structure during patterning of the dielectric template material layer 42L into the discrete dielectric template structures 42T.

Referring to FIGS. 24A-24C, the processing steps of FIGS. 6A-6C may be performed to deposit and planarize an etch stop dielectric liner 43 and a first dielectric spacer matrix layer 44. The patterned hard mask layer 47 may be optionally removed. The top surface of the first dielectric spacer matrix layer 44 may be coplanar with, or may be substantially coplanar with, the top surfaces of the two-dimensional periodic array of discrete dielectric template structures 42T.

Referring to FIGS. 25A-25C, the processing steps of FIGS. 7A-7C may be performed to vertically recess the top surface of the first dielectric spacer matrix layer 44. A recess region 45 may be formed over the recessed top surface of the first dielectric spacer matrix layer 44.

Referring to FIGS. 26A-26C, the processing steps of FIGS. 8A-8C may be performed to form a second dielectric spacer matrix layer 46, which may have a top surface within the second horizontal plane HP2. A composite dielectric matrix (43, 44, 46) is formed, which may have the same height (i.e., vertical thickness) as the two-dimensional array of discrete dielectric template structures 42T.

Referring to FIGS. 27A-27D, an etch mask material layer 71L, at least one optional pattern-transfer assist layer (73L, 75L), and a photoresist layer 77 may be sequentially formed over the two-dimensional array of discrete dielectric template structures 42T and the composite dielectric matrix (43, 44, 46). The processing steps of FIGS. 9A-9D may be used. The photoresist layer 77 may be patterned with openings in the same manner as described with reference to FIGS. 9A-9D.

Referring to FIGS. 28A-28D, the processing steps of FIGS. 10A-10D may be performed to transfer the pattern in the photoresist layer 77 through at least one optional pattern-transfer assist layer (73L, 75L) and the etch mask material layer 71L and into a portions of the discrete dielectric template structures 42T selective to the material of the second dielectric spacer matrix layer 46. An anisotropic etch process may be performed in the same manner as described above with reference to FIGS. 10A-10D. The horizontal cross-sectional profiles and the vertical cross-sectional profiles of each of the source cavities 51, the drain cavities 59, and the second dielectric spacer matrix layer 46 may be the same as described above with reference to FIGS. 10A-10D.

Referring to FIGS. 29A-29D, the processing steps of FIGS. 11A-11D may be performed to deposit at least one metallic material may be deposited in the source cavities 51 and the drain cavities 59 and over the etch mask material portions 71 (i.e., patterned portions of the etch mask material layer 71L), a two-dimensional array of inter-electrode dielectric spacers 42, and the composite dielectric matrix (43, 44, 46). For example, the at least one metallic material may comprise a metallic liner layer 53L and a metallic fill material layer 54L.

Referring to FIGS. 30A-30E, the processing steps of FIGS. 12A-12E may be performed to planarize the at least one metallic material, and to form source electrodes 52 and drain electrodes 56. The horizontal cross-sectional profiles and the vertical cross-sectional profiles of each of the source electrodes 52, the drain electrodes 56, and the second dielectric spacer matrix layer 46 may be the same as described above with reference to FIGS. 12A-12E. A two-dimensional array of source-spacer-drain combinations (52, 42, 56) is formed.

A top surface of the composite dielectric matrix (43, 44, 46), top surfaces of the inter-electrode dielectric spacers 42, and top surfaces of the source electrodes 52 and the drain electrodes 56 may be formed within a same horizontal plane, such as the second horizontal plane HP2. In one embodiment, the entirety of each interface between the inter-electrode dielectric spacers 42 and the source electrodes 52 may be straight and vertical, and may be located within a respective vertical Euclidean plane. In one embodiment, the entirety of each interface between the inter-electrode dielectric spacers 42 and the drain electrodes 56 may be straight and vertical, and may be located within a respective vertical Euclidean plane. In one embodiment, at least one, and/or each, interface between each of the source electrodes 52 and the composite dielectric matrix (43, 44, 46) comprises a contoured and tapered interface segment extending downward from an edge of a horizontal top surface of the second dielectric spacer matrix layer 46, and a vertical interface segment adjoined to a bottom edge of the contoured and tapered interface segment and extending downward to a bottom surface of the composite dielectric matrix (43, 44, 46). In one embodiment, at least one, and/or each, interface between each of the drain electrodes 56 and the composite dielectric matrix (43, 44, 46) comprises a contoured and tapered interface segment extending downward from an edge of a horizontal top surface of the second dielectric spacer matrix layer 46, and a vertical interface segment adjoined to a bottom edge of the contoured and tapered interface segment and extending downward to a bottom surface of the composite dielectric matrix (43, 44, 46).

In one embodiment, the composite dielectric matrix (43, 44, 46) comprises an etch stop dielectric liner 43 contacting a bottom surface and sidewalls of the first dielectric spacer matrix layer 44 and contacting lower portions of each of the source electrodes 52 and the drain electrodes 56 and contacting lower portions of each of the inter-electrode dielectric spacers 42. In one embodiment, the etch stop dielectric liner 43 may have a bottom surface located within a same horizontal plane (i.e., the first horizontal plane HP1) that contains the bottom surfaces of the inter-electrode dielectric spacers 42.

In the second exemplary structure, a two-dimensional array of memory structures (98, 198) is formed prior to formation of the source electrodes 52 and the drain electrodes 56. Each memory structure (98, 198) within the two-dimensional array of memory structures (98, 198) is electrically connected to a respective source electrode 52 within the two-dimensional array of source-spacer-drain combinations (52, 42, 56).

Referring to FIGS. 31A-31E, a continuous active layer may be deposited over the composite dielectric matrix (43, 44, 46) and the two-dimensional array of source-spacer-drain combinations (52, 42, 56). The continuous active layer may be subsequently patterned into a two-dimensional periodic array of active layers 20, which may have the same material composition and the same thickness range as the active layers 20 in the first exemplary structure. In one embodiment, the two-dimensional array of active layers 20 may be formed over the source electrodes 52 and the drain electrodes 56 such that each active layer 20 within the two-dimensional array of active layers 20 is formed directly on top surfaces of a respective pair of a source electrode 52 and a drain electrode 56. In one embodiment, a bottom surface of each active layer 20 within the two-dimensional array of active layers 20 may be located within a horizontal plane including a top surface of the composite dielectric matrix (43, 44, 46). In one embodiment, each source-spacer-drain combination (52, 42, 56) within the two-dimensional array of source-spacer-drain combinations (52, 42, 56) contacts a horizontal surface of a respective active layer 20 within the two-dimensional array of active layers 20.

In one embodiment, each of the active layers 20 may have a same horizontal cross-sectional shape, which may be a rectangular shape that covers the entire top area of a respective underlying source-spacer-drain combination (52, 42, 56). In one embodiment, the sidewalls of each active layer 20 may be laterally offset outward from a periphery of a top surface of an underlying source-spacer-drain combination (52, 42, 56) without contacting one another. The gap between neighboring pairs of active layers 20 may be in a range from 1 nm to 40 nm, such as from 2 nm to 20 nm, although lesser and greater dimensions may also be used for the gap.

Referring to FIGS. 32A-32E, a gate dielectric layer 10 and gate electrodes 15 may be formed over the two-dimensional array of active layers 20. The gate dielectric layer 10 may have the same material composition and the same thickness range as the gate dielectric layer 10 of the first embodiment of the present disclosure. The gate electrodes 15 may laterally extend along the second horizontal direction hd2 over a respective column of active layers 20. The lateral extent of the gate electrodes 15 along the first horizontal direction hd1 and the areal overlap of each gate electrode 15 with a respective underlying active layer 20 in a plan view may be the same, or about the same, as in the first exemplary structure.

In the second embodiment, the gate electrodes 15 may be formed after formation of the two-dimensional array of discrete dielectric template structures 42T, the source electrodes 52, and the drain electrodes 56. Bottom surfaces of the active layers 20 within the two-dimensional array of active layers 20 and segments of a bottom surface of the gate dielectric layer 10 that contact the second dielectric spacer matrix layer 46 may be located within a same horizontal plane (such as the second horizontal plane HP2) as top surfaces of the source electrodes 52 and the drain electrodes 56 and second dielectric spacer matrix layer 46.

Referring to FIGS. 33A-33E, a gate-level insulating layer 635 may be deposited and planarized over the gate electrodes 15 to provide a two-dimensional array of memory cells 99.

Referring collectively to FIGS. 1-33E, a two-dimensional array of memory structures (98, 198) may be formed over, or under, a two-dimensional array of field effect transistors (which may include a two-dimensional array of thin film transistors). Metal interconnect structures (72, 74, 76, 78, 82, 84) may be formed over, or under, the two-dimensional array of field effect transistors such that each memory structure (98, 198) within the two-dimensional array of memory structures (98, 198) is electrically connected to a source electrode 52 of a respective field effect transistor within the two-dimensional array of field effect transistors.

Within the two-dimensional array of field effect transistors, a two-dimensional array of active layers 20 overlies, or underlies, a two-dimensional array of source-spacer-drain combinations (52, 42, 56). In one embodiment, each contiguous combination of a source electrode 52, a drain electrode 56, and an inter-electrode dielectric spacer 42 contacts a horizontal surface of a respective stack of an active layer 20 selected from the two-dimensional array of active layers 20, a gate dielectric layer 10, and a gate electrode 15.

The gate electrodes 15 may be formed prior to, or after, formation of the two-dimensional array of discrete dielectric template structures 42T, the source electrodes 52, and the drain electrodes 56. The two-dimensional array of active layers 20 may be formed prior to, or after, formation of the source electrodes 52 and the drain electrodes 56 such that each of the active layers 20 has an areal overlap within a respective one of the source electrodes 52 and with a respective one of the drain electrodes 56. A bottom surface of each active layer 20 within the two-dimensional array of active layers 20 may be located within a horizontal plane including a top surface of the composite dielectric matrix (43, 44, 46) or a bottom surface of the composite dielectric matrix (43, 44, 46). The horizontal plane may be a first horizontal plane HP1 described above, or a second horizontal plane HP2 described above.

Referring to FIGS. 34A-34C, a third exemplary structure according to a third embodiment of the present disclosure may be the same or substantially the same as the first embodiment of the present disclosure illustrated in FIGS. 2A-2C. The width of each word line 3 may be uniform along the second horizontal direction hd2, and may be optimized as needed. In one embodiment, the width of each word line 3 may be greater than the lateral dimension along the first horizontal direction hd1 of a stack of a gate electrode, a blocking dielectric layer, and a charge storage element to be subsequently formed.

Figure 35C:
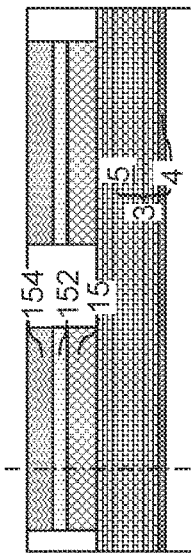
FIGS. 35A-35C are various views of the portion of the memory array region of the third exemplary structure after formation of a two-dimensional array of stacks of a gate electrode, a blocking dielectric layer, and a charge storage element according to the third embodiment of the present disclosure.
Figure 35A:
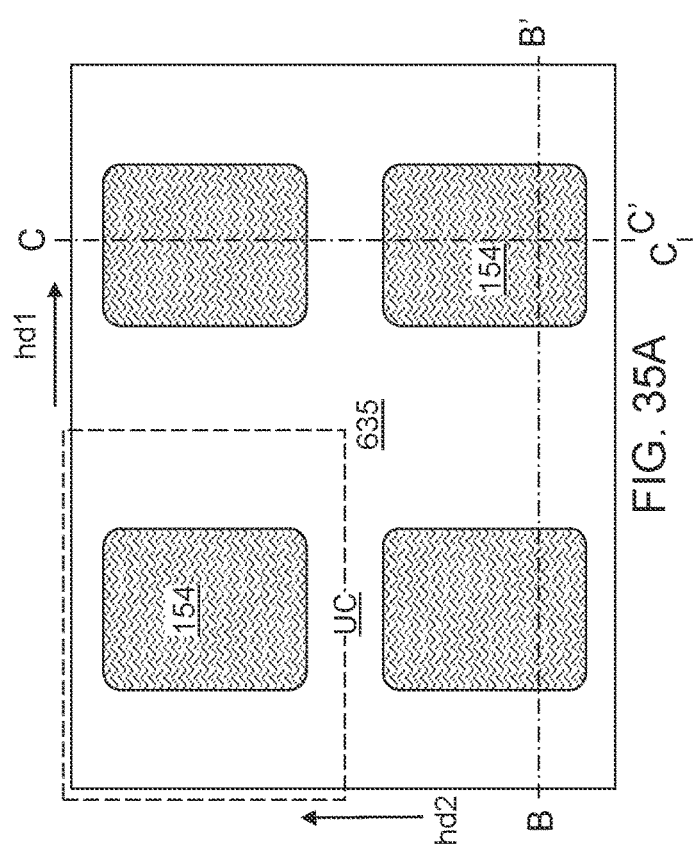
Figure 35B:
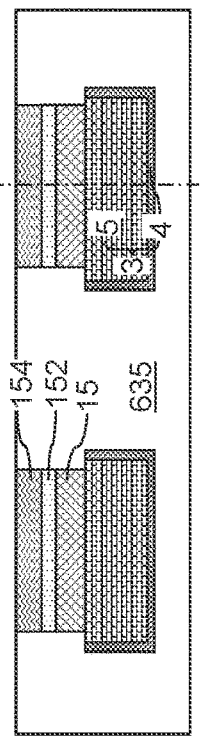
Figure 36E:
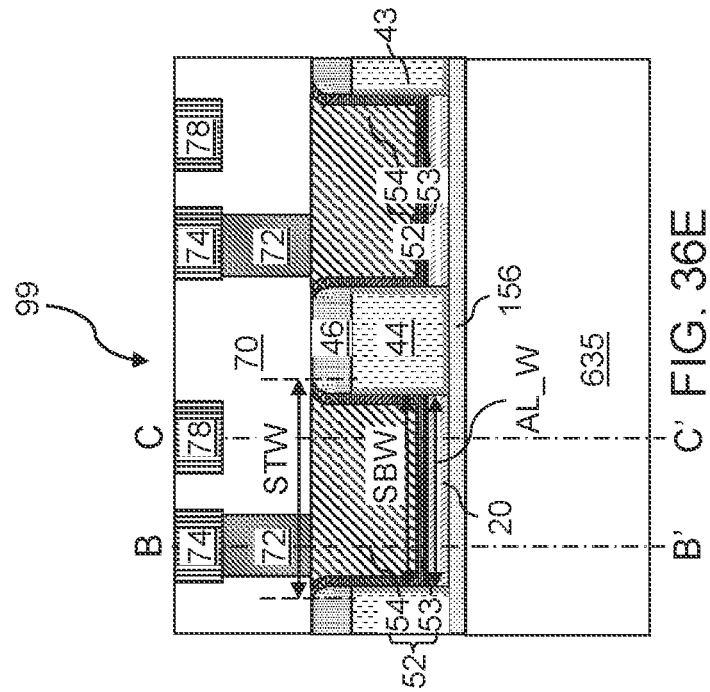
Figure 36D:
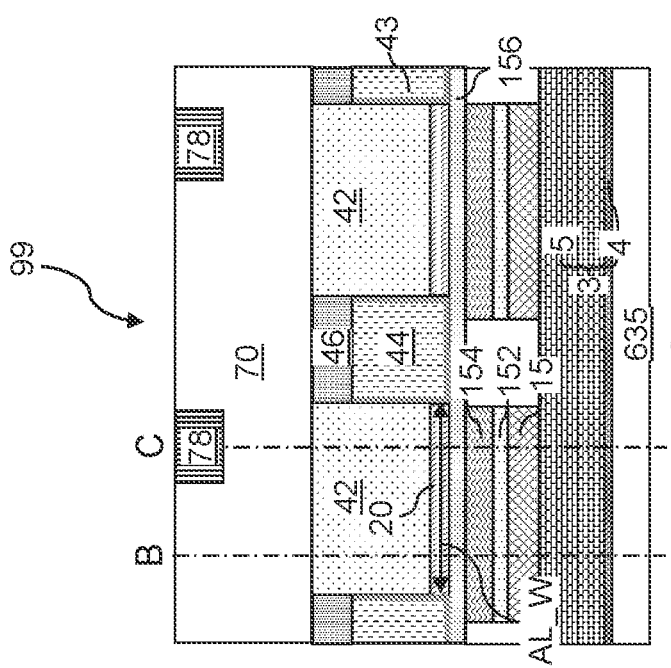
Figure 37A:
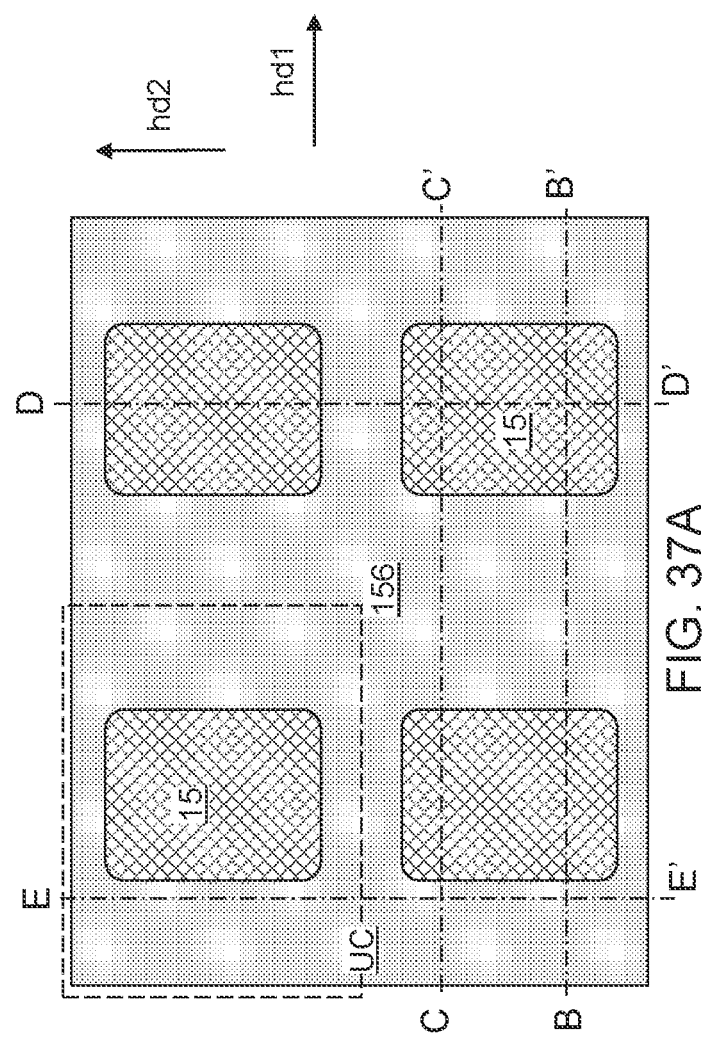
FIGS. 37A-37E are various views of the portion of a memory array region of a fourth exemplary structure after formation of a tunneling dielectric layer and a two-dimensional array of stacks of a charge storage element, a blocking dielectric layer, and a gate electrode according to the fourth embodiment of the present disclosure.
Figures 37B, 37C:
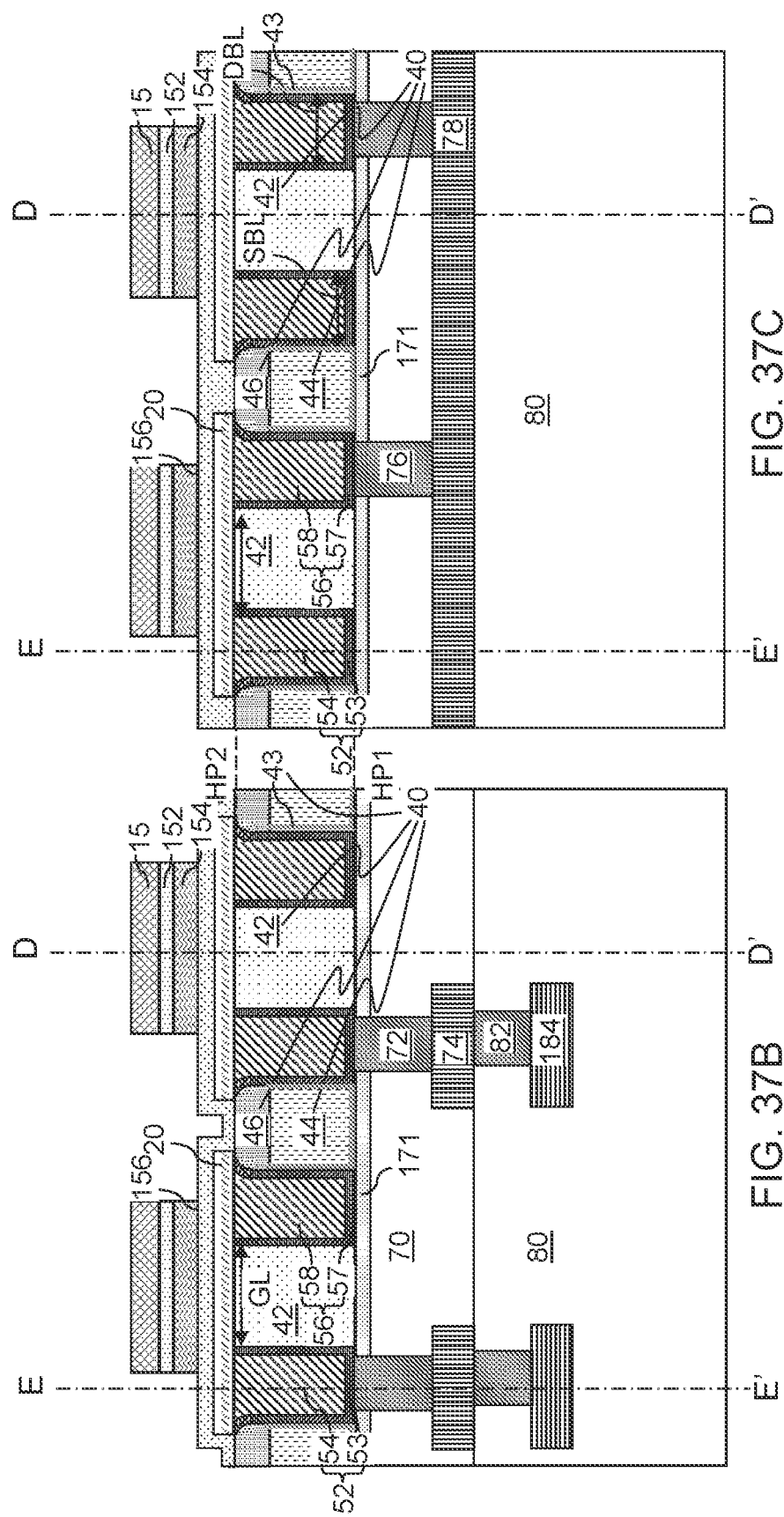
Figure 37E:
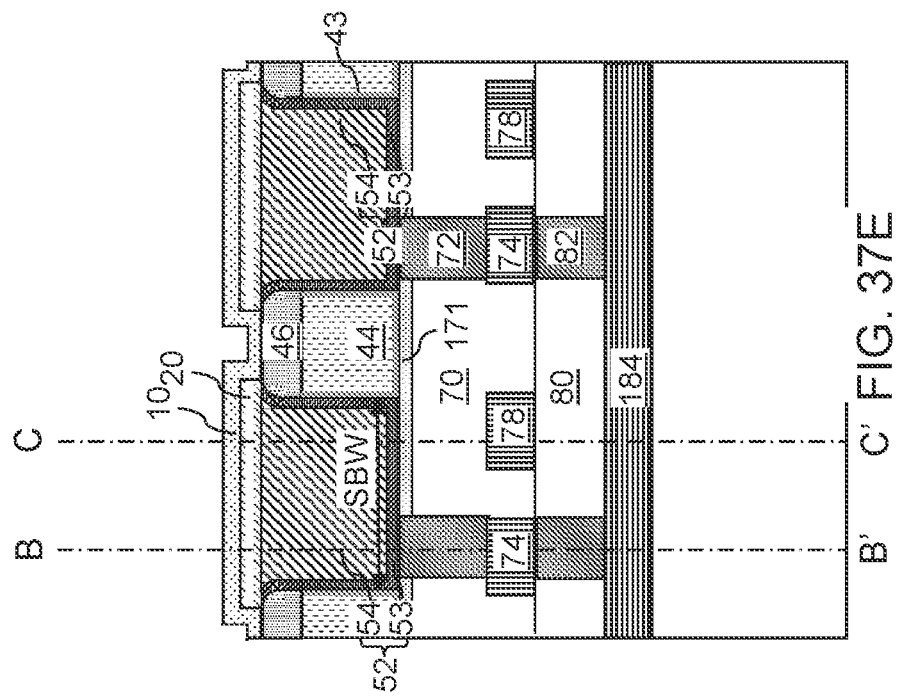
Figure 37D:
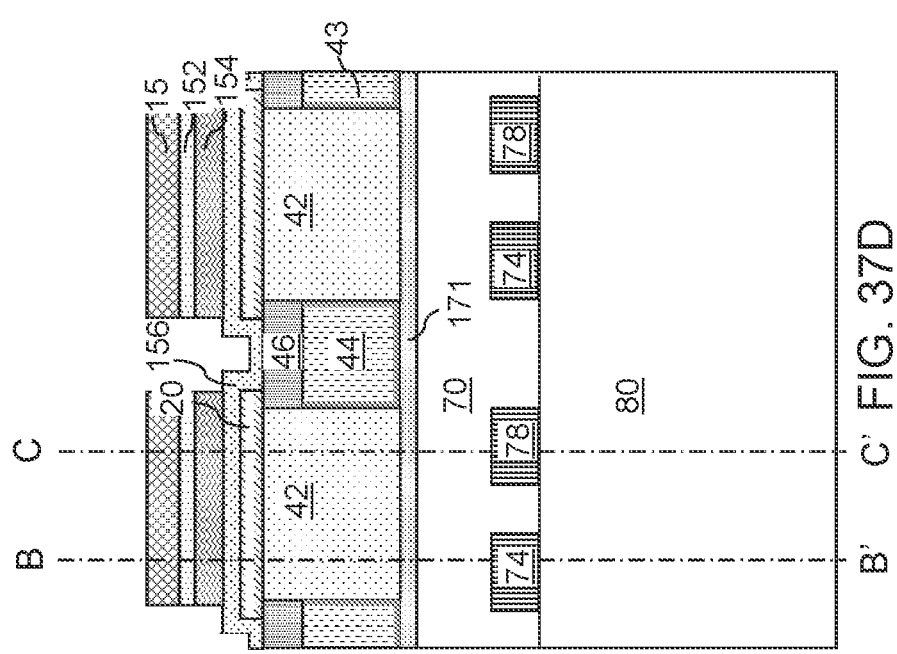
Figure 38C:
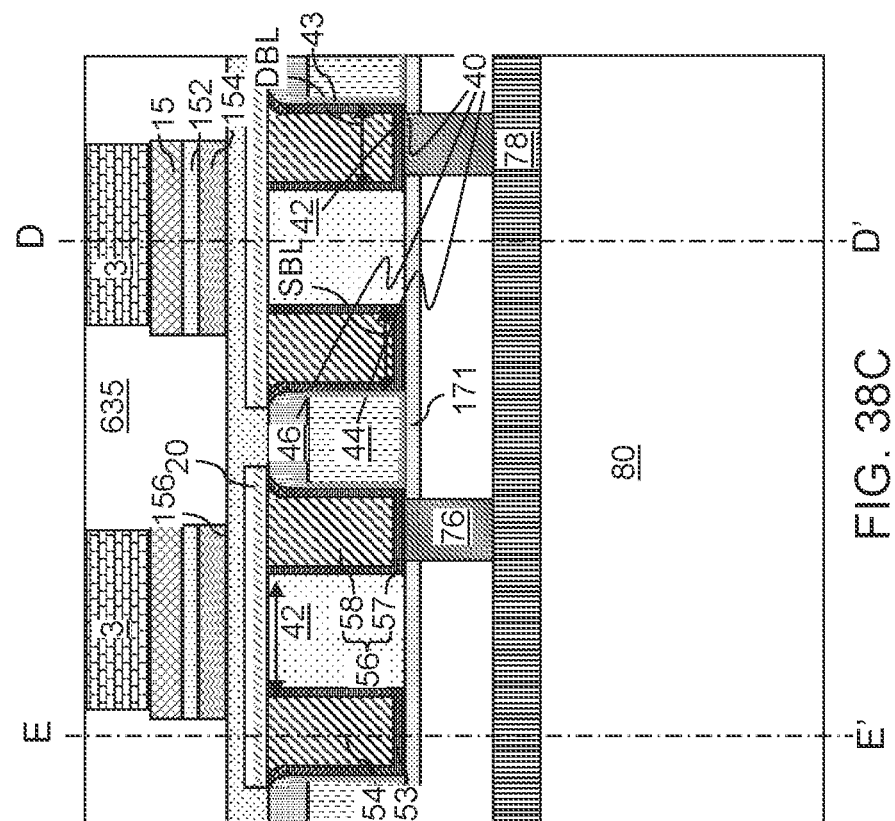
Figure 38B:
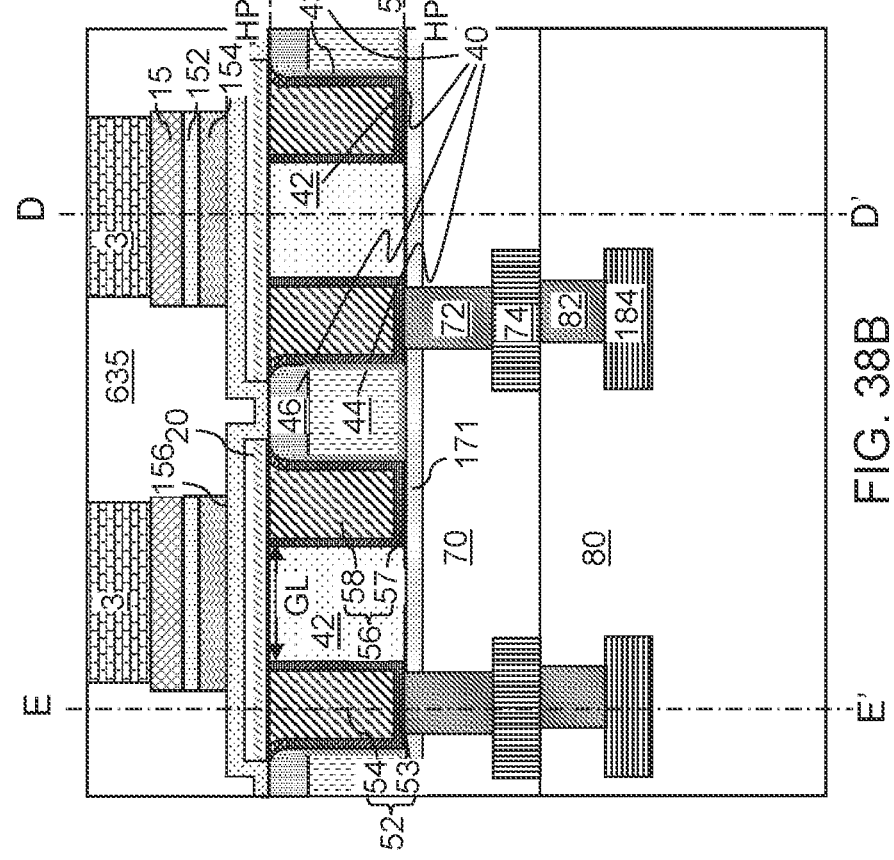

Referring to FIGS. 35A-35C, a two-dimensional array of stacks of a gate electrode 15, a blocking dielectric layer 152, and a charge storage element 154 may be formed over the word lines 3. For example, a gate electrode material layer, a continuous blocking dielectric layer, and a continuous charge storage material layer may be deposited over the word lines 3. A photoresist layer (not shown) may be applied over the continuous charge storage material layer, and may be lithographically patterned into a two-dimensional array of discrete photoresist material portions located within areas of the word lines 3 in a plan view. An anisotropic etch process may be performed to transfer the pattern in the photoresist layer through the continuous charge storage material layer, the continuous blocking dielectric layer, and the gate electrode material layer. The continuous charge storage material layer may be divided into a two-dimensional array of charge storage elements 154. The continuous blocking dielectric layer may be divided into a two-dimensional array of blocking dielectric layers 152. The gate electrode material layer may be divided into a two-dimensional array of gate electrodes 15. Within each stack of a gate electrode 15, a blocking dielectric layer 152, and a charge storage element 154, sidewalls of the gate electrode 15, the blocking dielectric layer 152, and the charge storage element 154 may be vertically coincident, i.e., may be located within a same vertical plane.

Each gate electrode 15 comprises at least one conductive material such as at least one metallic material. The thickness of each gate electrode 15 may be in a range from 10 nm to 150 nm, such as from 30 nm to 100 nm, although lesser and greater thicknesses may also be used. Each blocking dielectric layer 152 comprises at least one dielectric material that may effectively block tunneling of electrons. For example, each blocking dielectric layer 152 may comprise silicon oxide and/or a dielectric metal oxide (such as aluminum oxide). The thickness of each blocking dielectric layer 152 may be in a range from 5 nm to 30 nm, such as from 8 nm to 15 nm, although lesser and greater thicknesses may also be used. Each charge storage element 154 comprises a material that may retain electrical charges therein. For example, each charge storage element 154 may comprise a dielectric charge trapping material (such as a silicon nitride), or may comprise a floating gate material (which may comprise a semiconductor material or a metallic material). The thickness of each charge storage element 154 may be in a range from 5 nm to 100 nm, such as from 10 nm to 30 nm, although lesser and greater thicknesses may also be used. An additional insulating material layer (which is herein referred to as a gate-electrode-level insulating layer) may be deposited over the in-process gate-level insulating layer 635', and may be incorporated into the in-process gate-level insulating layer 635' to provide a gate-level insulating layer 635.

Referring to FIGS. 36A-36E, the processing steps of FIGS. 4A-4C through FIGS. 12A-12E may be performed with the modification that a tunneling dielectric layer 156 is used in lieu of the gate dielectric layer 10. The tunneling dielectric layer 156 is a type of gate dielectric layer that allows tunneling of the charge carriers therethrough. Thus, the tunneling dielectric layer 156 includes a dielectric material through which charge carriers (such as electrons or holes) may tunnel through. Any tunneling dielectric material known in the arts may be used for the tunneling dielectric layer 156. In an illustrative example, the tunneling dielectric layer 156 may comprise silicon oxide, or a layer stack of a first silicon oxide layer, a silicon oxynitride layer, and a second silicon oxide layer (known as an ONO stack in the art). The thickness of the tunneling dielectric layer 156 may be in a range from 1 nm to 6 nm, such as from 2 nm to 4 nm, although lesser and greater thicknesses may also be used.

The horizontal cross-sectional profiles and vertical cross-sectional profiles of each of the source electrodes 52, the drain electrodes 56, and the second dielectric spacer matrix layer 46 may be the same as in the first and second exemplary structures. Generally, a stack including a tunneling dielectric layer 156, a charge storage element 154, and a blocking dielectric layer 152 is formed between each of the gate electrodes 15 and a respective neighboring pair of a source electrode 52 and drain electrode 56 selected from the source electrodes 52 and the drain electrodes 56. A two-dimensional array of layer stacks (15, 152, 154) is provided underneath the tunneling dielectric layer 156. Each of the layer stacks (15, 152, 154) comprises a charge storage element 154, a blocking dielectric layer 152, and a gate electrode 15, and is spaced from a respective active layer 20 within the two-dimensional array of active layers 20 by the tunneling dielectric layer 156.

A bottom surface of the composite dielectric matrix (43, 44, 46) and bottom surfaces of the active layers 20 within the two-dimensional array of active layers 20 are located within a same horizontal plane, such as the first horizontal plane HP1. A bottom surface of each active layer 20 within the two-dimensional array of active layers 20 is located within a horizontal plane including a bottom surface of the composite dielectric matrix (43, 44, 46), such as the first horizontal plane HP1. Each source-spacer-drain combination (52, 42, 56) within the two-dimensional array of source-spacer-drain combinations (52, 42, 56) contacts a horizontal surface (such as the top surface) of a respective active layer 20 within the two-dimensional array of active layers 20.

Subsequently, connection-level dielectric material layers (not shown) may be formed over the source electrodes 52 and the drain electrodes 56, and metal interconnect structures (not shown) may be formed in the connection-level dielectric material layers to provide electrical connection to the source electrodes 52 and a drain electrodes 56. In one embodiment, each source electrode 52 may be electrically biased by a respective node in the CMOS circuitry 700, each drain electrodes 56 may be electrically biased by a respective node in the CMOS circuitry 700. In an illustrative example, the source electrodes 52 may be electrically grounded, and a drain electrodes 56 may be connected to bit line drivers within the CMOS circuitry 700.

Referring to FIGS. 37A-37E, a fourth exemplary structure according to the fourth embodiment of the present disclosure may be derived from the second exemplary structure illustrated in FIGS. 32A-32E by omitting formation of the two-dimensional array of memory structures (98, 198) at the processing steps of FIGS. 21A-21C, by modifying electrical connections for source connection via structures 82, 184 such that each source electrode 52 is electrically connected to a respective node in the CMOS circuitry 700, by forming a tunneling dielectric layer 156 in lieu of a gate dielectric layer 10, and by forming a two-dimensional array of layer stacks (15, 152, 154) in lieu of gate electrodes 15 used in the second exemplary structure. Thus, each source electrode 52 may be electrically biased by a respective node in the CMOS circuitry 700, each drain electrodes 56 may be electrically biased by a respective node in the CMOS circuitry 700. In an illustrative example, the source electrodes 52 may be electrically grounded, and a drain electrodes 56 may be connected to bit line drivers within the CMOS circuitry 700.

The tunneling dielectric layer 156 is a type of gate dielectric layer that allows tunneling of the charge carriers therethrough. The tunneling dielectric layer 156 in the fourth exemplary structure may have the same material composition and the same thickness range as the tunneling dielectric layer 156 in the third exemplary structure. The two-dimensional array of layer stacks (15, 152, 154) in the fourth exemplary structure may be the same as, or may be substantially the same as, the two-dimensional array of layer stacks (15, 152, 154) in the third exemplary structure except that the vertical order of layers within of each layer stack (15, 152, 154) is reversed. In one embodiment, the two-dimensional array of layer stacks (15, 152, 154) in the fourth exemplary structure may be formed by sequentially depositing and subsequently patterning a continuous charge storage material layer, a continuous blocking dielectric layer, and a gate electrode material layer.

The horizontal cross-sectional profiles and vertical cross-sectional profiles of each of the source electrodes 52, the drain electrodes 56, and the second dielectric spacer matrix layer 46 may be the same as in the first and second exemplary structures. Generally, a stack including a tunneling dielectric layer 156, a charge storage element 154, and a blocking dielectric layer 152 is formed between each of the gate electrodes 15 and a respective neighboring pair of a source electrode 52 and drain electrode 56 selected from the source electrodes 52 and the drain electrodes 56. A two-dimensional array of layer stacks (154, 152, 15) is provided above the tunneling dielectric layer 156. Each of the layer stacks (154, 152, 15) comprises a charge storage element 154, a blocking dielectric layer 152, and a gate electrode 15, and is spaced from a respective active layer 20 within the two-dimensional array of active layers 20 by the tunneling dielectric layer 156.

In one embodiment, bottom surfaces of the active layers 20 within the two-dimensional array of active layers 20 and segments of a bottom surface of a tunneling dielectric layer 156 (which is a gate dielectric layer that allows charge tunneling therethrough) that contact the second dielectric spacer matrix layer 46 are located within a same horizontal plane (such as the second horizontal plane HP2) as top surfaces of the source electrodes 52 and the drain electrodes 56. In one embodiment, a bottom surface of each active layer 20 within the two-dimensional array of active layers 20 is located within a horizontal plane including a top surface of the composite dielectric matrix (43, 44, 46).

Referring to FIGS. 38A-38E, a gate-level dielectric material layer 635 may be formed above the two-dimensional array of layer stacks (154, 152, 15). Line trenches laterally extending along the second horizontal direction hd2 may be formed in on upper portion of the gate-level dielectric material layer 635 such that top surfaces of a column of the gate electrodes 15 are physically exposed at the bottom of each line trench. At least one conductive material may be deposited in the line trenches, and excess portions of the at least one conductive material may be removed from above the horizontal plane including the top surface of the gate-level dielectric material layer 635. Remaining portions of the at least one conductive material constitute word lines 3. Each word line 3 contacts a respective column of the gate electrodes 15, and a laterally extends along the second horizontal direction hd2.

Various alternative configurations of the previously described exemplary structures may be provided. According to an aspect of the present disclosure, the first dielectric spacer matrix layer 44 may be formed by depositing and vertically recessing more than two dielectric materials. The etch stop dielectric liner 43 may, or may not, be used in each of the various alternative configurations. While examples of the alternative configurations that are subsequently described do not use any etch stop dielectric liner 43, embodiments are expressly contemplated herein in which on etch stop dielectric liner 43 is used in conjunction with the modifications in the alternative configurations that are described below.

Figure 39:
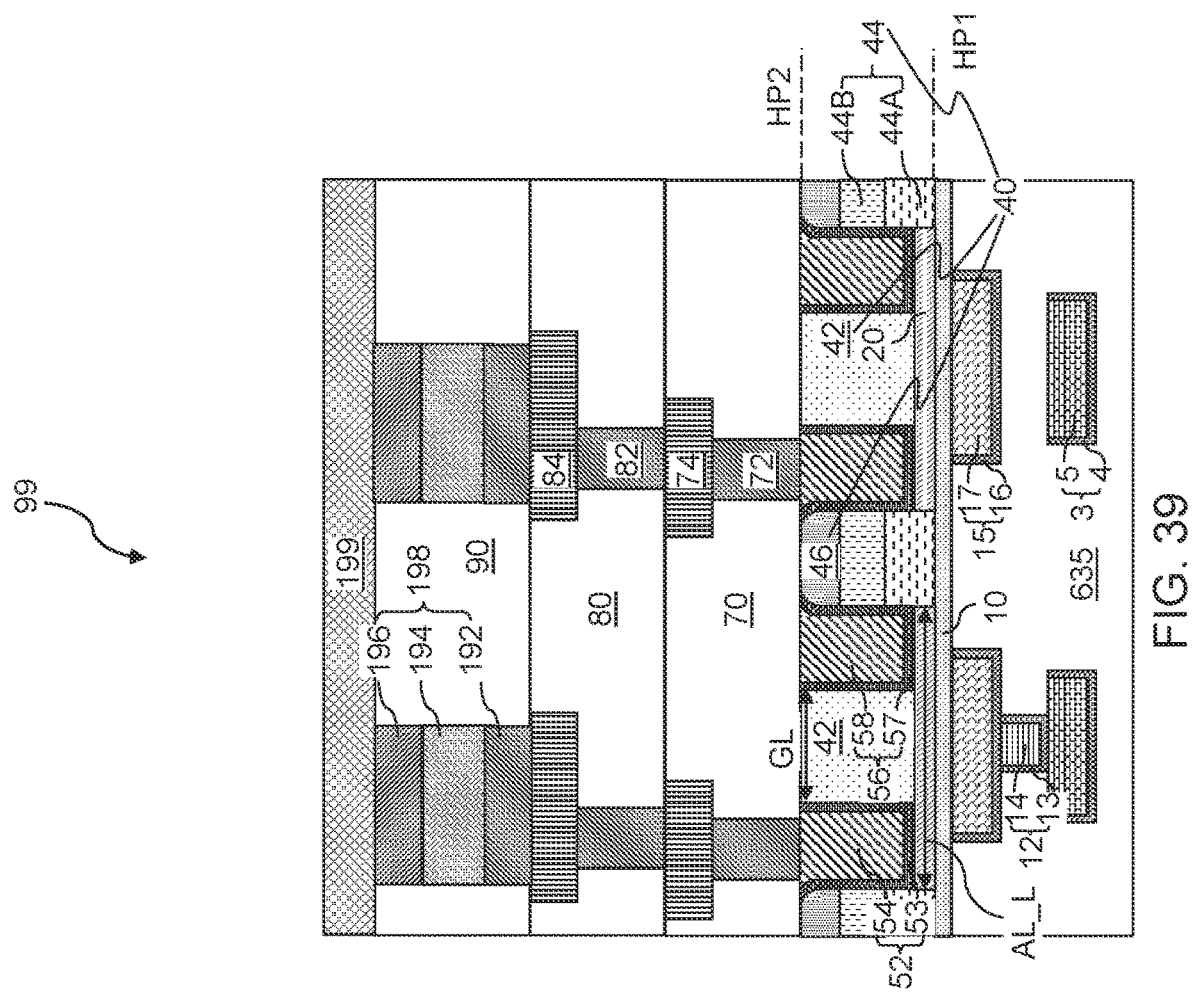
FIG. 39 is a vertical cross-sectional view of a fifth alternative configuration of the first exemplary structure according to the first embodiment of the present disclosure.

Referring to FIG. 39, a fifth alternative configuration of the first exemplary structure may be derived from the first exemplary structure, or any of the previously described alternative configurations of the first exemplary structure, by using a combination of a first dielectric spacer sublayer 44A and a second dielectric spacer sublayer 44B. The first dielectric spacer sublayer 44A may comprise any dielectric material that may be vertically recessed selective to the material of the discrete dielectric template structures 42T. The first dielectric spacer sublayer 44A may be formed by depositing a first dielectric spacer sublayer material in the trenches 41 and vertically recessing the top surface of the first dielectric spacer sublayer 44A below the second horizontal plane HP2. The second dielectric spacer sublayer 44B may comprise any dielectric material that may be vertically recessed selective to the material of the discrete dielectric template structures 42T, and is different from the material of the first dielectric spacer sublayer 44A. The second dielectric spacer sublayer 44B may be formed by depositing a second dielectric spacer sublayer material in the trenches 41 over the top surface of the first dielectric spacer sublayer 44A and vertically recessing the top surface of the second dielectric spacer sublayer 44B below the second horizontal plane HP2. The combination of the first dielectric spacer sublayer 44A and the second dielectric spacer sublayer 44B constitutes the first dielectric spacer matrix layer 44. A second dielectric spacer matrix layer 46 may be formed above the first dielectric spacer matrix layer 44 such that a top surface of the second dielectric spacer matrix layer 46 is located within the second horizontal plane HP2. Generally, the materials of the first dielectric spacer sublayer 44A and the second dielectric spacer sublayer 44B may be selected from any material that may be used for the first dielectric spacer matrix layer 44 of the previously described embodiments.

Figure 40:
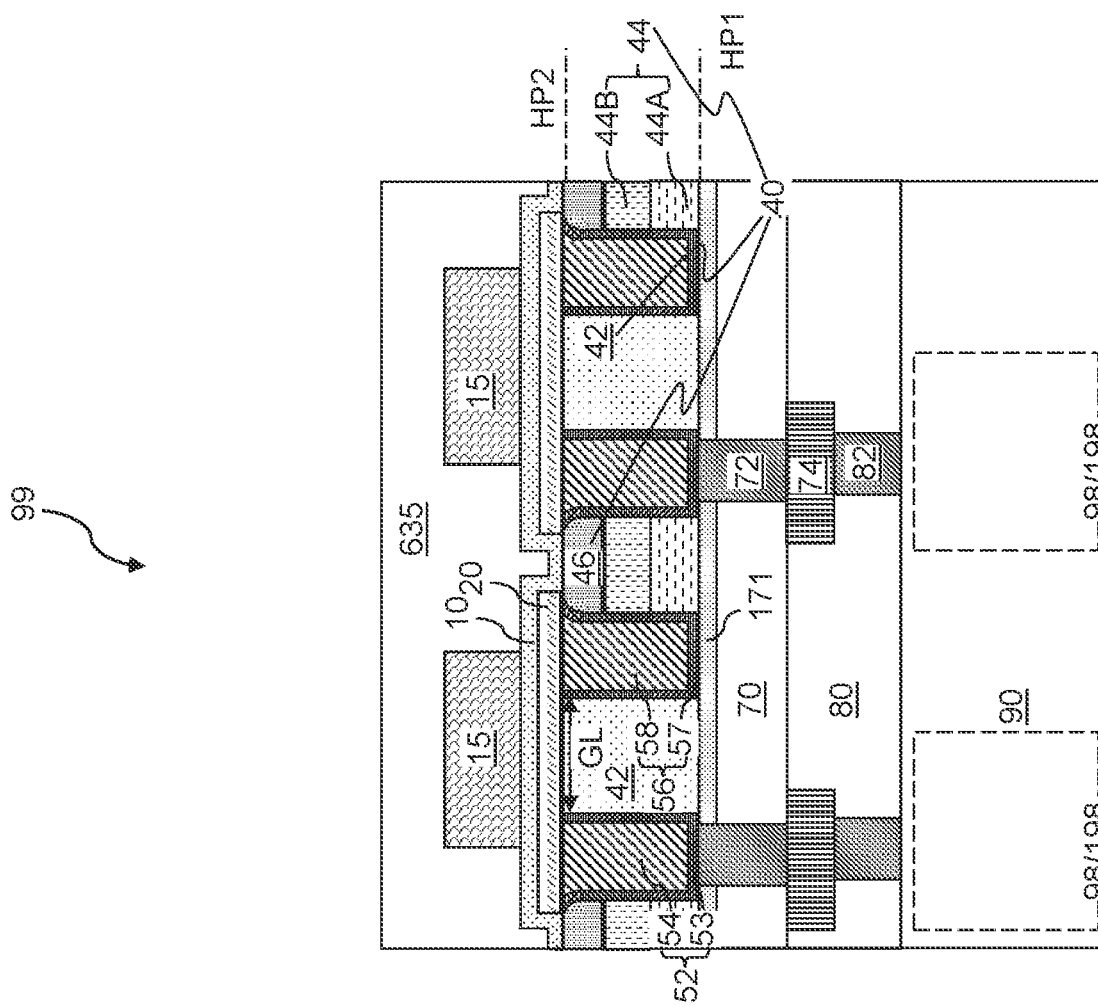
FIG. 40 is a vertical cross-sectional view of an alternative configuration of the second exemplary structure according to the second embodiment of the present disclosure.

Referring to FIG. 40, an alternative configuration of the second exemplary structure may be derived from the second exemplary structure by substituting a combination of a first dielectric spacer sublayer 44A and a second dielectric spacer sublayer 44B for the first dielectric spacer matrix layer 44 in the second exemplary structure as described above. The processing steps described with reference to the fifth alternative configuration of the first exemplary structure illustrated in FIG. 39 may be used to provide the combination of a first dielectric spacer sublayer 44A and a second dielectric spacer sublayer 44B in the alternative configuration of the second exemplary structure.

Figure 41:
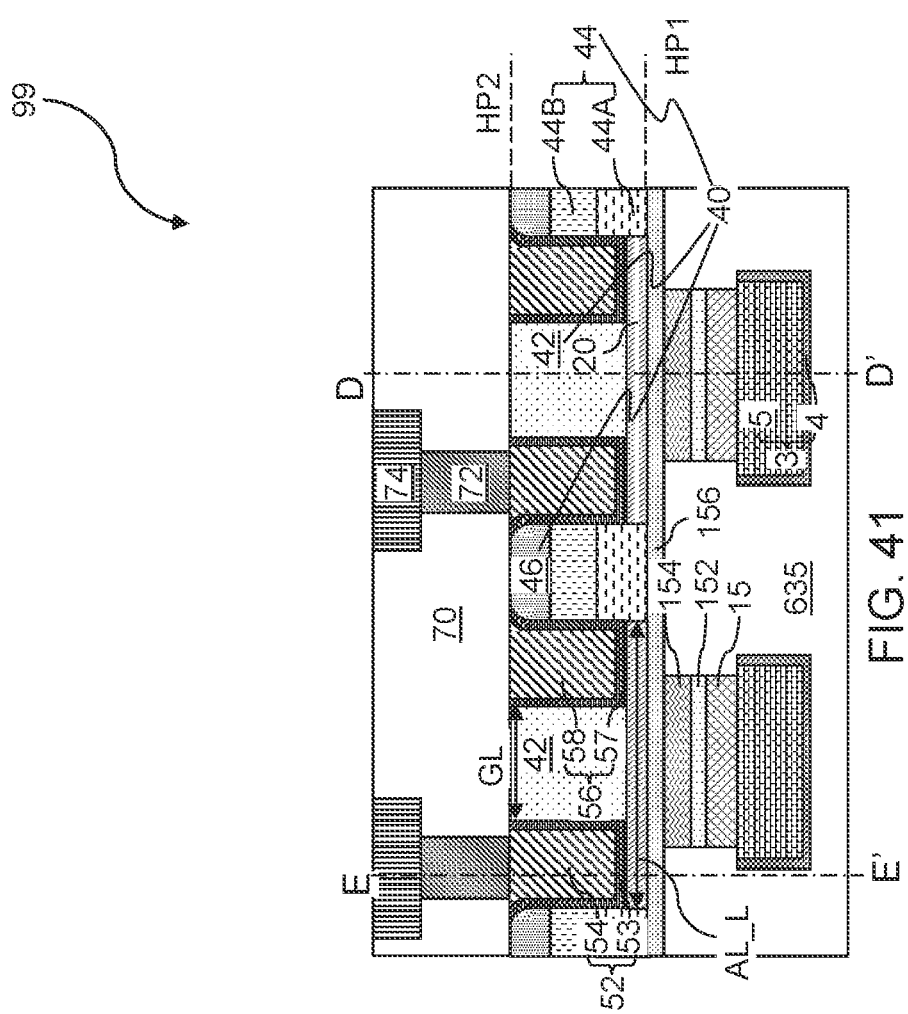
FIG. 41 is a vertical cross-sectional view of an alternative configuration of the third exemplary structure according to the third embodiment of the present disclosure.

Referring to FIG. 41, an alternative configuration of the third exemplary structure may be derived from the third exemplary structure by substituting a combination of a first dielectric spacer sublayer 44A and a second dielectric spacer sublayer 44B for the first dielectric spacer matrix layer 44 in the third exemplary structure as described above. The processing steps described with reference to the fifth alternative configuration of the first exemplary structure illustrated in FIG. 39 may be used to provide the combination of a first dielectric spacer sublayer 44A and a second dielectric spacer sublayer 44B in the alternative configuration of the third exemplary structure.

Figure 42:
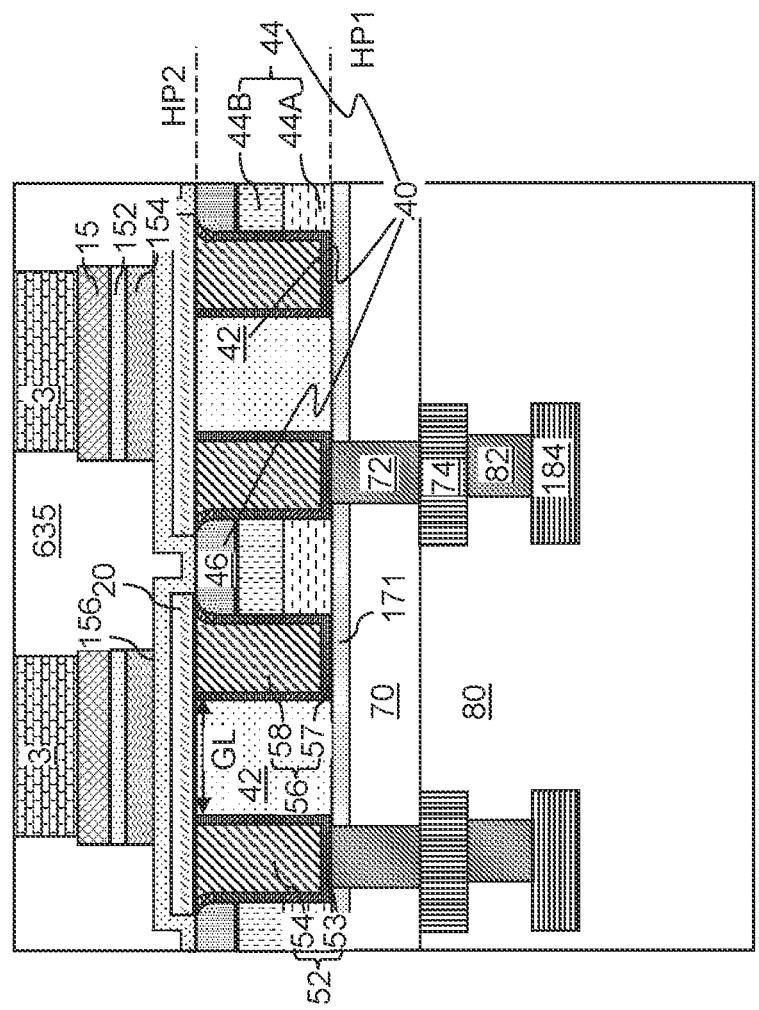
FIG. 42 is a vertical cross-sectional view of an alternative configuration of the fourth exemplary structure according to the fourth embodiment of the present disclosure.

Referring to FIG. 42, an alternative configuration of the fourth exemplary structure may be derived from the fourth exemplary structure by substituting a combination of a first dielectric spacer sublayer 44A and a second dielectric spacer sublayer 44B for the first dielectric spacer matrix layer 44 in the fourth exemplary structure as described above. The processing steps described with reference to the fifth alternative configuration of the first exemplary structure illustrated in FIG. 39 may be used to provide the combination of a first dielectric spacer sublayer 44A and a second dielectric spacer sublayer 44B in the alternative configuration of the fourth exemplary structure.

Figure 43:
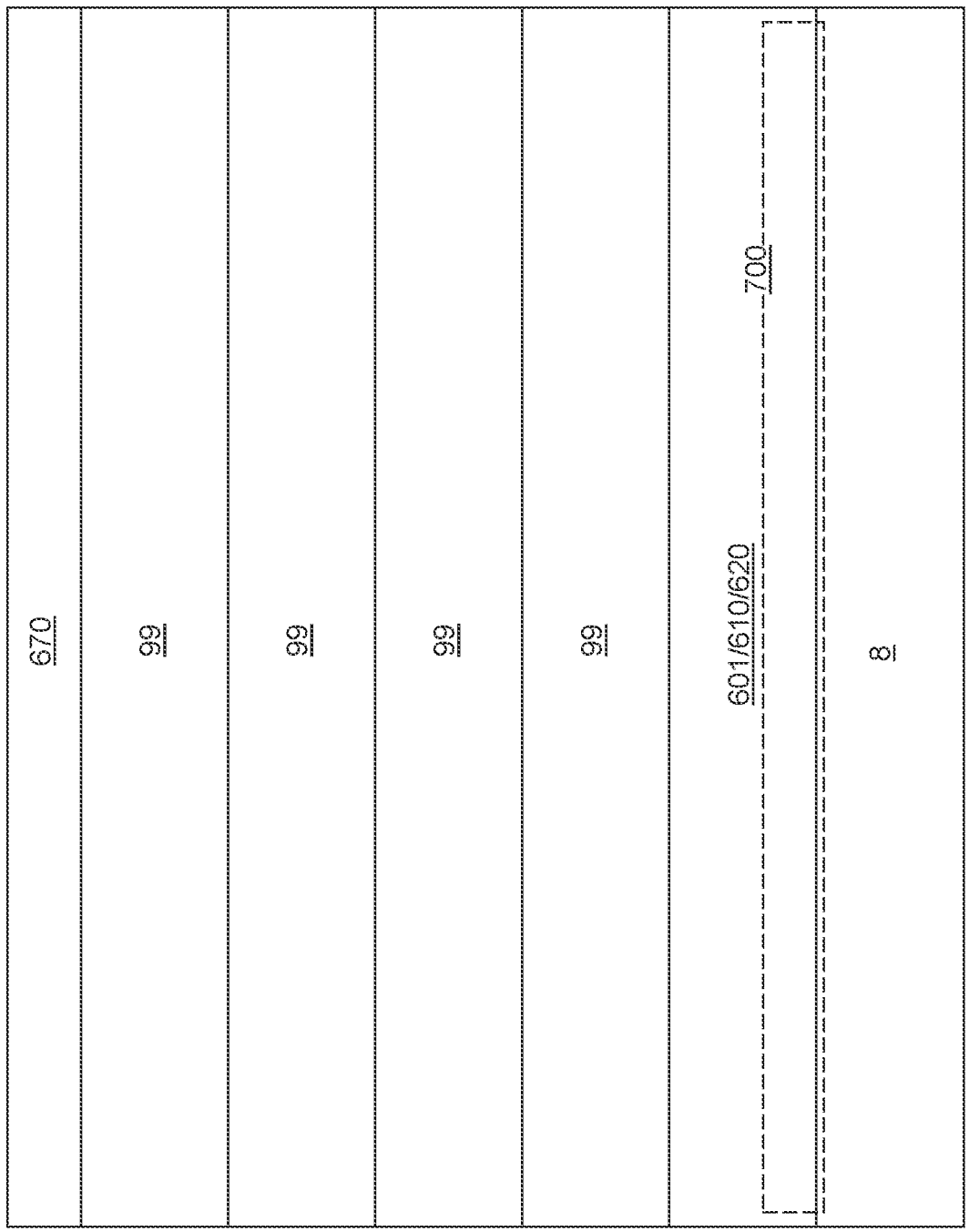
FIG. 43 is a vertical cross-sectional view of an alternative configuration for any of the exemplary structures according to an embodiment of the present disclosure.

Referring to FIG. 43, an alternative configuration for any of the exemplary structures is illustrated according to an embodiment of the present disclosure. The alternative configuration illustrated in FIG. 43 may be derived from any of the exemplary structures described above by vertically stacking multiple two-dimensional arrays of memory cells 99. While a configuration in which four two-dimensional arrays of memory cells 99 are vertically stacked is illustrated in FIG. 44, additional configurations are expressly contemplated herein in which two, three, five, or more two-dimensional arrays of memory cells 99 are vertically stacked.

Figure 44:
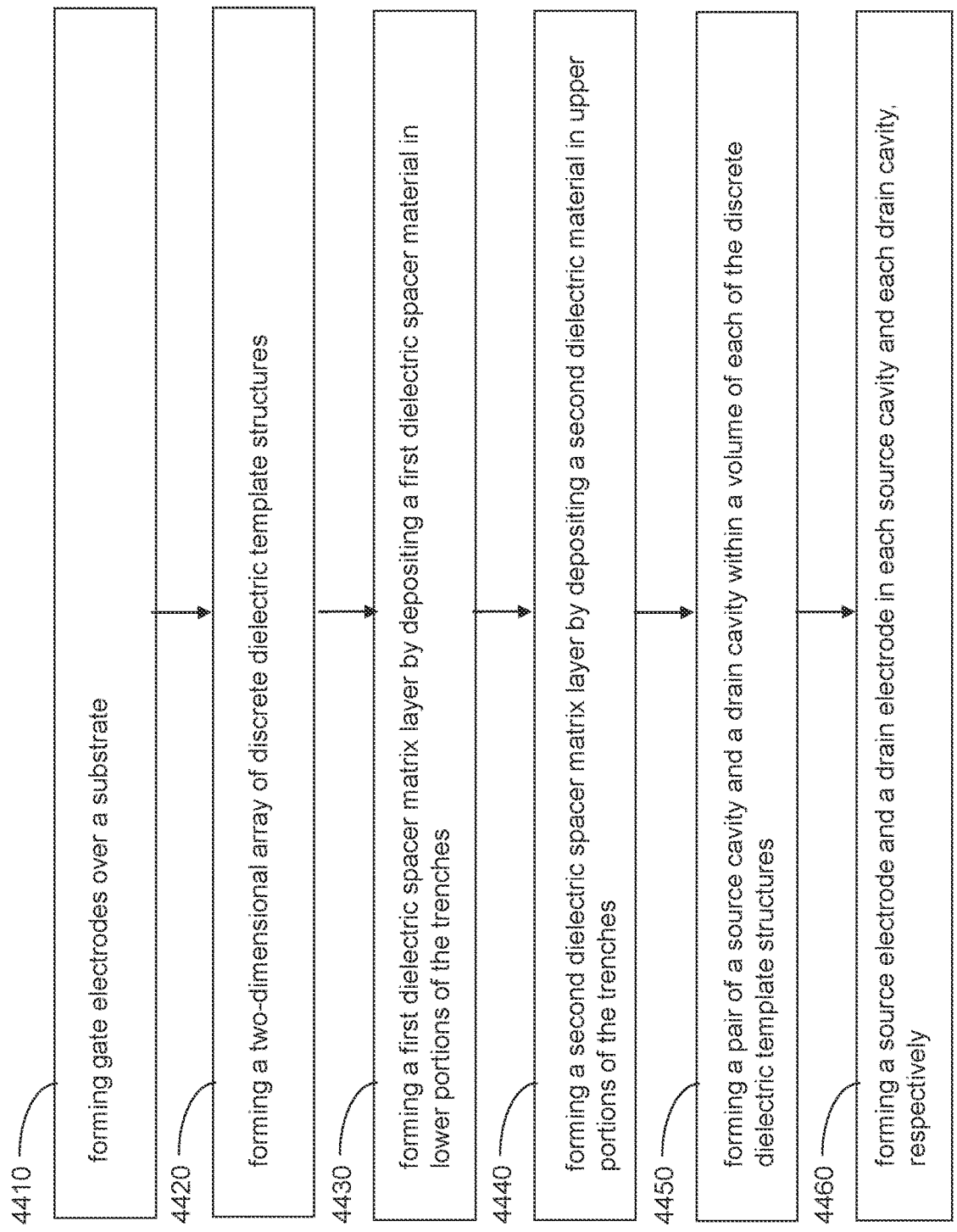
FIG. 44 is a first flowchart that illustrates the general processing steps for manufacturing the semiconductor devices according to an embodiment of the present disclosure.

Referring to FIG. 44, a first flowchart illustrates a first set of general processing steps for manufacturing the semiconductor devices according to an embodiment of the present disclosure.

Referring to step 4410 and FIGS. 1-3C and 34A-35C, gate electrodes 15 are formed over a substrate.

Referring to step 4420 and FIGS. 4A-5C and 36A-36E, a two-dimensional array of discrete dielectric template structures 42T is formed. The discrete dielectric template structures 42T are spaced from one another by trenches 41.

Referring to step 4430 and FIGS. 6A-7C, 36A-36E, 39, and 41, a first dielectric spacer matrix layer 44 is formed by depositing a first dielectric spacer material in lower portions of the trenches 41.

Referring to step 4440 and FIGS. 8A-8C and 36A-36E, a second dielectric spacer matrix layer 46 is formed by depositing a second dielectric spacer material in upper portions of the trenches 41.

Referring to step 4450 and FIGS. 9A-10D and 36A-36E, a pair of a source cavity 51 and a drain cavity 59 is formed within a volume of each of the discrete dielectric template structures 42T.

Referring to step 4460 and FIGS. 11A-17, 18A-18C, 19A-19C, 20A-20C, and 36A-36E, a source electrode 52 and a drain electrode 56 are formed in each source cavity 51 and each drain cavity 59, respectively.

Referring to FIG. 45, a second flowchart illustrates a second set of general processing steps for manufacturing the semiconductor devices according to an embodiment of the present disclosure.

Referring to step 4510 and FIGS. 21A-23C and 37A-37E, a two-dimensional array of discrete dielectric template structures 42T is formed. The discrete dielectric template structures 42T are spaced from one another by trenches 41.

Referring to step 4520 and FIGS. 24A-25C, 37A-37E, 40, and 42, a first dielectric spacer matrix layer 44 is formed by depositing a first dielectric spacer material in lower portions of the trenches 41.

Referring to step 4530 and FIGS. 26A-26C and 37A-37E, a second dielectric spacer matrix layer 46 is formed by depositing a second dielectric spacer material in upper portions of the trenches 41.

Referring to step 4540 and FIGS. 27A-28D and 37A-37E, a pair of a source cavity 51 and a drain cavity 59 is formed within a volume of each of the discrete dielectric template structures 42T.

Referring to step 4550 and FIGS. 29A-30E, and 37A-37E, a source electrode 52 and a drain electrode 56 are formed in each source cavity 51 and each drain cavity 59, respectively.

Referring to step 4560 and FIGS. 31A-33E, 37A-37E, and 38A-38E, gate electrodes 15 are formed over the source electrodes 52 and the drain electrodes 56.

Referring to all drawings and according to various embodiments of the present disclosure, a semiconductor structure is provided, which comprises: a two-dimensional array of source-spacer-drain combinations (52, 42, 56) located over a substrate and laterally spaced apart from one another by a composite dielectric matrix (43, 44, 46), wherein each source-spacer-drain combination (52, 42, 56) selected from the two-dimensional array of source-spacer-drain combinations (52, 42, 56) comprises an inter-electrode dielectric spacer 42 in contact with a source electrode 52 and a drain electrode 56, and wherein the composite dielectric matrix (43, 44, 46) comprises a first dielectric spacer matrix layer 44 comprising a first dielectric spacer material and a second dielectric spacer matrix layer 46 comprising a second dielectric spacer material and overlying the first dielectric spacer matrix layer; a two-dimensional array of active layers 20 overlying, or underlying, the two-dimensional array of source-spacer-drain combinations (52, 42, 56); gate electrodes 15 that are spaced from the two-dimensional array of active layers 20 by a gate dielectric layer 10; and a two-dimensional array of memory structures (98, 198), wherein each memory structure (98, 198) within the two-dimensional array of memory structures (98, 198) is electrically connected to a respective source electrode 52 within the two-dimensional array of source-spacer-drain combinations (52, 42, 56).

Referring to all drawings and according to various embodiments of the present disclosure, a semiconductor structure is provided, which comprises: a two-dimensional array of source-spacer-drain combinations (52, 42, 56) located over a substrate and laterally spaced apart from one another by a composite dielectric matrix (43, 44, 46), wherein each source-spacer-drain combination (52, 42, 56) selected from the two-dimensional array of source-spacer-drain combinations (52, 42, 56) comprises an inter-electrode dielectric spacer 42 in contact with a source electrode 52 and a drain electrode 56, and wherein the composite dielectric matrix (43, 44, 46) comprises a first dielectric spacer matrix layer 44 comprising a first dielectric spacer material and a second dielectric spacer matrix layer 46 comprising a second dielectric spacer material and overlying the first dielectric spacer matrix layer; a two-dimensional array of active layers 20 overlying, or underlying, the two-dimensional array of source-spacer-drain combinations (52, 42, 56); and a two-dimensional array of layer stacks (15, 152, 154), wherein each of the layer stacks (15, 152, 154) comprises a charge storage element 154, a blocking dielectric layer 152, and a gate electrode 15, and is spaced from a respective active layer 20 within the two-dimensional array of active layers 20 by a tunneling dielectric layer 156.

The various embodiments of the present disclosure may be used to provide a two-dimensional array of transistors (e.g., thin film transistors) that are laterally spaced apart from one another by a composite dielectric matrix (43, 44, 46), by which lateral extents of the source electrodes 52 and the drain electrodes 56 are limited during the manufacture process. As such, the source electrodes 52 and the drain electrodes 56 of the transistors are self-aligned. The self-alignment feature of the two-dimensional array of transistors provide manufacture with an enhanced product yield and reduced performance variability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming a two-dimensional array of discrete dielectric template structures over a substrate, wherein the discrete dielectric template structures are spaced from one another by trenches;
   forming a first dielectric spacer matrix layer by depositing a first dielectric spacer material in lower portions of the trenches;
   forming a second dielectric spacer matrix layer by depositing a second dielectric spacer material in upper portions of the trenches;
   forming a pair of a source cavity and a drain cavity within a volume of each of the discrete dielectric template structures;
   forming a source electrode and a drain electrode in each source cavity and each drain cavity, respectively; and
   forming gate electrodes prior to, or after, formation of the two-dimensional array of discrete dielectric template structures, whereby a two-dimensional array of field effect transistors is formed.

2. The method of claim 1, further comprising:
   applying and patterning a photoresist layer over the two-dimensional array of discrete dielectric template structures and the second dielectric spacer matrix layer to form a two-dimensional array of openings; and
   anisotropically etching portions of the discrete dielectric template structures that are located within areas of the openings in the photoresist layer selective to a material of the second dielectric spacer matrix layer.

3. The method of claim 2, wherein each opening in the two-dimensional array of openings has a respective area that continuously extends over a neighboring pair selected from the discrete dielectric template structures that are laterally spaced apart along a first horizontal direction along which a first subset of the trenches laterally extends, and over a portion of the second dielectric spacer matrix layer.

4. The method of claim 3, wherein:
   the photoresist layer is patterned with a line and space pattern in which the openings have straight edges that laterally extend along a second horizontal direction that is perpendicular to the first horizontal direction; and
   each opening in the photoresist layer has a first straight edge that extends over a first column of the discrete dielectric template structures that are arranged along the second horizontal direction and a second straight edge that extends over a second column of the discrete dielectric template structures, the second column being laterally offset from the first column by less than a pitch of a two-dimensional array of the discrete dielectric template structures along the first horizontal direction.

5. The method of claim 2, further comprising:
   forming an etch mask material layer over the second dielectric spacer matrix layer;
   patterning the etch mask material layer by performing a first anisotropic etch step that transfers a pattern in the photoresist layer through the etch mask material layer; and
   anisotropically etching portions of the discrete dielectric template structures that are not masked by the patterned etch mask material layer by performing a second anisotropic etch step that etches a material of the two-dimensional array of the discrete dielectric template structures selective to a material of the second dielectric spacer matrix layer.

6. The method of claim 5, wherein:
   each remaining portion of the discrete dielectric template structures after the second anisotropic etch step comprises an inter-electrode dielectric spacer located between, and physically exposed to, a respective one of the source cavities and a respective one of the drain cavities;
   the method comprises forming a two-dimensional array of active layers prior to, or after, formation of the source electrodes and the drain electrodes such that each of the two-dimensional array of active layers has an areal overlap within a respective one of the source electrodes and with a respective one of the drain electrodes; and
   each contiguous combination of a source electrode, a drain electrode, and an inter-electrode dielectric spacer contacts a horizontal surface of a respective stack of an active layer selected from the two-dimensional array of active layers, a gate dielectric layer, and a gate electrode selected from the gate electrodes.

7. The method of claim 1, wherein:
   the gate electrodes are formed prior to formation of the two-dimensional array of discrete dielectric template structures; and
   the method comprises:
      forming a gate dielectric layer, a continuous active layer, and a dielectric template material layer over the gate electrodes; and
      patterning the dielectric template material layer and the continuous active layer into a stack of the two-dimensional array of discrete dielectric template structures and a two-dimensional array of active layers.

8. The method of claim 1, wherein:
   the gate electrodes are formed after formation of the two-dimensional array of discrete dielectric template structures; and
   the method comprises:
      forming a two-dimensional array of active layers over the source electrodes and the drain electrodes, wherein each active layer within the two-dimensional array of active layers is formed directly on top surfaces of a respective pair of a source electrode and a drain electrode; and
      forming a gate dielectric layer over the two-dimensional array of active layers, wherein the gate electrodes are formed over the gate dielectric layer.

9. The method of claim 1, further comprising:
   forming a two-dimensional array of memory structures over, or under, the two-dimensional array of field effect transistors; and
   forming metal interconnect structures over, or under, the two-dimensional array of field effect transistors such that each memory structure within the two-dimensional array of memory structures is electrically connected to a source electrode of a respective field effect transistor within the two-dimensional array of field effect transistors.

10. The method of claim 1, further comprising forming a stack including a tunneling dielectric layer, a charge storage element, and a blocking dielectric layer between each of the gate electrodes and a respective neighboring pair of a source electrode and drain electrode selected from the source electrodes and the drain electrodes.

11. A semiconductor structure comprising:
a two-dimensional array of source-spacer-drain combinations located over a substrate and laterally spaced apart from one another by a composite dielectric matrix, wherein each source-spacer-drain combination selected from the two-dimensional array of source-spacer-drain combinations comprises an inter-electrode dielectric spacer in contact with a source electrode and a drain electrode, and wherein the composite dielectric matrix comprises a first dielectric spacer matrix layer comprising a first dielectric spacer material and a second dielectric spacer matrix layer comprising a second dielectric spacer material and overlying the first dielectric spacer matrix layer;
a two-dimensional array of active layers overlying, or underlying, the two-dimensional array of source-spacer-drain combinations;
gate electrodes that are spaced from the two-dimensional array of active layers by a gate dielectric layer; and
a two-dimensional array of memory structures, wherein each memory structure within the two-dimensional array of memory structures is electrically connected to a respective source electrode within the two-dimensional array of source-spacer-drain combinations.

12. The semiconductor structure of claim 11, wherein a top surface of the composite dielectric matrix, top surfaces of the inter-electrode dielectric spacers, and top surfaces of the source electrodes and the drain electrodes are located within a same horizontal plane.

13. The semiconductor structure of claim 11, wherein:
an entirety of each interface between the inter-electrode dielectric spacers and the source electrodes is straight; and
at least one interface between each of the source electrodes and the composite dielectric matrix comprises a contoured and tapered interface segment extending downward from an edge of a horizontal top surface of the second dielectric spacer matrix layer, and a vertical interface segment adjoined to a bottom edge of the contoured and tapered interface segment and extending downward to a bottom surface of the composite dielectric matrix.

14. The semiconductor structure of claim 11, wherein the composite dielectric matrix comprises an etch stop dielectric liner contacting a bottom surface and sidewalls of the first dielectric spacer matrix layer and contacting lower portions of each of the source electrodes and the drain electrodes and contacting lower portions of each of the inter-electrode dielectric spacers.

15. The semiconductor structure of claim 11, wherein the two-dimensional array of memory structures comprises:
a two-dimensional array of capacitor structures including a respective first capacitor plate, a respective node dielectric, and a respective second capacitor plate; or
a two-dimensional array of resistive memory structures including a respective first electrode, a resistive memory element that includes a material providing at least two different levels of electrical resistivity, and a second electrode.

16. A semiconductor structure comprising:
a two-dimensional array of source-spacer-drain combinations located over a substrate and laterally spaced apart from one another by a composite dielectric matrix, wherein each source-spacer-drain combination selected from the two-dimensional array of source-spacer-drain combinations comprises an inter-electrode dielectric spacer in contact with a source electrode and a drain electrode, and wherein the composite dielectric matrix comprises a first dielectric spacer matrix layer comprising a first dielectric spacer material and a second dielectric spacer matrix layer comprising a second dielectric spacer material and overlying the first dielectric spacer matrix layer;
a two-dimensional array of active layers overlying, or underlying, the two-dimensional array of source-spacer-drain combinations; and
a two-dimensional array of layer stacks, wherein each of the layer stacks comprises a charge storage element, a blocking dielectric layer, and a gate electrode, and is spaced from a respective active layer within the two-dimensional array of active layers by a tunneling dielectric layer.

17. The semiconductor structure of claim 16, wherein a bottom surface of the composite dielectric matrix and bottom surfaces of the active layers within the two-dimensional array of active layers are located within a same horizontal plane.

18. The semiconductor structure of claim 16, wherein bottom surfaces of the active layers within the two-dimensional array of active layers and segments of a bottom surface of the gate dielectric layer that contact the second dielectric spacer matrix layer are located within a same horizontal plane as top surfaces of the source electrodes and the drain electrodes.

19. The semiconductor structure of claim 16, wherein:
an entirety of an interface between the inter-electrode dielectric spacer and the source electrode within each source-spacer-drain combination and an entirety of an interface between the inter-electrode dielectric spacer and the drain electrode within each source-spacer-drain combination are located within vertical planes;
an interface between the source electrode within each source-spacer-drain combination and the composite dielectric matrix comprises a contoured interface segment that is adjoined to a top surface of the second dielectric spacer matrix layer; and
a tapered convex surface segment of the second dielectric spacer matrix layer contacts a tapered concave surface segment of the source electrode at the contoured interface segment.

20. The semiconductor structure of claim 16, wherein
a bottom surface of each active layer within the two-dimensional array of active layers is located within a horizontal plane including a top surface of the composite dielectric matrix or a bottom surface of the composite dielectric matrix; and
each source-spacer-drain combination within the two-dimensional array of source-spacer-drain combinations contacts a horizontal surface of a respective active layer within the two-dimensional array of active layers.

* * * * *